(12) United States Patent  (10) Patent No.: US 6,503,594 B2
Park  (45) Date of Patent: *Jan. 7, 2003

(54) SILICON WAFERS HAVING CONTROLLED DISTRIBUTION OF DEFECTS AND SLIP

(75) Inventor: Jea-gun Park, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/893,804

(22) Filed: Jun. 28, 2001

(65) Prior Publication Data

US 2001/0055689 A1 Dec. 27, 2001

Related U.S. Application Data

(63) Continuation-in-part of application No. 09/702,503, filed on Oct. 31, 2000, which is a continuation-in-part of application No. 09/454,675, filed on Dec. 3, 1999, which is a division of application No. 08/989,591, filed on Dec. 12, 1997, now Pat. No. 6,045,610, said application No. 09/702,503, is a continuation-in-part of application No. 09/320,102, filed on May 26, 1999, now Pat. No. 6,146,459, and a continuation-in-part of application No. 09/320,210, filed on May 26, 1999, now Pat. No. 6,251,184, which is a continuation-in-part of application No. 08/989,591.
(60) Provisional application No. 60/063,086, filed on Oct. 24, 1997, and provisional application No. 60/172,352, filed on Dec. 16, 1999.

(30) Foreign Application Priority Data

Feb. 13, 1997 (KR) .............................................. 97-4291
Oct. 24, 1999 (KR) ............................................ 97-54899
Nov. 13, 1999 (KR) ............................................ 99-50467

(51) Int. Cl.$^7$ .......................... C30B 33/02; C30B 29/06

(52) U.S. Cl. ....................... 428/64.1; 428/446; 117/932

(58) Field of Search ............................... 428/64.1, 446; 117/3, 13, 932

(56) References Cited

U.S. PATENT DOCUMENTS 3,951,729 A   4/1976 Takagi et al. ............... 156/617

(List continued on next page.)

FOREIGN PATENT DOCUMENTS

EP   0 444 628 A1   9/1991

(List continued on next page.)

OTHER PUBLICATIONS

Pagani et al., *Spatial Variations in Oxygen Precipitation in Silicon After High Temperature Rapid Thermal Annealing,* Appl. Phys. Lett., vol. 70, No. 12, Mar. 24, 1997, pp. 1572–1574.

(List continued on next page.)

Primary Examiner—Deborah Jones
Assistant Examiner—Stephen Stein
(74) Attorney, Agent, or Firm—Myers Bigel Sibley & Sajovec

(57) ABSTRACT

A silicon wafer is provided having controlled distribution of defects, in which denuded zones having a sufficient depth inward from the surface of the wafer are combined with a high gettering effect in a bulk region of the wafer. In the silicon wafer, oxygen precipitates, which act as intrinsic gettering sites, show vertical distribution. The oxygen precipitate concentration profile from the top to the bottom surfaces of the wafer includes first and second peaks at first and second predetermined depths from the top and bottom surfaces of the wafer, denuded zones between the top and bottom surfaces of the wafer and each of the first and second peaks, and a concave region between the first and second peaks, which corresponds to a bulk region of the wafer. For such an oxygen precipitate concentration profile, the wafer is exposed to a rapid thermal annealing process in a gas mixture atmosphere comprising ammonia ($NH_3$) and argon (Ar) at temperatures below about 1200° C. Using such a rapid thermal annealing process, slip dislocation can be reduced in the device regions of the wafer, and silicon dioxide sublimation on the rapid thermal annealing chamber also can be reduced.

28 Claims, 37 Drawing Sheets

U.S. PATENT DOCUMENTS

| | | | | |
|---|---|---|---|---|
| 5,196,173 | A | 3/1993 | Arai et al. | 422/249 |
| 5,248,378 | A | 9/1993 | Oda et al. | 156/617.1 |
| 5,264,189 | A | 11/1993 | Yamashita et al. | 422/249 |
| 5,316,742 | A | 5/1994 | Tomioka et al. | 117/217 |
| 5,403,406 | A | 4/1995 | Falster et al. | 148/33.2 |
| 5,485,803 | A | 1/1996 | Habu | 117/14 |
| 5,578,123 | A | 11/1996 | Vilzmann et al. | 117/13 |
| 5,779,791 | A | 7/1998 | Korb et al. | 117/15 |
| 5,919,302 | A | 7/1999 | Falster et al. | 117/3 |
| 5,954,873 | A | 9/1999 | Hourai et al. | 117/13 |
| 5,972,106 | A | 10/1999 | Ohta et al. | 117/13 |
| 5,994,761 | A | 11/1999 | Falster et al. | 257/611 |
| 6,045,610 | A | 4/2000 | Park et al. | 117/13 |
| 6,146,459 | A | 11/2000 | Park | 117/217 |
| 6,180,220 | B1 | 1/2001 | Falster et al. | 428/312.6 |
| 6,204,152 | B1 | 3/2001 | Falster et al. | 438/473 |

FOREIGN PATENT DOCUMENTS

| | | |
|---|---|---|
| EP | 0 482 438 A1 | 4/1992 |
| EP | 0 529 571 A1 | 3/1993 |
| EP | 0 536 401 A1 | 4/1993 |
| EP | 0 536 405 A1 | 4/1993 |
| JP | 61-219795 | 9/1986 |
| JP | 62-13834 | 1/1987 |
| JP | 63-315589 | 12/1988 |
| JP | 64-61382 | 3/1989 |
| JP | 2-32535 | 2/1990 |
| JP | 3-153595 | 7/1991 |
| JP | 4-331790 | 11/1992 |
| JP | 6-340490 | 12/1994 |
| JP | 08-330316 | 12/1996 |
| WO | WO 98/38675 | 9/1998 |

OTHER PUBLICATIONS

Habu et al., *Distribution of Grown–In Crystal Defects in Silicon Crystals Formed by Point Defect Diffusion During Melt–Growth: Disappearance of the Oxidation Induced Stacking Faults–Ring*, Jpn. J. Appl. Phys., vol. 35, Part 1, No. 1A, Jan. 1996, pp. 1–9.

Wijaranakula et al., *Numerical Simulation of Point Defect Distribution in a Growing Czochralski Silicon Crystal In Response to an Abrupt Change in the Growth Conditions*, Mat. Res. Soc. Symp. Proc., vol. 378, 1995, pp. 101–106 No month.

Takano et al., *Relationship Between Grown–In Defects and Thermal History During CZ Si Crystal Growth*, Proceedings of the 18th International Conference on Defects in Semiconductors (ICDS–18), Sendai, Japan, Jul. 1995, published in Materials Science Forum, vol. 196–201, 1995, pp. 1707–1712 No month.

Hourai et al., *Growth Parameters Determining the Type of Grown–In Defects in Czochralski Silicon Crystals*, Proceedings of the 18*th* International Conference on Defects in Semiconductors (ICDS–18), Sendai, Japan, Jul. 1995, published in Materials Science Forum, vol. 196–201, 1995, pp. 1713–1718 No month.

Hourai et al., *Formation Behavior of Infrared Light Scattering Defects in Silicon During Czochralski Crystal Growth*, J. Electrochem. Soc., vol. 142, No. 9, Sep. 1995, pp. 3193–3201.

Park et al., *Gate Oxide Integrity in DRAM Devices: The Influence of Substrate D–Defects*, Electrochemical Society Proceedings, vol. 95–5, pp. 457–471 No date.

Dornberger et al., *The Dependence of Ring Like Distributed Stacking Faults on the Axial Temperature Gradient of Growing Czochralski Silicon Crystals*, Electrochemical Society Proceedings, vol. 95–4, pp. 294–305 No date.

Park et al., *Effects of D–Defects in CZ Silicon Upon Thin Gate Oxide Integrity*, The Physics and Chemistry of $SiO_3$ and the $Si–SiO_2$ Interface 2, edited by Helms et al., Plenum Press, New York, pp. 289–298 No date.

Harada et al., *Oxygen Precipitation Enhanced With Vacancies in Silicon*, Electrochemical Society, 1986, pp. 76–85 No month.

Falster et al., *The Engineering of Silicon Wafer Material Properties Through Vacancy Concentration Profile Control and the Achievement of Ideal Oxygen Precipitation Behavior*, Electrochemical Society Proceedings, vol. 98–13, pp. 135–146 No date.

U.S. patent application Ser. No. 09/057,907, Falster, filed Apr. 9, 1998.

Park et al., *Effect of Crystal Defects on Device Characteristics*, Proceeding of $2^{nd}$ International Symposium on Advanced Science and Technology Si Material, Kona Hawaii, Nov. 25–29, 1996.

von Ammon et al., *The Dependence of Bulk Defects on the Axial Temperature Gradient of Silicon Crystals During Czochralski Growth*, Journal of Crystal Growth, 151, 1995, pp. 273–277 No month.

Voronkov, *The Mechanism of Swirl Defects Formation in Silicon*, Journal of Crystal Growth, V. 59, 1982, pp. 625–643 No date.

Ar/N$_2$, 1250°C, 10sec

Ar/NH$_3$, 1120°C, 10sec

SILICON WAFERS HAVING CONTROLLED DISTRIBUTION OF DEFECTS AND SLIP

CROSS-REFERENCE TO RELATED APPLICATIONS

This application is a continuation-in-part of application Ser. No. 09/702,503, filed Oct. 31, 2000, which is itself a continuation-in-part of application Ser. No. 09/454,675, filed Dec. 3, 1999, which itself is a divisional application of application Ser. No. 08/989,591, filed Dec. 12, 1997 (now U.S. Pat. No. 6,045,610) and claims the benefit of provisional Application Ser. No. 60/063,086 filed Oct. 24, 1997. Application Ser. No. 09/702,503 also is a continuation-in-part of application Ser. No. 09/320,102, filed May 26, 1999, now U.S. Pat. No. 6,146,459, and Ser. No. 09/320,210, filed May 26, 1999, now U.S. Pat. No. 6,251,184, which are themselves continuations-in-part of the above-cited application Ser. No. 08/989,591. Application Ser. No. 09/702,503 also claims benefit of provisional application 60/172,352, filed Dec. 16, 1999. All of the above-referenced applications are assigned to the assignee of the present application, and the disclosures of all of these applications are hereby incorporated herein by reference in their entirety.

FIELD OF THE INVENTION

This invention relates to microelectronic manufacturing methods and devices, and more particularly to silicon ingot manufacturing methods and silicon ingots and wafers manufactured thereby.

BACKGROUND OF THE INVENTION

Monocrystalline silicon, which is the starting material in fabricating semiconductor devices, is grown into a cylindrical ingot by a crystal growth technique, which is referred to as the Czochralski (CZ) technique. The ingot of monocrystalline silicon is processed into wafers via a series of wafering processes such as slicing, etching, cleaning, polishing and the like. According to the CZ technique, a seed crystal of monocrystalline silicon is immersed into molten silicon and pulled upwards, and the molten silicon is then grown into a monocrystalline ingot by slow extraction. The molten silicon is contained in a quartz crucible, and is contaminated with a variety of impurities, one of which is oxygen. At the melting temperature of silicon, the oxygen permeates the crystal lattice until it reaches a predetermined concentration which generally is determined by the solubility of oxygen in silicon at the melting temperature of silicon and by the actual segregation coefficient of oxygen in solidified silicon. The concentration of oxygen, which permeates the silicon ingot during crystal growth, is greater than the solubility of oxygen in solidified silicon at typical temperatures used in semiconductor device manufacture. As the crystal grows from the molten silicon and cools, the solubility of oxygen therein rapidly decreases, whereby oxygen is saturated in the cooled ingot.

The ingot is sliced into wafers. The remaining interstitial oxygen in the wafers is grown to oxygen precipitates during subsequent thermal processes. The presence of oxygen precipitates in the device active region may degrade the gate oxide integrity and/or may cause undesirable substrate leakage current. However, if they are present outside the device active region (i.e. in the bulk region), they can getter metallic impurities that arise from device processing. This desirable function is referred to as gettering.

FIG. 1 is a sectional view of a conventional Metal Oxide Semiconductor (MOS) transistor. Referring to FIG. 1, when the oxygen precipitates at the wafer surface exist in a channel region, which is located in an active region of the semiconductor device between a source region 12 and a drain region 14 which are formed near the surface of a silicon substrate 10, a gate insulation layer 16, for electrically insulating a gate electrode 18 and the silicon substrate 10, may break down. In addition, the refresh characteristics of a memory device that uses the MOSFET may degrade.

Also, oxygen precipitates formed in the bulk region 10a of the wafer, which are produced by subsequent heat treatment, can act as a leakage source and can act as intrinsic gettering sites, which are capable of trapping unfavorable metal contaminants during subsequent semiconductor device manufacturing. Thus, if the concentration of oxygen in the ingot is high, the concentration of oxygen precipitates which act as the intrinsic gettering sites can increase, so that the gettering capability increases. However, if the concentration of oxygen is not sufficient, oxygen precipitates may not be produced in the bulk region, so that the gettering capability may be reduced or may not be present at all. Thus, it may be desirable to properly control the amount of oxygen precipitates distributed in the bulk region of the wafer.

In a wafer which is obtained by a conventional crystal growth and wafering process, oxygen precipitates distribute through the wafer, from the top (front side) surface of the bottom (back side) surface. In general, a Denuded Zone (DZ) 10b should be provided from the top surface to a predetermined depth, which is devoid of D-defects (vacancy agglomerates), dislocations, stacking faults and oxygen precipitates. However, wafers fabricated by conventional methods may produce oxygen precipitates near the surface of the wafer, which can act as a source of leakage current.

Thus, in order to form intrinsic gettering sites in the bulk region of the wafer with a sufficient DZ near the surface of the wafer, a wafer containing a high concentration of oxygen, for example, at an initial oxygen concentration of 13 parts per million atoms (ppma) or more may be thermally processed for a long period of time by alternating the temperature between low and high levels, such that oxygen precipitates may be generated in the bulk region of the wafer. However, it may be difficult to obtain sufficient DZ because the DZ may strongly depend on the out-diffusion of interstitial oxygen. In a semiconductor wafer thermally processed by this conventional technique, the oxygen precipitate concentration profile through the wafer, from the top surface to the bottom surface of the wafer, may be as illustrated in FIG. 2.

Particularly, conventional techniques in which an additional high-temperature thermal process is performed for a long period of time may degrade the device characteristics. For example, slippage or warpage may occur in the wafer. Moreover, the manufacturing cost may increase. Also, in such a case, metal contaminants, and particularly iron (Fe), which are trapped by the oxygen precipitates in the bulk region, may be released into the DZ by a subsequent process, so that the released contaminants can act as a leakage source.

FIG. 3 is a diagram illustrating a redrawn oxygen precipitate concentration profile of a wafer fabricated by another conventional method, which is disclosed in FIG. 1A of U.S. Pat. No. 5,401,669. In particular, FIG. 3 is the oxygen precipitate concentration profile of a wafer with respect to the depth of the wafer, resulting from a rapid thermal annealing process on a wafer carried out in a nitrogen atmosphere, and subjecting the wafer to subsequent heat treatment. However, as can be seen from FIG. 3, neither the DZ near the surface of the wafer nor sufficient oxygen precipitates in the bulk region may be obtained by this conventional method.

SUMMARY OF THE INVENTION

Embodiments of the present invention provide a silicon wafer having a controlled vertical distribution of oxygen precipitates which can act as intrinsic gettering sites. In particular, the oxygen precipitate concentration profile from the top surface, in which an active region of a semiconductor device may be formed, to the bottom surface of the silicon wafer, comprises first and second peaks at first and second predetermined depths from the top and bottom surfaces of the wafer, respectively. Also, a Denuded Zone (DZ) is included between the top surface of the wafer and the first peak and between the bottom surface of the wafer and the second peak. The oxygen precipitate concentration profile also has a concave region between the first and second peaks, which can correspond to a bulk region of the wafer.

Moreover, in embodiments of the invention, the denuded zone between the bottom surface of the wafer and the second peak includes therein at least one region of slip dislocation, whereas the denuded zone between the top surface of the wafer and the first peak is free of slip dislocation therein. In other embodiments, the silicon wafer also includes a plurality of Shallow Trench Isolation (STI) regions in the denuded zone, between the top surface of the wafer and the first peak, and that are free of STI slip. In yet other embodiments, the oxygen precipitate concentration profile includes first and second peaks, a denuded zone and a concave region between the first and second peaks, as was described above. A plurality of STI regions are included in the denuded zone, between the top surface of the wafer and the first peak which is close to the STI regions, that have an STI slip that is reduced compared to same STI regions in the silicon wafer that oxygen precipitates are present far away from the STI region in FIG. 2.

In some embodiments of the invention, the oxygen precipitate concentration profile is symmetrical with respect to a central surface of the silicon wafer that is centrally located between the top and bottom surfaces. Thus, for example, the first and second predetermined depths are the same. However, in other embodiments, the profile need not be symmetrical, such that, for example, different depths may be provided for the first and second peaks. Also, in some embodiments of the invention, the depth of the denuded zones is in the range of about 5 $\mu$m to about 40 $\mu$m from each surface of the silicon wafer, such that the active region of the semiconductor device is formed to a sufficient depth. In other embodiments of the invention, the oxygen precipitate concentrations at the first and second peaks are at least about $1\times10^9$ cm$^{-3}$, and oxygen precipitate concentration in the bulk region between the first and second peaks is at least about $1\times10^8$ cm$^{-3}$. In still other embodiments, a lowest oxygen precipitate concentration in the concave region is at least an order of magnitude lower than a highest oxygen precipitate concentration in the first and second peaks.

Silicon wafers according to other embodiments of the present invention include a controlled distribution of oxygen precipitate nucleation centers, for example vacancies, which can produce oxygen precipitate concentration profiles described above through subsequent thermal treatment. The vacancy concentration profile comprises first and second peaks at first and second predetermined depths from the top and bottom surfaces of the wafer, respectively. Also, the vacancy concentration remains at a predetermined concentration, which is lower than a critical concentration to make the DZ, between the top surface of the wafer and the first peak and between the bottom surface of the wafer and the second peak. The vacancy concentration profile has a concave region between the first and second peaks. In some embodiments, the denuded zone between the bottom surface of the wafer and the second peak includes therein at least one region of slip, whereas the denuded zone between the top surface of the wafer and the first peak is free of slip dislocation therein. In other embodiments, a plurality of STI regions are included in the denuded zone between the top surface of the wafer and the first peak, and having STI slip that is reduced compared to same STI regions in the silicon wafer that does not include the oxygen precipitate nucleation centers described above. Symmetrical or asymmetrical profiles may be provided.

According to method embodiments of the present invention, Rapid Thermal Annealing (RTA) is performed on a silicon wafer in an atmosphere of a gas mixture comprising a gas which has a vacancy injection effect and a gas which has an interstitial silicon injection effect on the top and bottom surfaces of the silicon wafer, and between about 1100° C. and about 1200° C., to generate nucleation centers, which act as oxygen precipitate growth sites during subsequent heat treatment, such that the nucleation center concentration profile from the top surface to the bottom surface of the wafer comprises first and second peaks at first and second predetermined depths from the top and bottom surfaces of the wafer, respectively. Also, the nucleation center concentration remains at a predetermined concentration, which is lower than a critical concentration to make the DZ, between the top surface of the wafer and the first peak and between the bottom surfaces of the wafer and the second peak. Finally, the nucleation center profile has a concave region between the first and second peaks, which corresponds to a bulk region of the wafer. Symmetrical or asymmetrical profiles may be provided.

In yet other embodiments, the RTA is performed on a silicon wafer in an atmosphere of a gas mixture comprising ammonia (NH$_3$) and argon (Ar), to generate nucleation centers, which act as oxygen precipitate growth sites during subsequent heat treatment, such that the nucleation center concentration profile from the top surface to the bottom surface of the wafer may be as described above. In yet other embodiments, the RTA is performed between about 1100° C. and 1150° C. In still other embodiments, the RTA is performed at a temperature of about 1120° C. In other embodiments, the RTA is performed for at least about five seconds. In still other embodiments, the RTA is preceded by rapidly heating the atmosphere comprising ammonia and argon, at about 50° C. per second.

According to still other method embodiments of the present invention, a silicon wafer is manufactured by performing RTA on a silicon wafer having a top surface and a bottom surface in an atmosphere comprising argon and ammonia, for at least about five seconds and at between about 1100° C. and about 1200° C. In other embodiments, the RTA is performed at between about 1100° and about 1150° C. In still other embodiments the RTA is performed at about 1120° C. In yet other embodiments, prior to performing the RTA, oxygen is purged from the atmosphere and sensing may be performed to determine that less than a predetermined concentration of oxygen is present in the atmosphere. Moreover, in other embodiments, prior to performing the RTA, heating of the atmosphere is increased at about 50° C. per second, for example from about 800° C. to between about 1100° C. and about 1150° C. Moreover, after performing the RTA, the heating may be decreased by between about 10° C. per second and about 70° C. per second, for example to about 800° C. In yet other embodiments, after decreasing the heating, ammonia may be purged from the atmosphere.

According to other method embodiments of the present invention, a plurality of silicon wafers are manufactured by sequentially performing an RTA process on a series of silicon wafers in an RTA chamber in an atmosphere comprising argon and ammonia, and at below a temperature that causes sublimation of silicon dioxide from the series of silicon wafers onto the RTA chamber. The RTA may be performed under any of the conditions that were described above. In other embodiments, silicon wafers may be sequentially processed for up to six months or more without cleaning the RTA chamber of silicon dioxide.

According to other method embodiments, heat treatment is performed after the RTA to produce an oxygen precipitate concentration profile from the top surface to the bottom surface of the wafer, which comprises first and second peaks at first and second predetermined depths from the top and bottom surfaces of the wafer, respectively, a DZ between the top surfaces of the wafer and the first peak and between the bottom surface of the wafer and the second peak, and a concave region between the first and second peaks. Symmetrical or asymmetrical profiles may be provided.

In other embodiments of the invention, a silicon wafer that is subject to an RTA process according to embodiments of the present invention may be manufactured from an ingot which is pulled from molten silicon in a hot zone furnace according to an ingot pulling rate profile where the pulling rate of the ingot is high enough so that formation of interstitial agglomerates is prevented, but low enough so that formation of interstitial agglomerates is prevented, and the formation of vacancy agglomerates is prevented.

In still other embodiments of the invention, a silicon wafer that is subject to an RTA process according to embodiments of the present invention may be manufactured from an ingot which is pulled from a molten silicon in a hot zone furnace according to an ingot pulling rate profile, where the pulling rate of the ingot is high enough so that vacancy agglomerates are formed through the diameter of the ingot without forming interstitial agglomerates.

According to other embodiments of the invention, a Czochralski puller for growing a monocrystalline silicon ingot includes a chamber enclosure, a crucible in the chamber enclosure that holds molten silicon, a seed holder in the chamber enclosure adjacent the crucible to hold a seed crystal, and a heater in the chamber enclosure surrounding the crucible. A ring-shaped heat shield housing also is provided in the chamber enclosure including inner and outer heat shield housing walls that are separated from each other, and a heat shield housing top and a heat shield housing bottom which connect the inner and outer heat shield housing walls, the heat shield housing top sloping upwards from the inner heat shield housing wall to the outer heat shield housing wall, and the heat shield housing bottom sloping downwards from the inner heat shield housing wall to the outer heat shield housing wall. The ring-shaped heat shield housing also includes a notch therein at an intersection of the outer sheet housing wall and the heat shield housing bottom. A support member supports the heat shield housing within the crucible.

According to other embodiments, the heat shield housing bottom includes a first portion adjacent the inner heat shield housing wall that slopes downward from the inner heat shield housing wall toward the outer heat shield housing wall. The heat shield housing bottom also includes a second portion adjacent the outer heat shield housing wall that slopes downward from the outer heat shield housing wall toward the inner heat shield housing wall.

Czochralski pullers according to embodiments of the invention also pull the seed holder from the crucible to grow the molten silicon into the cylindrical monocrystalline silicon ingot, which grows along and around its central axis in a cylindrical shape and forms an ingot-molten silicon interface with the molten silicon. At least one of the lengths of the inner and outer heat shield housing walls of the heat shield housing, the slope angles of the heat shield housing top and first and second portions, the distance between the ingot and the inner heat shield housing wall, the distance between the crucible and the outer heat shield housing wall, the distance between the molten silicon and the inner heat shield housing wall and the location of the heat shield plate are selected such that the pulled ingot is cooled at a rate of at least 1.4 K/min based on the temperature of the ingot at the center thereof, from the temperature at the ingot-molten silicon interface to a predetermined temperature of the ingot.

DETAILED DESCRIPTION OF PREFERRED EMBODIMENTS

Figure 1:
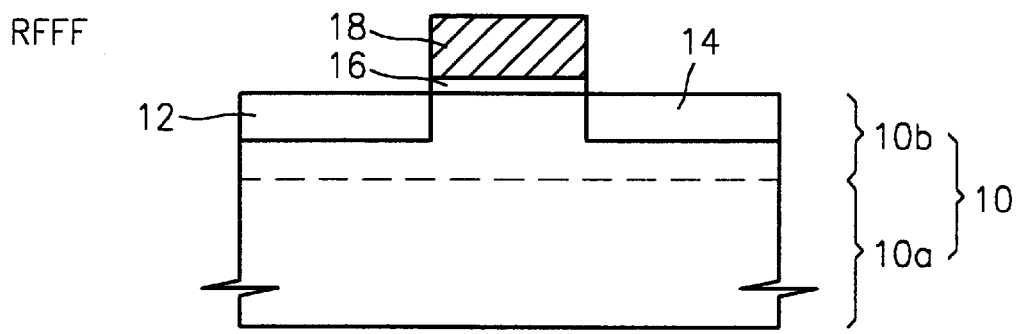
FIG. 1 is a sectional view showing a structure of a conventional Metal Oxide Semiconductor (MOS) transistor formed near the surface of a silicon wafer.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 2:
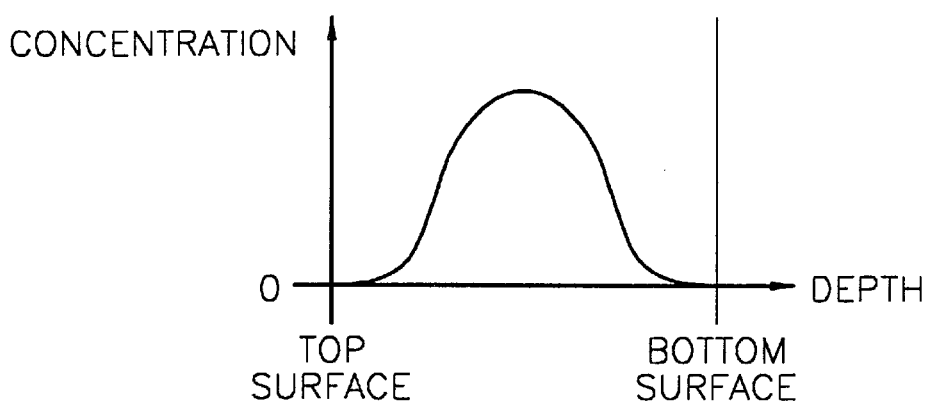
FIG. 2 is a diagram illustrating an oxygen precipitate concentration profile of a conventional wafer.
Figure 3:
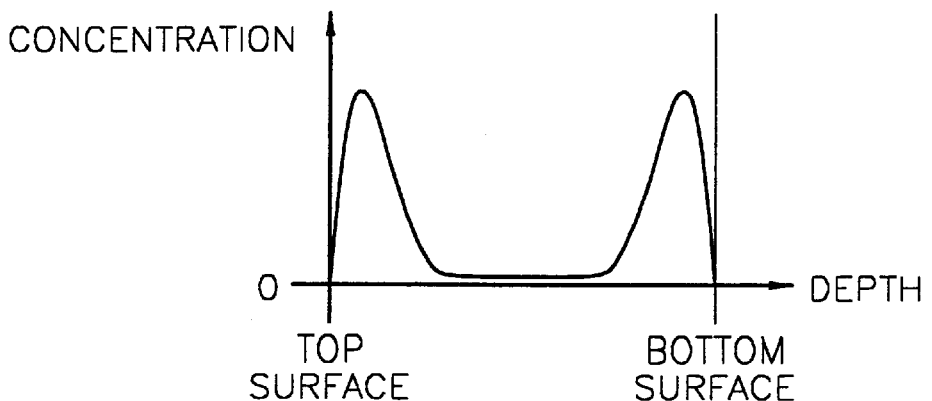
FIG. 3 is a diagram illustrating an oxygen precipitate concentration profile of another conventional wafer.
Figure 4:
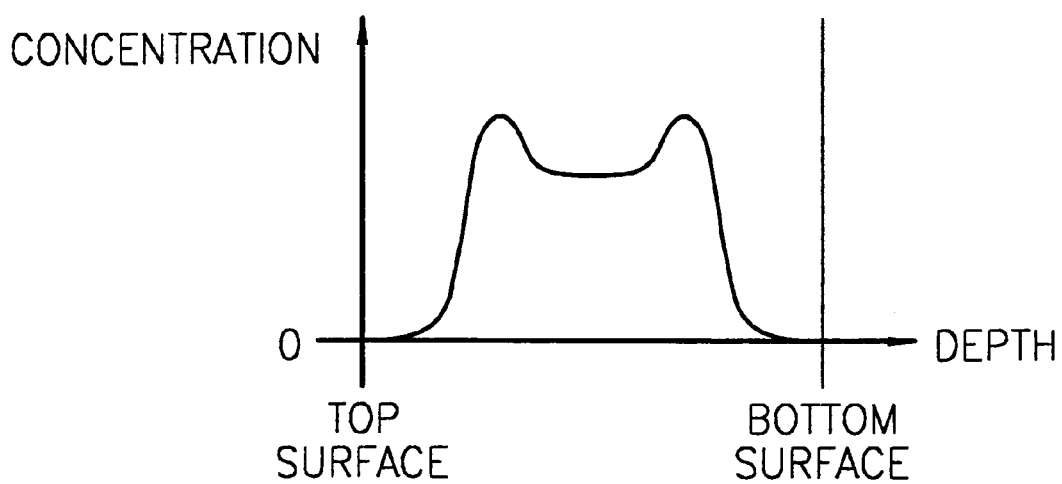
FIG. 4 shows an oxygen precipitate concentration profile of a silicon wafer according to embodiments of the present invention.

FIG. 4 schematically shows an oxygen precipitate concentration profile of a silicon wafer according to embodiments of the present invention. Comparing this profile to the oxygen precipitate concentration profiles of the silicon wafers manufactured by the conventional techniques, which are shown in FIGS. 2 and 3, there exist Denuded Zones (DZs) in a predetermined depth range from both the top and bottom surfaces of the wafer, and the oxygen precipitate concentration forms double peaks at the boundaries between each DZ and a bulk region. Also, in the bulk region between the double peaks, a large amount of oxygen precipitates are present, which are enough to produce a gettering effect on metal contaminants.

More particularly, with a conventional oxygen precipitate profile, metal contaminants gettered by a single peak positioned in the central area of the wafer may be released with subsequent thermal treatment processes. In contrast to the conventional profile, embodiments of the invention which include double peaks in the oxygen precipitate concentration profile, metal contaminants may be released in the direction of both the surfaces and the bulk region of the wafer, so that the amount of metal contaminants released to the surfaces can be reduced.

Figure 5:
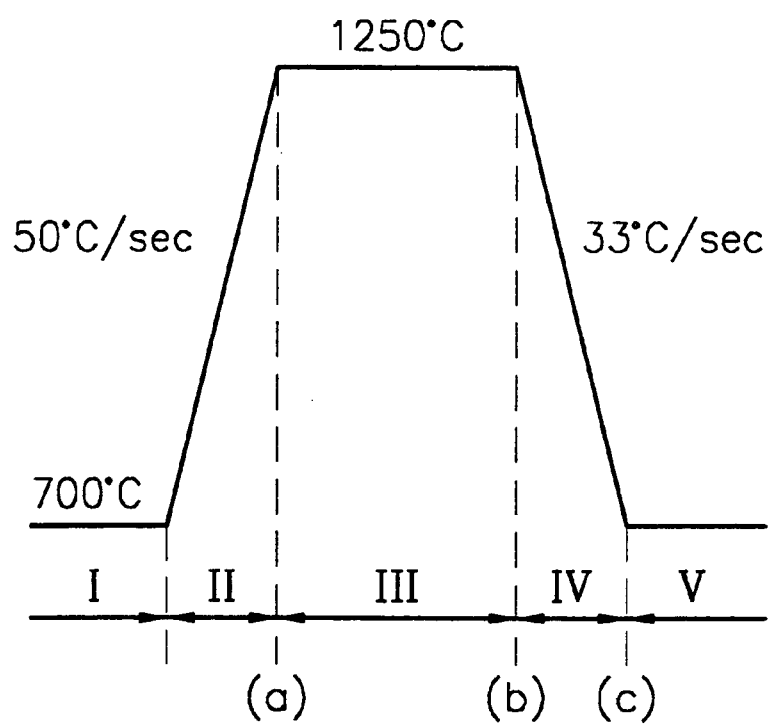
FIG. 5 is a time chart for a Rapid Thermal Annealing (RTA) process according to embodiments of the present invention.

FIG. 5 is a time chart for a Rapid Thermal Annealing (RTA) process according to embodiments of the present invention. A commercially available RTA furnace may be used. In the RTA process, first a silicon wafer according to the present invention is loaded into the RTA furnace, the temperature of which is set at, for example, about 700° C, for a standby period (I). Then, the temperature in the RTA furnace is rapidly increased, for example, at a rate of about 50° C./sec to a temperature of about 1250° C. (II). Then, the temperature is maintained at 1250° C. for a predetermined period of time, for example, about 10 seconds (III), and the temperature in the RTA furnace is sharply decreased at a rate of about 33° C./sec up to the temperature of the standby period (IV). Finally, the wafer is unloaded from the RTA furnace (V). By embodiments of the RTA process illustrated in FIG. 5, the distribution of the oxygen precipitate nucleation centers can be controlled, and voids or Crystal Originated Precipitates (COPs), which are present near the surface of the wafer, can be dissolved, as will be described later with reference to FIG. 11.

The processing temperature range of FIG. 5 is merely illustrative. However, in RTA according to embodiments of the present invention, the kinds of ambient gases, flow rates of ambient gases, mixing ratio of ambient gases, ramp-up rate, annealing temperature, annealing time and/or ramp-down rate (i.e., cooling rate) all may contribute to attaining a profile according to FIG. 4, as will be described below. The RTA is carried out at at least about 1150° C. for at least about 5 seconds. For example, the RTA is performed at 1150° C. for at least 30 seconds, or at 1250° C. for at least 5 to 10 seconds. Also, the wafer is cooled rapidly at a rate of at least 30° C./sec.

A gas mixture containing a gas which provides a vacancy injection effect to the surface of the wafer, and a gas which provides an interstitial silicon injection effect, is used as a gas for the RTA according to embodiments of the present invention. In some embodiments, nitrogen ($N_2$) gas is used as the gas which has the vacancy injection effect, and argon (Ar) and/or hydrogen ($H_2$) gas is used as the gas which has the interstitial silicon injection effect.

Figure 6:
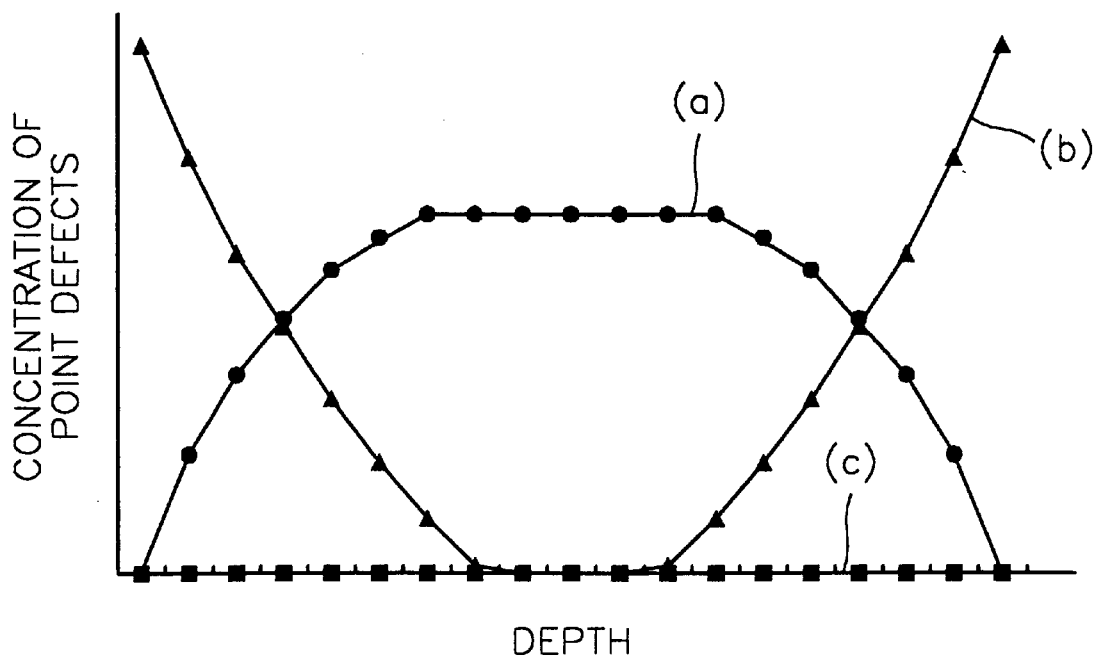
FIG. 6 shows a point defect concentration profile with respect to the depth of a wafer, after an RTA process illustrated in FIG. 5 is carried out in a nitrogen ($N_2$) gas atmosphere.
Figure 7:
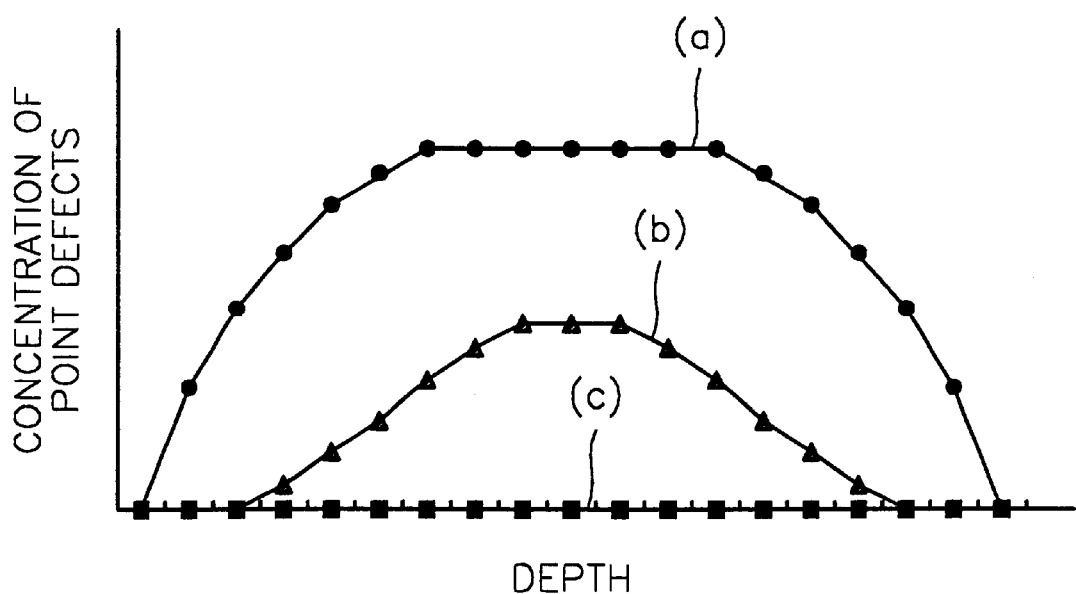
FIG. 7 shows a point defect concentration profile with respect to the depth of wafer, after an RTA process illustrated in FIG. 5 is carried out in an argon (AR) gas atmosphere.
Figure 8:
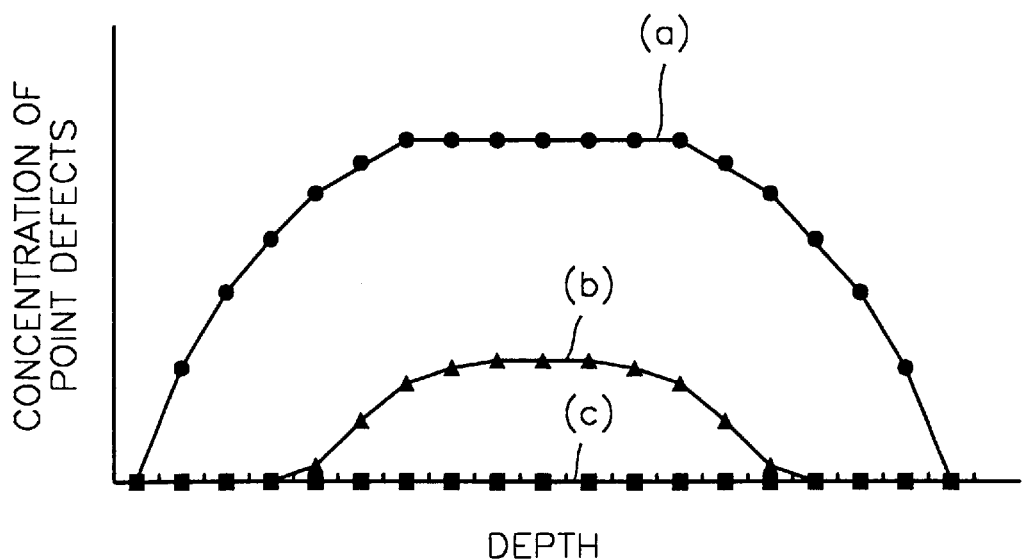
FIG. 8 shows a point defect concentration profile with respect to the depth of wafer, after an RTA process illustrated in FIG. 5 is carried out in a hydrogen ($H_2$) gas atmosphere.

FIGS. 6 through 8 illustrate the point defect concentration profiles of vacancy defects and interstitial silicon defects with respect to the depth of the wafer, after the RTA illustrated in FIG. 5 is carried out in $N_2$, Ar and $H_2$ atmospheres, respectively. In FIGS. 6 through 8, the plot (a) represents the vacancy point defect concentration profile after RTA in an inert gas atmosphere, and plots (b) and (c) represent the vacancy and interstitial point defect concentration profiles, respectively, after the RTA in the corresponding gas atmosphere.

As shown in the embodiments of FIGS. 6 through 8, the vacancy point defect concentration (convex curve indicated by (a)) after the RTA in the inert gas atmosphere was low at the top and bottom surfaces of the wafer, and was high in the bulk region of the wafer. When the temperature of the RTA furnace is rapidly increased to the temperature at the point (a) of FIG. 5 in the inert gas atmosphere, the equilibrium concentration of vacancies, which exist as point defects in the wafer, increases. Since the mobility of vacancies is low in the bulk region of the wafer, the vacancy concentration remains lower than the equilibrium concentration in the bulk region. However, the movement of vacancies is active near the surface of the wafer, so that the concentration of vacancies near the surface of the wafer reaches the equilibrium concentration, rapidly. On the other hand, as the temperature of the RTA furnace sharply increases, the equilibrium concentration of the interstitial silicon is lowered, for example by Frenkel recombination between vacancy and interstitial silicon, with the increase in the vacancy concentration. Also, since the mobility of the interstitials present in the bulk region of the wafer is low, like the vacancies therein, the interstitial concentration in the bulk region remains higher than the equilibrium concentration. However, the interstitial concentration near the surface of the wafer reaches the equilibrium concentration, as does the vacancy concentration near the surface of the wafer.

When the wafer is held at the high temperature for a period of time up to the point (b) of FIG. 5, diffusion occurs such that both vacancies and interstitials reach the equilibrium concentrations. After the wafer is rapidly cooled down to the temperature of the point (c) of FIG. 5, the interstitial point defects, which have a large diffusion coefficient, reach a new equilibrium concentration at the reduced temperature. However, the vacancy point defects, which have a small diffusion coefficient, become supersaturated in the wafer. In particular, the degree of supersaturation of vacancies is high in the bulk region of the wafer. However, because the mobility of the vacancies is high near the surface of the wafer, the concentration of vacancy point defects immediately reaches a new equilibrium concentration at the dropped temperature.

Thus, the vacancy concentration profile after the RTA in the inert atmosphere can have the convex shape as shown in FIGS. 6 through 8.

Also, as shown in FIG. 6, in the case where the RTA of FIG. 5 is performed in an $N_2$ gas atmosphere, $N_2$ gas which permeates into the bulk region of the wafer combines with vacancy silicon to produce smaller-sized silicon nitride ($Si_3N_4$), so that the vacancy concentration in the bulk region is lowered. Meanwhile, the vacancy concentration increases near the surface of the wafer due to the vacancy injection effect by the $N_2$ gas. As a result, the vacancy concentration profile in the $N_2$ atmosphere has the opposite shape (plot indicated by "b") to that of the wafer fabricated in the inert atmosphere.

In addition, when the RTA process of FIG. 5 is performed in the Ar and $H_2$ gas atmospheres as shown in FIGS. 7 and 8, respectively, the vacancy concentration is lowered throughout the wafer due to the interstitial silicon injection effect. In particular, since a recombination of vacancy silicon and interstitial silicon rapidly occurs near the surface of the wafer due to the interstitial silicon injection effect of the gases used, the vacancy concentration can be maintained at a critical concentration, which is the equilibrium concentration at a particular temperature.

Figure 9:
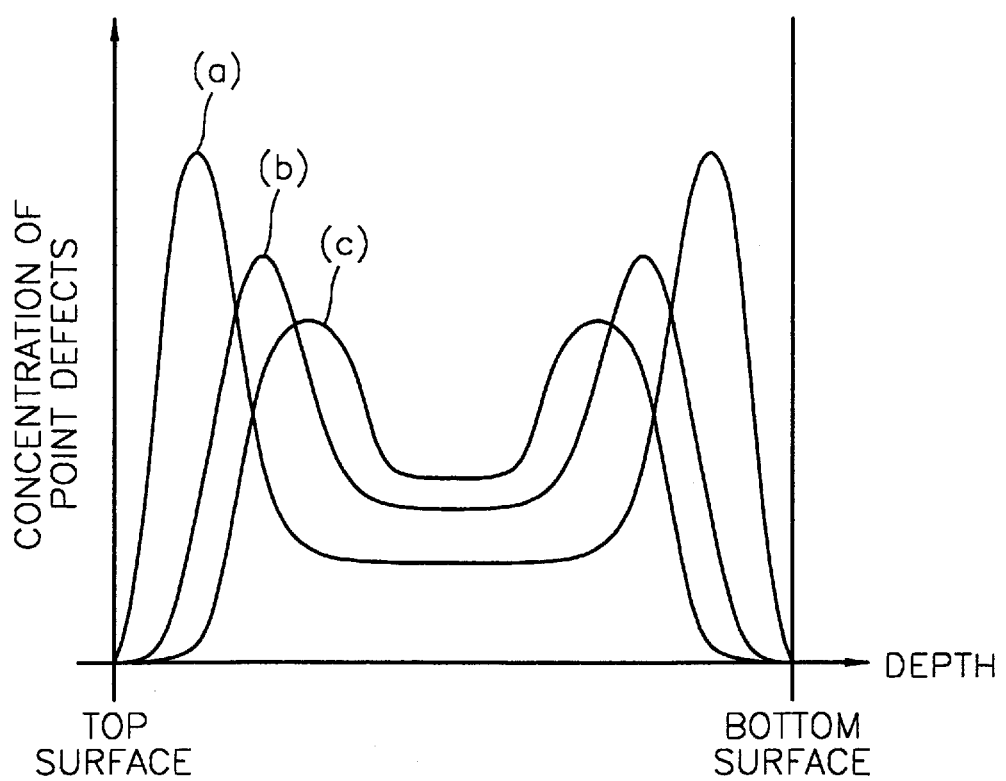
FIG. 9 shows a vacancy concentration profile after an RTA process of FIG. 5 with respect to a variation of the mixing ratio of a gas mixture containing $N_2$ gas and Ar gas.

In embodiments of the invention, the RTA of FIG. 5 is performed in a gas mixture atmosphere, for example, $N_2$ and Ar gases or $N_2$ and $H_2$ gases, and thus the vacancy concentration profiles in the gas mixture atmospheres can be obtained by combining those of FIGS. 6 and 7, and those of FIGS. 6 and 8. As shown in FIG. 9, the vacancy concentration profiles of the wafers fabricated in the gas mixture atmospheres show first and second peaks at a predetermined depth from the top and bottom surfaces of the silicon wafer. Also, it can be noted that the vacancy concentration from the top and bottom surfaces to the first and second peaks is lower than the equilibrium concentration at a particular temperature. Also, in the bulk region between the first and second peaks, the vacancy concentration profiles have a concave shape.

The vacancy concentration profile of FIG. 9 can be obtained according to embodiments of the invention, because the RTA process of FIG. 5 is performed in the gas mixture atmosphere containing the gases providing the vacancy and interstitial silicon injection effects. Comparing, using a logarithmic scale, the vacancy silicon concentration profile obtained from the vacancy silicon injection effect in the $N_2$ gas atmosphere, to the interstitial silicon concentration profiles obtained from the interstitial silicon injection effect in Ar or $H_2$ gas atmosphere, the vacancy silicon concentration profile is less steep than the interstitial silicon concentration profile in the region from the top and bottom surfaces of the wafer to a predetermined depth. However, the vacancy silicon concentration profile becomes steeper than the interstitial silicon concentration profile from the predetermined depth toward the bulk region. Thus, in the denuded zone near the top and bottom surfaces of the wafers, the vacancy silicon concentration is maintained at or below a critical value, i.e., less than or equal to the equilibrium concentration value at a particular temperature, by the recombination with the interstitial silicones. Beyond the denuded zone, the vacancy silicon concentration sharply increases to be equal to and higher than the equilibrium concentration value. Then, at a depth of the wafer where the difference between the vacancy and interstitial silicon concentration values reaches a maximum value, i.e., where the vacancy silicon concentration profile becomes steeper than the interstitial silicon concentration, peaks (first and second peaks) are formed. The vacancy silicon concentration decreases beyond the peaks toward the bulk region, so that a concave vacancy concentration profile is obtained between the first and second peaks.

According to other embodiments of the invention, the vacancy point defects of the wafer generate oxygen precipitates via thermal process cycles in subsequent semiconductor device manufacture. In other words, the vacancy point defects become nucleation centers for oxygen precipitates formed by the subsequent thermal process cycles. The higher the vacancy concentration, the higher the oxygen precipitate concentration. Thus, the oxygen precipitate concentration profile can be inferred from the vacancy concentration profile of the wafer.

The vacancy concentration and the oxygen precipitate concentration have the following relationship:

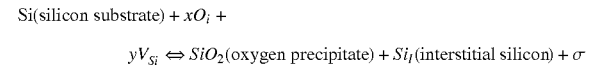

$$Si(\text{silicon substrate}) + xO_i + yV_{Si} \Leftrightarrow SiO_2(\text{oxygen precipitate}) + Si_I(\text{interstitial silicon}) + \sigma$$

This relational expression says that as the vacancy silicon concentration ($V_{si}$) and the initial oxygen concentration ($O_i$) increase, the reaction proceeds to the right, so that the oxygen precipitate concentration increases. In the above relational expression, δ is a constant.

In embodiments of the invention, the oxygen precipitate concentration profile was obtained after subsequent heat treatment on the wafer which had undergone the RTA process of FIG. 5. The conditions for the subsequent heat treatment were determined taking into account the conditions of the thermal process cycles in semiconductor device manufacture, during which oxygen precipitates are formed. For comparison between wafers, after the RTA process of FIG. 5, the subsequent processes were carried out at about 800° C. for about 4 hours and at about 1600° C. for about 16 hours in an $N_2$ gas atmosphere.

Figure 31:
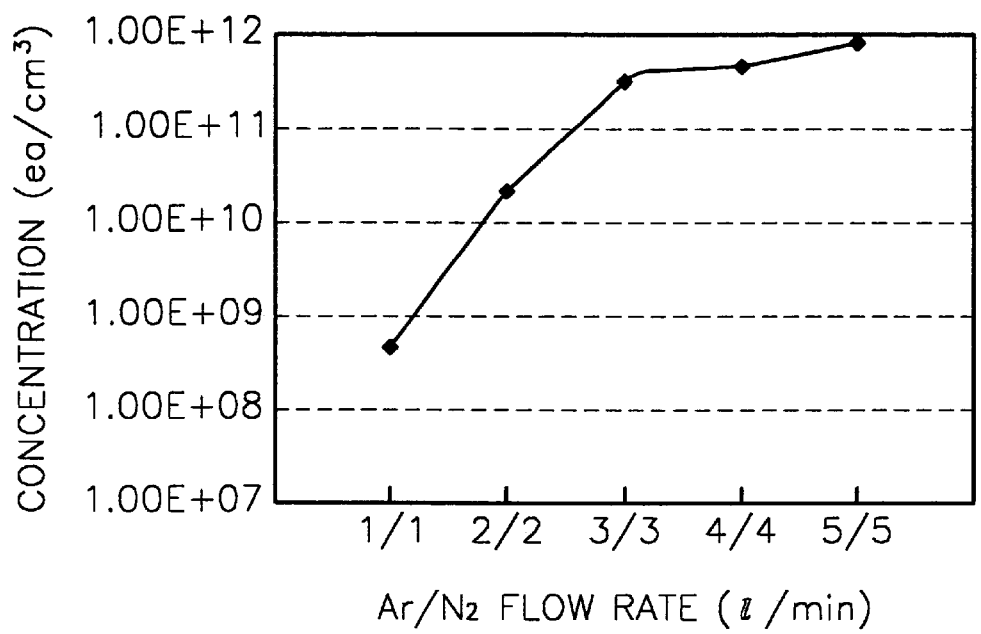
FIG. 31 is a graph showing variation of oxygen precipitate concentration at the peaks after the RTA of FIG. 5 with respect to a variation of the flow rate of $N_2$ and Ar mixture gas.

Also, in order to investigate the effect of the gas mixture used in the present invention, a flow rate and mixing ratio of the gas mixture used during the RTA process of FIG. 5 were varied. FIG. 9 shows the vacancy concentration profile after the RTA of FIG. 5 with respect to a variation of the mixing ratio of the gas mixture containing $N_2$ gas and Ar gas. FIG. 31 is a graph showing the variation in oxygen precipitant concentration at the peaks with respect to a variation of the flow rate of Ar/$N_2$ mixture gas.

In FIG. 9, (a) represents the vacancy concentration profile when the mixing ratio of $N_2$ and Ar is 70:30, (b) represents when the mixing ratio of $N_2$ and Ar is 50:50, and (c) represents when the mixing ratio of $N_2$ and Ar is 30:70. It should be noted that as the $N_2$ concentration increases, the peaks shift toward surfaces of the wafer, and the vacancy concentration of the peaks increases. That is, the depths of the DZs, where the oxygen precipitates due to the subsequent processes are not formed, sharply decreases with the increase in the $N_2$ concentration.

The oxygen precipitate concentration of FIG. 31 at the peaks was measured after a further thermal treatment at about 800° C. for about 4 hours and then at about 1600° C. for about 16 hours in an $N_2$ atmosphere after the RTA of FIG. 5 was completed. Here, the RTA was performed by flowing Ar/$N_2$ gas mixture at a ramp-up rate of about 50° C./sec, an annealing temperature of about 1250° C., an annealing time of about 10 seconds and a ramp-down rate of about 33° C./sec. The flow rates of the Ar/$N_2$ gases in the Ar/$N_2$ mixture were varied to be 1/1, 2/2, 3/3, 4/4 and 5/5 liters/min. The result of FIG. 31 shows that the oxygen precipitate concentration increases with the increase in flow rate of the mixture gas.

Figure 32:
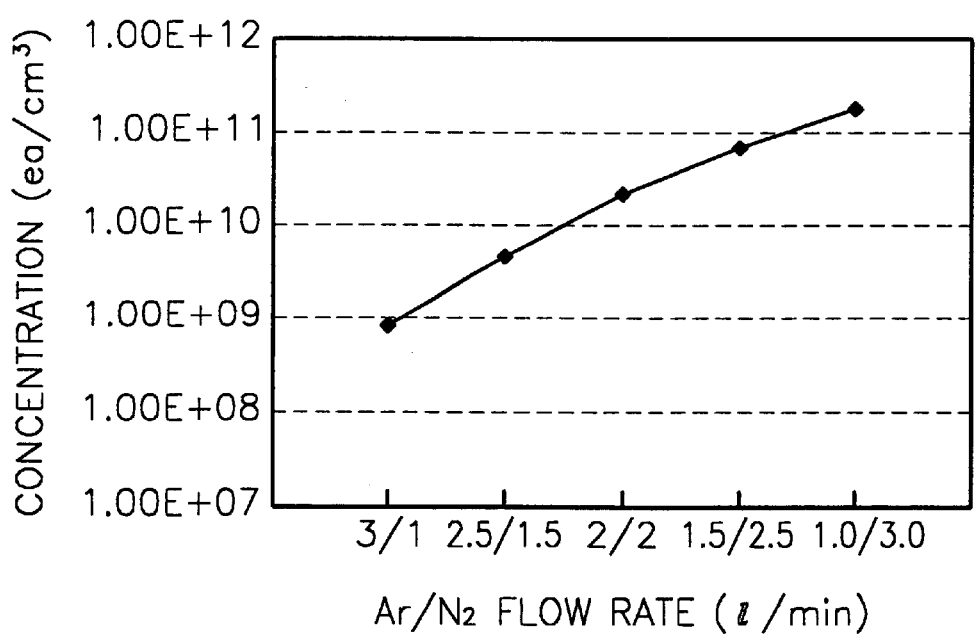
FIG. 32 is a graph showing variation of oxygen precipitate concentration at the peaks after the RTA of FIG. 5 with respect to a variation of the mixing ratio of $N_2$ and Ar mixture gas.

The oxygen precipitate concentration of FIG. 32 at the peaks was measured after the RTA was performed in the same conditions as for the data of FIG. 31 except that the Ar/$N_2$ gases in the gas mixture were supplied at a flow rate of 3/1, 2.5/1.5, 2/2, 1.5/2.5, 1/3 liters/min with various mixing ratios. After the RTA of FIG. 5, a further thermal treatment was performed at 800° C. for 4 hours and then at 1600° C. for 16 hours in a $N_2$ atmosphere. The result of FIG. 32 shows that at a constant mass flow of the gas mixture at 4 liters/min, the oxygen precipitate concentration increases with the increase in the ratio of $N_2$ in the gas mixture.

The processing conditions of the RTA, including the mixing ratio and flow rate of gas mixture, the ramp-up rate, the annealing temperature and time, the ramp-down rate and the like, can be varied at various levels to vary the positions of peaks at the vacancy concentration profile, the vacancy concentration value at the peaks, the vacancy concentration value at the bulk region, the size of denuded zone and/or the like.

Figure 33:
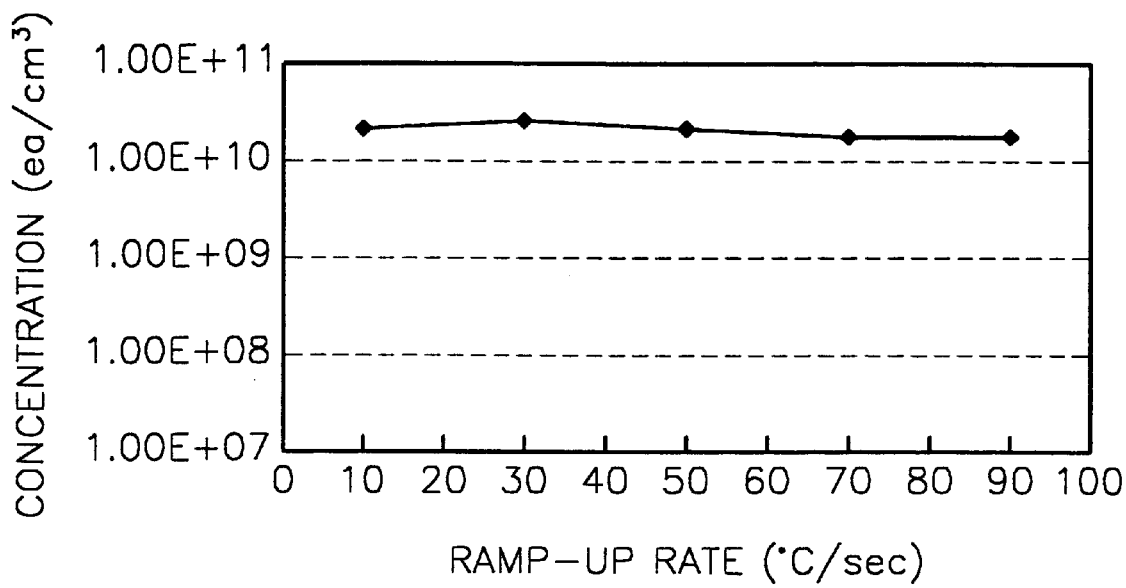
FIG. 33 is a graph showing variation of oxygen precipitate concentration at the peaks after the RTA of FIG. 5 with respect to a variation of the ramp-up rate.

FIG. 33 shows the variation of oxygen precipitate concentration at the peaks after the RTA of FIG. 5 with respect to a variation of the ramp-up rate. For comparison, the other processing conditions of the RTA were kept constant, i.e., the mixing ratio of $N_2$ and Ar gases was set to 50:50, the annealing temperature was set to 1250° C., the annealing time was set to 10 seconds and the ramp-down rate was set to 33° C./sec. A subsequent thermal treatment was carried out for all of the wafers at 800° C. for 4 hours and then at 1600° C. for 16 hours in a $N_2$ atmosphere, which was the same as in the previous measurements. The result is shown in Table 1.

TABLE 1

| Ramp-up rate (° C./sec) | Oxygen precipitate concentration at peaks (ea/cm$^3$) |
|---|---|
| 10 | $2.0 \times 10^{10}$ |
| 30 | $2.5 \times 10^{10}$ |
| 50 | $2.1 \times 10^{10}$ |
| 70 | $2.0 \times 10^{10}$ |
| 90 | $2.0 \times 10^{10}$ |

FIG. 33 and Table 1 indicate that the oxygen precipitate concentration at the peaks are not influenced greatly by the ramp-up rate.

Figure 34:
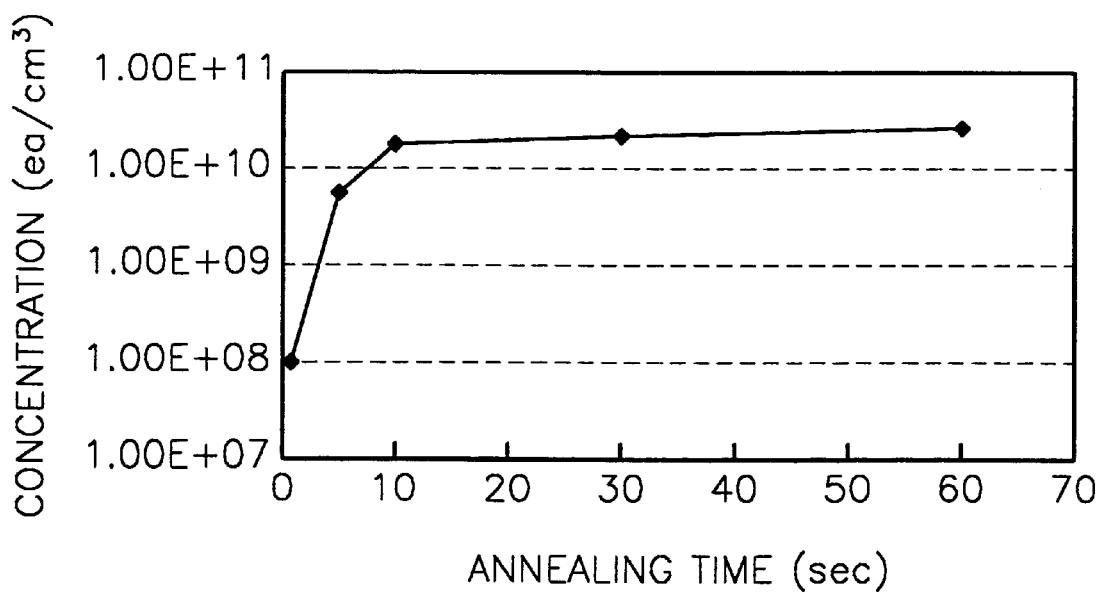
FIG. 34 is a graph showing variation of oxygen precipitate concentration at the peaks after the RTA of FIG. 5 with respect to a variation of the annealing time.

FIG. 34 shows the variation of oxygen precipitate concentration at the peaks after the RTA of FIG. 5 with respect to a variation of the annealing time. For an accurate comparison, the other processing conditions of the RTA were kept constant, i.e., the mixing ratio of $N_2$ and Ar gases was set to 50:50, the ramp-up rate was set to 50° C./sec, the annealing temperature was set to 1250 C., and the ramp-down rate was set to 33° C./sec. A subsequent thermal treatment was carried out for all of the wafers at 800° C. for 4 hours and then at 1600° C. for 16 hours in a $N_2$ atmosphere, which was the same as in the previous measurements. The result is shown in Table 2.

TABLE 2

| Annealing Time | Oxygen precipitate concentration at peaks (ea/cm$^3$) |
|---|---|
| 1 | $1.0 \times 10^8$ |
| 5 | $5.0 \times 10^9$ |
| 10 | $2.0 \times 10^{10}$ |
| 30 | $2.5 \times 10^{10}$ |
| 60 | $3.0 \times 10^{10}$ |

FIG. 34 and table 2 indicate that the oxygen precipitate concentration at the peaks is influenced by the annealing time, and the annealing should be continued for at least 5 seconds or more for the oxygen precipitate concentration of at least $10^9$/cm$^3$ or more at the peaks.

Figure 35:
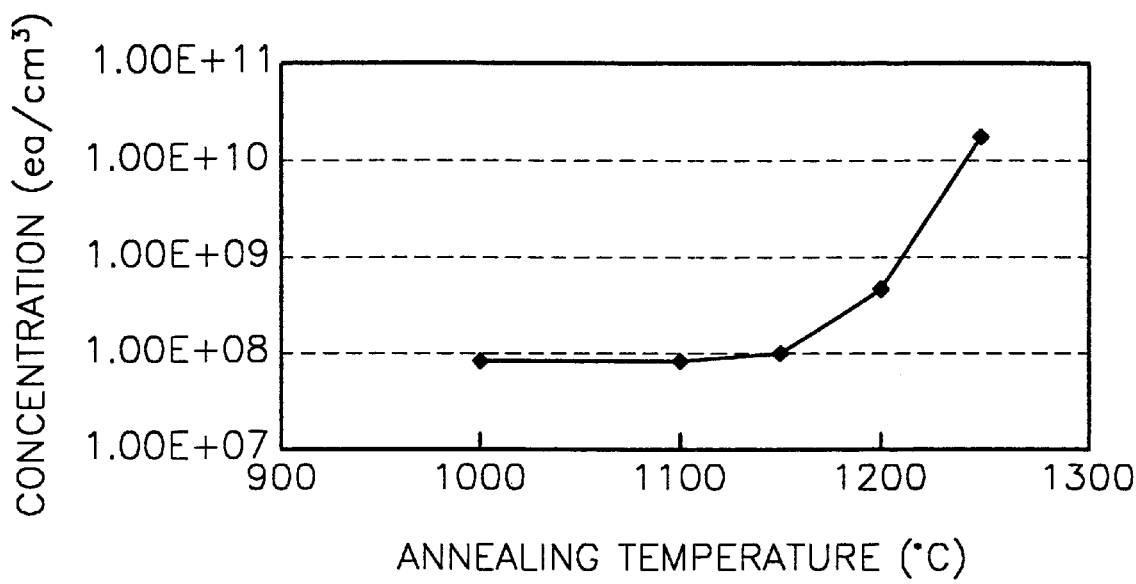
FIG. 35 is a graph showing variation of oxygen precipitate concentration at the peaks after the RTA of FIG. 5 with respect to a variation of the annealing temperature.

FIG. 35 shows the variation of oxygen precipitation concentration at the peaks after the RTA of FIG. 5 with respect to a variation of the annealing temperature. For comparison, the other processing conditions of the RTA were kept constant, i.e., the mixing ratio of $N_2$ and Ar gases was set to 50:50, the ramp-up rate was set to 50° C./sec, the annealing time was set to 10 seconds, and the ramp-down rate was set to 33° C./sec. A subsequent thermal treatment was carried out for all of the wafers at 800° C. for 4 hours and then at 1600° C. for 16 hours in a $N_2$ atmosphere, which was the same as in the previous measurements. The result is shown in Table 3.

TABLE 3

| Annealing Temperature | Oxygen precipitate concentration at peaks (ea/cm$^3$) |
|---|---|
| 12.50 | $2.0 \times 10^{10}$ |
| 1200 | $5.0 \times 10^8$ |
| 1150 | $1.0 \times 10^8$ |
| 1100 | $7.0 \times 10^7$ |
| 1000 | $7.0 \times 10^7$ |

FIG. 35 and table 3 indicate that the oxygen precipitate concentration at the peaks is influenced by the annealing temperature, and the annealing temperature should be high (at at least about 1250° C. or more) for the oxygen precipitate concentration of at least $10^9$/cm$^3$ or more at the peaks. The annealing temperature and time are closely associated with the oxygen precipitate concentration. Considering the result of FIG. 34, it can be noted that for a certain concentration of oxygen precipitate, the annealing time can be reduced at a higher annealing temperature, whereas the annealing time can be lengthened at a lower annealing temperature for a certain concentration.

Figure 36:
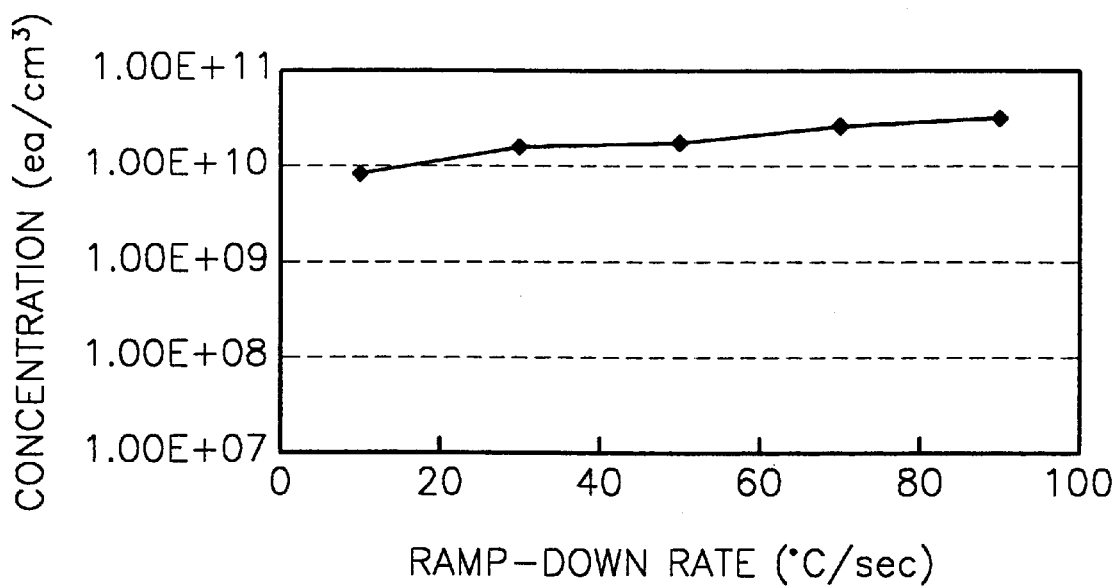
FIG. 36 is a graph showing variation of oxygen precipitate concentration at peaks after the RTA of FIG. 5 with respect to variation of ramp-down rate.

FIG. 36 shows the variation of oxygen precipitate concentration at the peaks after the RTA of FIG. 5 with respect to a variation of the ramp-down rate. For comparison, the other processing conditions of the RTA were kept constant, i.e., the mixing ratio of $N_2$ and Ar gases was set to 50:50, the ramp-up rate was set to 50° C./sec, the annealing temperature was set to 1250° C. and the annealing time was set to 10 seconds. A subsequent thermal treatment was carried out for all of the wafers at 800° C. for 4 hours and then at 1600° C. for 16 hours in a $N_2$ atmosphere, which was the same as in the previous measurements. The result is shown in Table 4.

TABLE 4

| Ramp-down rate (° C./sec) | Oxygen precipitate concentration at peaks (ea/cm³) |
|---|---|
| 10 | $8.0 \times 10^9$ |
| 30 | $2.0 \times 10^{10}$ |
| 50 | $2.2 \times 10^{10}$ |
| 70 | $3.0 \times 10^{10}$ |
| 90 | $3.5 \times 10^{10}$ |

FIG. 36 and Table 4 indicate that the oxygen precipitate concentration at the peaks is not influenced greatly by the ramp-down rate. However, the oxygen precipitate concentration slightly increases with the increase in ramp-up rate.

Figure 10:
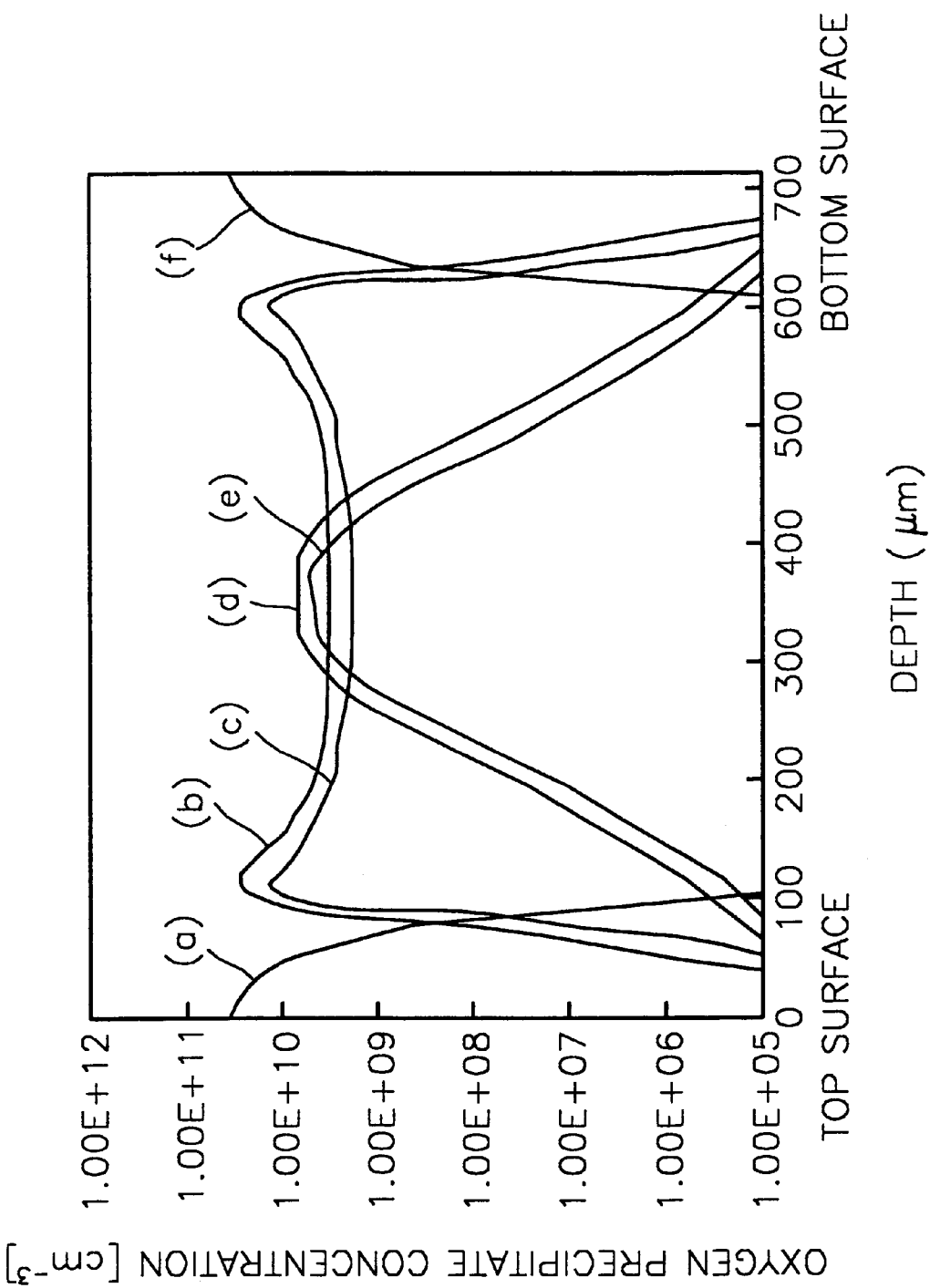
FIG. 10 shows an oxygen precipitate concentration profiles obtained through subsequent heat treatment after an RTA process according to embodiments of the present invention, with respect to the kinds of gas used during the RTA.

FIG. 10 shows the oxygen precipitate concentration profiles obtained through the subsequent heat treatment after the RTA process according to embodiments of the present invention, with respect to the kinds of gas used during the RTA. In FIG. 10, (a) represents the oxygen precipitate concentration profile of a wafer fabricated in a $N_2$ gas atmosphere, (b) represents that of a wafer fabricated in a $N_2$ gas and Ar gas atmosphere, (c) represents that of a wafer fabricated in a $N_2$ gas and $H_2$ gas atmosphere, (d) represents that of a wafer fabricated in an Ar gas atmosphere, and (e) represents that of a wafer fabricated in a $H_2$ gas atmosphere.

For comparison, the RTA and the subsequent heat treatment were carried out on all the wafers under the same processing conditions. That is, the RTA was performed at 1250° C. for 10 seconds, and the subsequent heat treatment were performed twice, as described above, at 800° C. for 4 hours and at 1600° C. for 16 hours.

The results are shown in Table 5.

TABLE 5

| Gas used | peak oxygen precipitate concentration (cm⁻³) | Oxygen precipitate concentration in bulk region (cm⁻³) | Depths of DZs (μm) | COP dissolution ability |
|---|---|---|---|---|
| Ar | $8 \times 10^9$ | $8 \times 10^9$ | 50 | Medium |
| $H_2$ | $6 \times 10^9$ | $6 \times 10^9$ | 60 | High |
| $N_2$ | $3 \times 10^9$ | $\cong 1 \times 10^5$ (detection limit) | 0 | None |
| $N_2$ + Ar | $2 \times 10^{10}$ | $5 \times 10^9$ | 10 | Medium |
| $N_2$ + $H_2$ | $1 \times 10^1$ | $5 \times 10^9$ | 15 | High |

Figure 11:
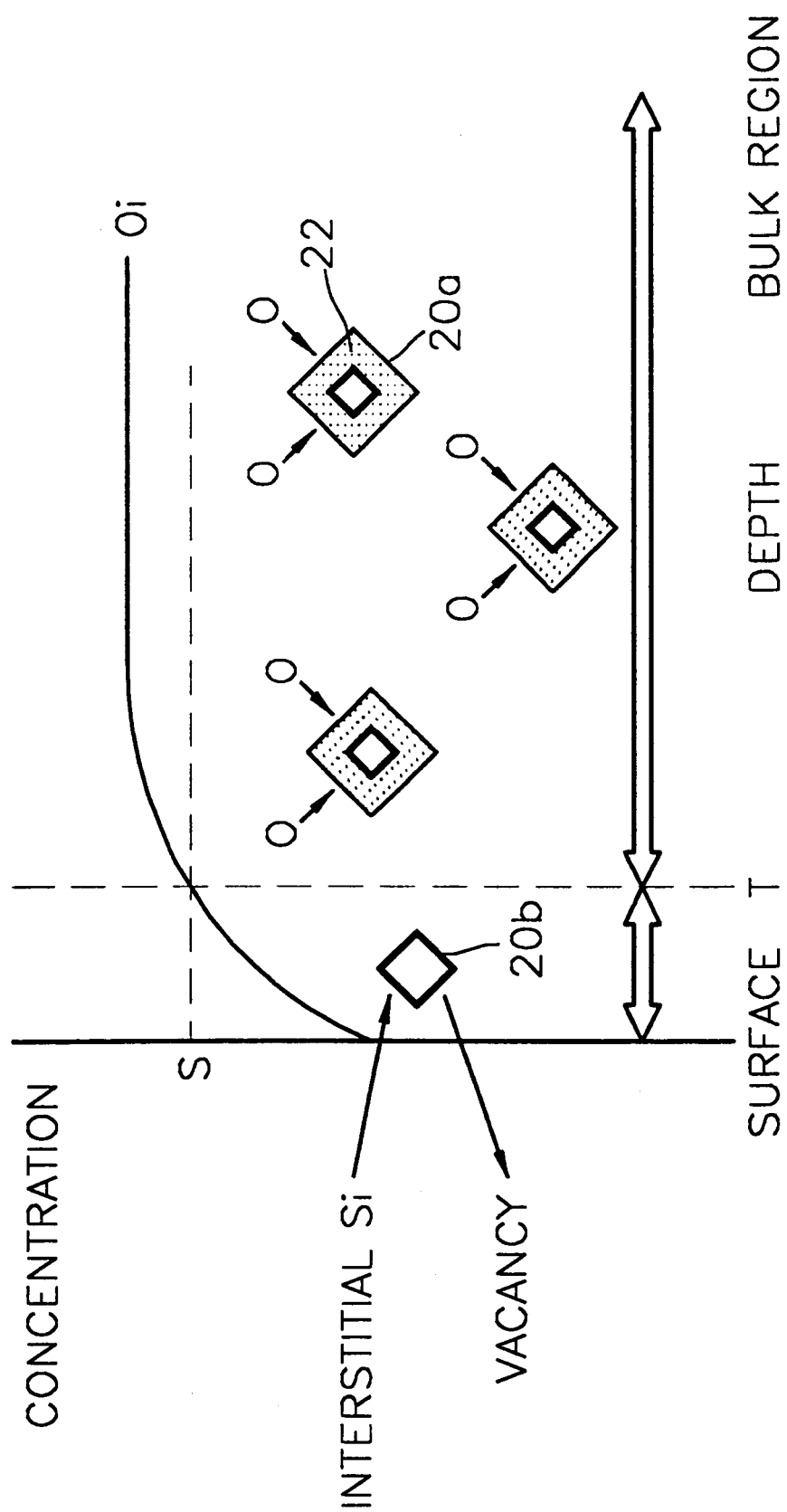
FIG. 11 is a diagram illustrating dissolution of Crystal Originated Precipitates (COPs) near the surface of the silicon wafer as the RTA of FIG. 5 is carried out in the Ar atmosphere.
Figure 12:
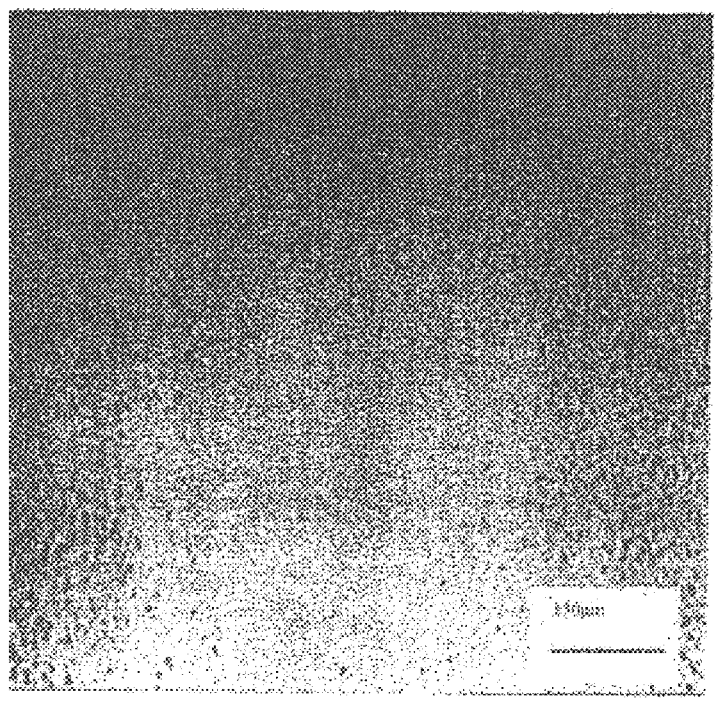
FIG. 12 is a photograph showing oxygen precipitate distribution of a wafer which has undergone a subsequent heat treatment after an RTA process according to embodiments of the invention in the $N_2$ gas atmosphere.
Figure 13:
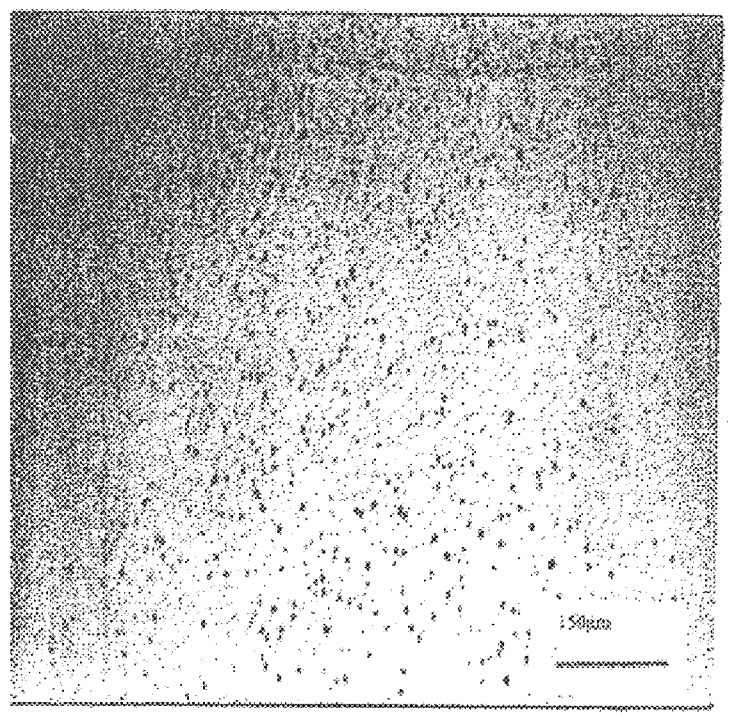
FIG. 13 is a photograph showing oxygen precipitate distribution of a wafer which has undergone a subsequent heat treatment after an RTA process according to embodiments of the invention in the Ar gas atmosphere.
Figure 14:
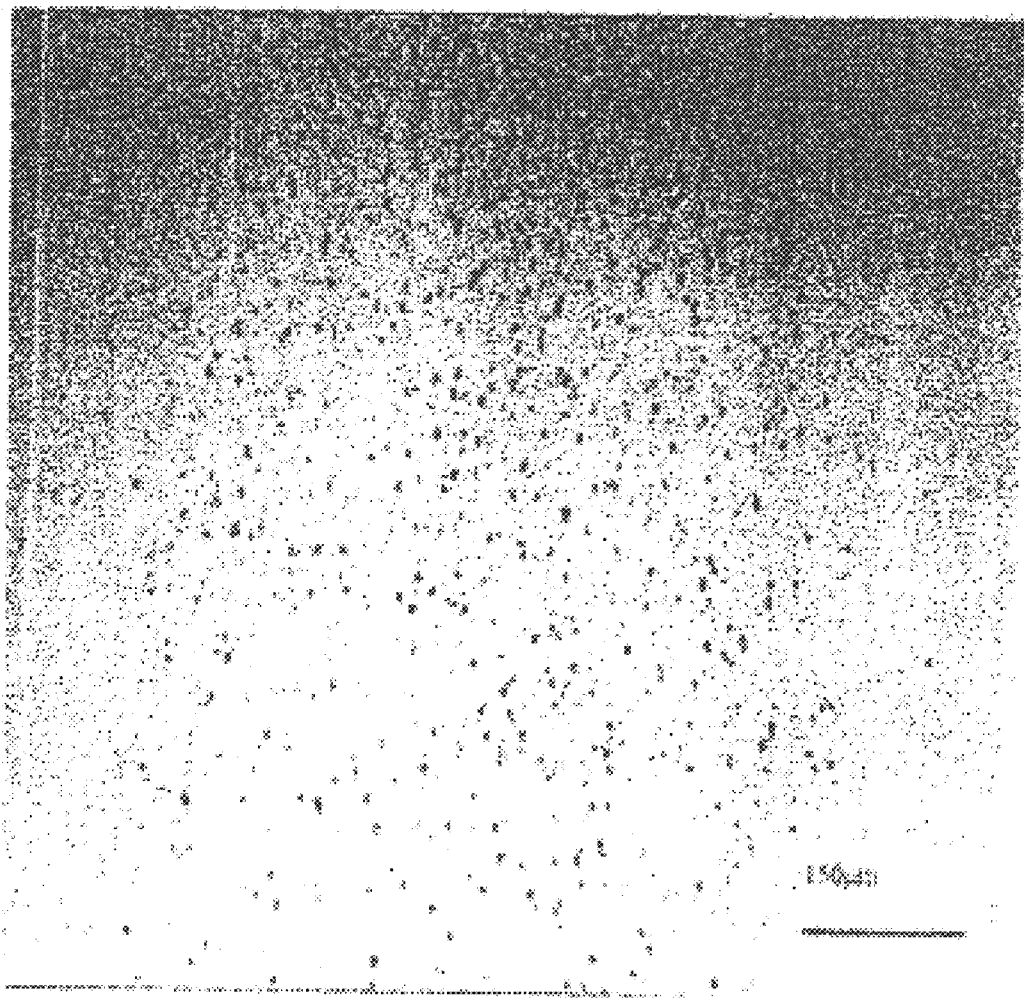
FIG. 14 is a photograph showing oxygen precipitate distribution of a wafer which has undergone a subsequent heat treatment after an RTA process according to embodiments of the invention in the $H_2$ gas atmosphere.
Figure 15:
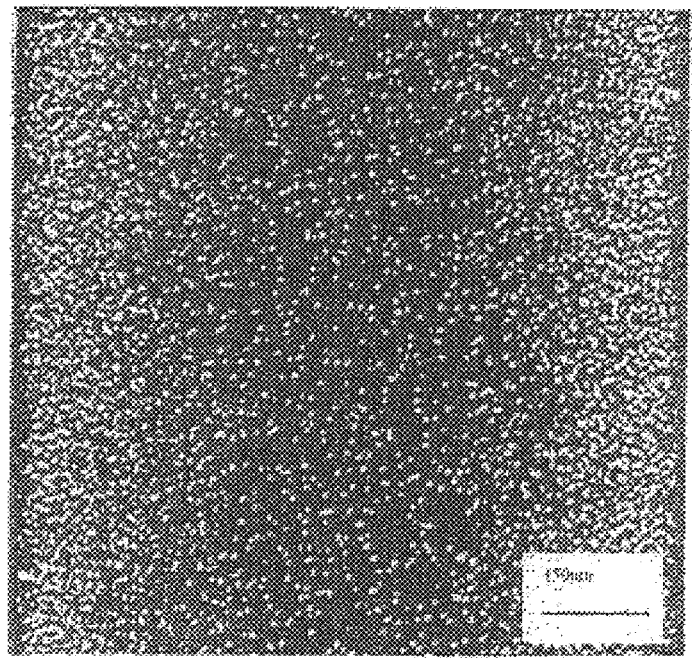
FIG. 15 is a photograph showing oxygen precipitate distribution of a wafer which has undergone a subsequent heat treatment after an RTA process according to embodiments of the invention in the $N_2$ and Ar gas atmosphere.
Figure 16:
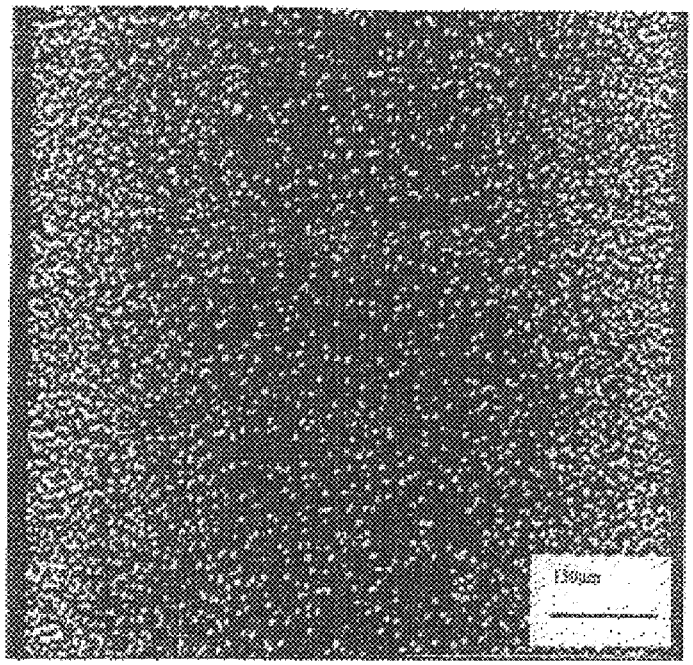
FIG. 16 is a photograph showing oxygen precipitate distribution of a wafer which has undergone a subsequent heat treatment after an RTA process according to embodiments of the invention in the $N_2$ gas and $H_2$ gas atmosphere.

FIG. 11 is a diagram illustrating dissolution of the COPs near the surface of the silicon wafer as the RTA of FIG. 5 is carried out in the Ar atmosphere. In general, the COPs which are formed during the ingot growth by the CZ technique have a broken octahedral void shape, and a silicon oxide layer 22 is formed on the inner side of a void 20a. Also, when the RTA process is performed in a Ar or $H_2$ gas atmosphere, wherein the gases provide the interstitial silicon injection effect to the surface of the wafer, the COPs, which are present near the surface of the wafer, are dissolved.

Describing a dissolution mechanism of the COPs in detail, as the ingot, in which oxygen is incorporated at the initial concentration $O_i$ during the crystal growth, is cooled, the oxygen concentration of the ingot becomes supersaturated at the cooling temperature. Thus, the initial oxygen concentration of the wafer formed from the ingot is also supersaturated beyond the predetermined solubility of oxygen (indicated by "S" in FIG. 11). However, the initial oxygen concentration near the surface of the wafer is equal to or less than the predetermined solubility "S" due to out-diffusion of oxygen through the surface of the wafer. Meanwhile, in the bulk region of the wafer, the supersaturated oxygen is supplied into the void 20a and is used to form the silicon oxide layer 22 on the inside of the void 20a. Also, since the initial oxygen concentration near the surface of the wafer (that is, a region between the surface and dashed line "T" of FIG. 11) is less than the predetermined solubility "S" of oxygen, oxygen is dissolved out of the silicon oxide layer (not shown) formed in the void 20b and simultaneously silicon is provided on the inside of the void 20b due to the interstitial silicon injection effect of the gas which is provided during the RTA process. As a result, the size of the void 20b decreases and the void 22b finally disappears.

Due to the COP dissolution effect, the RTA process according to embodiments of the present invention can be extended to many kinds of wafers. As shown in Table 5, such COP dissolution effect may be enhanced using the $H_2$ gas than using the Ar gas.

FIGS. 12 through 16 are photographs showing the oxygen precipitate distributions of the wafers which have undergone the subsequent heat treatment after the RTA, and have the oxygen precipitate concentration profiles of FIG. 10. In particular, FIG. 12 corresponds to the case of using $N_2$ gas, FIG. 13 corresponds to the case of using Ar gas, FIG. 14 corresponds to the case of using $H_2$ gas, FIG. 15 corresponds to the case of using $N_2$ and Ar gases, and FIG. 16 corresponds to the case of using $N_2$ and $H_2$ gases. Also, the left of each figure shows the top surface of the wafer, and the right thereof shows the bottom surface of the wafer.

Figure 17:
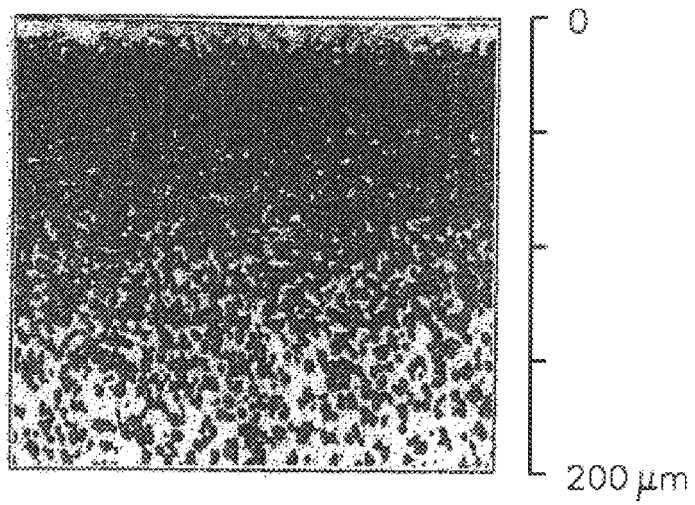
FIG. 17 is a photograph showing the depth of DZ formed near the surface of a wafer which has undergone a subsequent heat treatment after an RTA process according to embodiments of the invention in the $N_2$ gas atmosphere.
Figure 18:
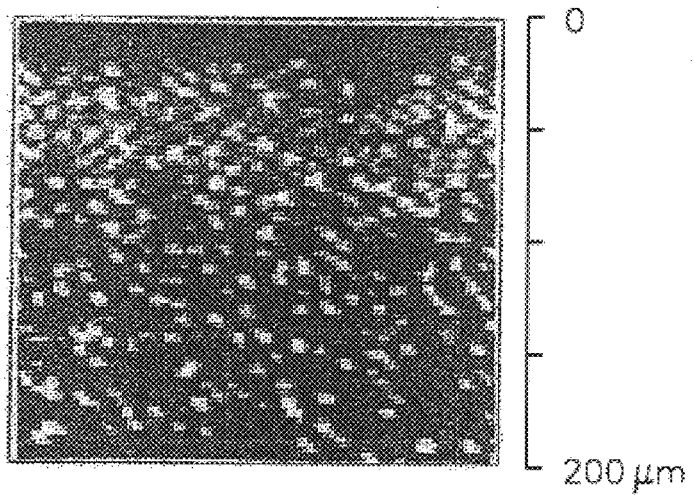
FIG. 18 is a photograph showing the depth of DZ formed near the surface of a wafer which has undergone a subsequent heat treatment after an RTA process according to embodiments of the invention in the Ar gas atmosphere.
Figure 19:
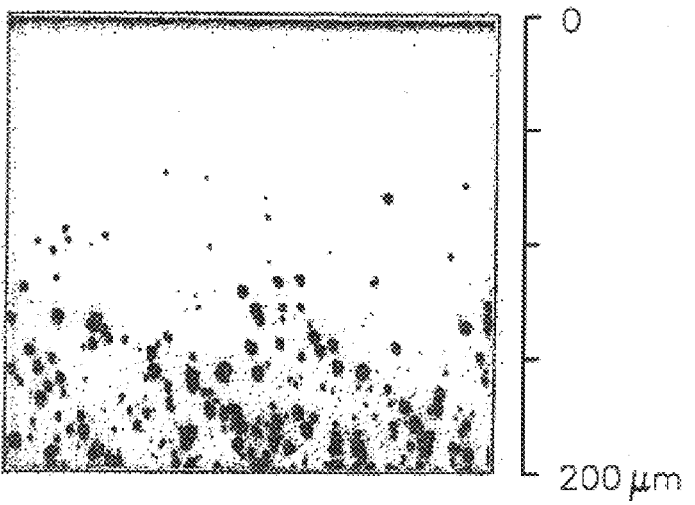
FIG. 19 is a photograph showing the depth of DZ formed near the surface of a wafer which has undergone a subsequent heat treatment after an RTA process according to embodiments of the invention in the $H_2$ gas atmosphere.
Figure 20:
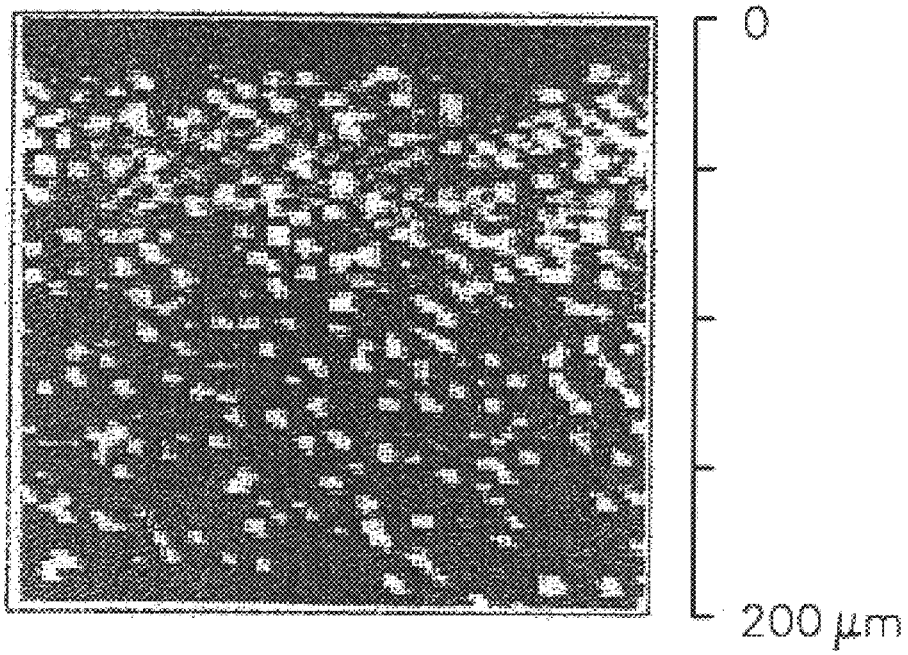
FIG. 20 is a photograph showing the depth of DZ formed near the surface of a wafer which has undergone a subsequent heat treatment after an RTA process according to embodiments of the invention in the $N_2$ gas and Ar gas atmosphere.
Figure 21:
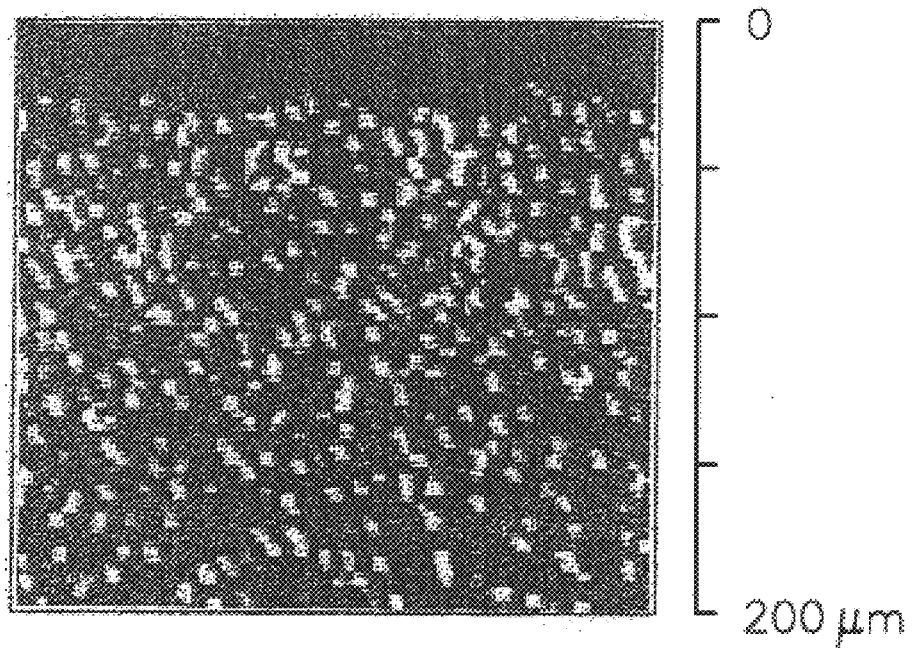
FIG. 21 is a photograph showing the depth of DZ formed near the surface of a wafer which has undergone a subsequent heat treatment after an RTA process according to embodiments of the invention in the $N_2$ gas and $H_2$ gas atmosphere.

FIGS. 17 through 21 are photographs showing the depth of DZ formed near the surface of the wafers, where no oxygen precipitates exist, which have undergone the subsequent heat treatment after the RTA, and have the oxygen precipitate concentration profiles of FIG. 10. In particular, FIG. 17 represents the case of using $N_2$ gas, FIG. 18 represents the case of using Ar gas, FIG. 19 represents the case of using $H_2$ gas, FIG. 20 represents the case of using $N_2$ and Ar gases, and FIG. 21 represents the case of using $N_2$ and $H_2$ gases. As can be noted from Table 5, the DZ is barely formed in the $N_2$ atmosphere.

Figure 22A:
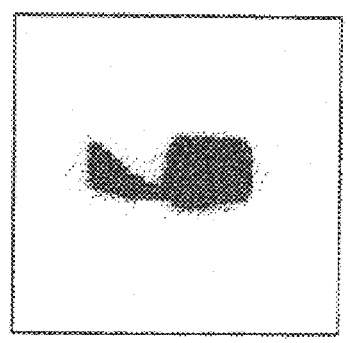
FIG. 22A is a photograph showing the shape of a COP in an as-grown state and FIG. 22B shows the shape of COP that has been changed after an RTA process according to embodiments of the invention in the $N_2$ gas atmosphere.
Figure 22B:
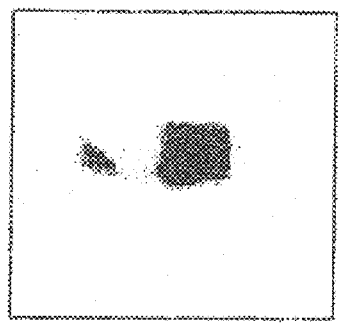
Figure 23A:
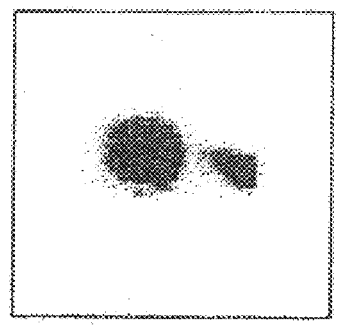
FIG. 23A is a photograph showing the shape of a COP in an as-grown state and FIG. 23B shows the shape of COP that has been changed after an RTA process according to embodiments of the invention in the $N_2$ gas and Ar gas atmosphere.
Figure 23B:
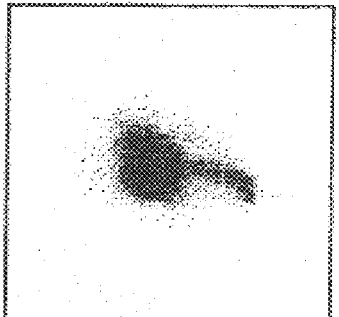
Figure 24A:
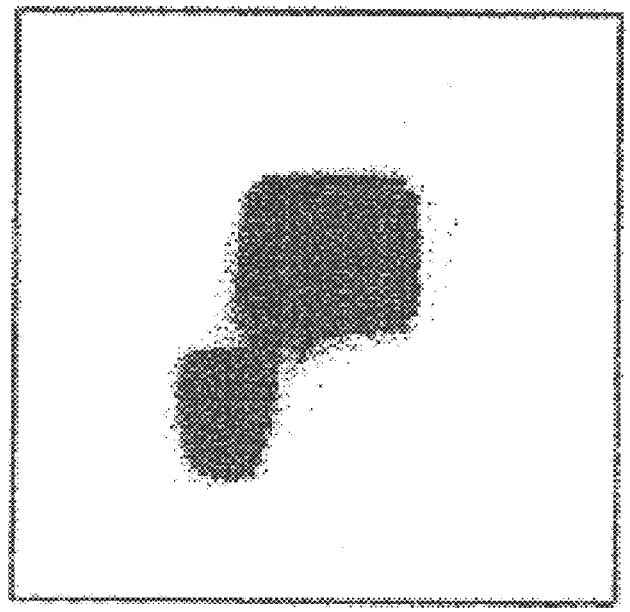
FIG. 24A is a photograph showing the shape of a COP in an as-grown state and FIG. 24B shows the shape of COP that has been changed after an RTA process according to embodiments of the invention in the $N_2$ gas and $H_2$ gas atmosphere.
Figure 24B:
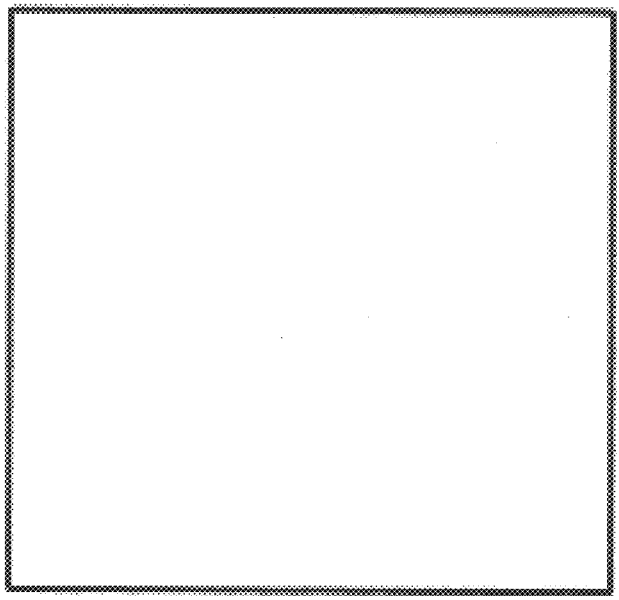

FIGS. 22A through 24B are photographs showing the shapes of as-grown COPs, and those of COPs that have been changed, after the RTA of FIG. 5. In particular, FIGS. 22A and 22B represent the cases where RTA is performed in the $N_2$ atmosphere, FIGS. 23A and 23B represent the cases where RTA is performed in the $N_2$ and Ar atmosphere, and FIGS. 24A and 24B represent the cases where the $N_2$ and $H_2$ atmosphere. As shown in Table 5, the COPs are not substantially dissolved in the $N_2$ atmosphere. Also, the dissolution of the COPs is smooth in a gas mixture atmosphere where the $N_2$ gas is mixed with Ar or $H_2$ gas, and in particularly, the COPs can be completely dissolved in the $H_2$ atmosphere. From this result, it can also be inferred that reducing the sizes of COPs in the as-grown state can assist in completely dissolving the COPs during the RTA process of FIG. 5.

Embodiments of the present invention can control the distribution of the oxygen precipitates formed via subsequent thermal process cycles, which are usually performed in semiconductor device fabrication, by performing the RTA process of FIG. 5 on a silicon wafer. Embodiments of overall wafer preparation during which the RTA process according to the present invention is carried out, and preparation of wafers which are effective in applying the RTA, now will be described.

Figure 25:
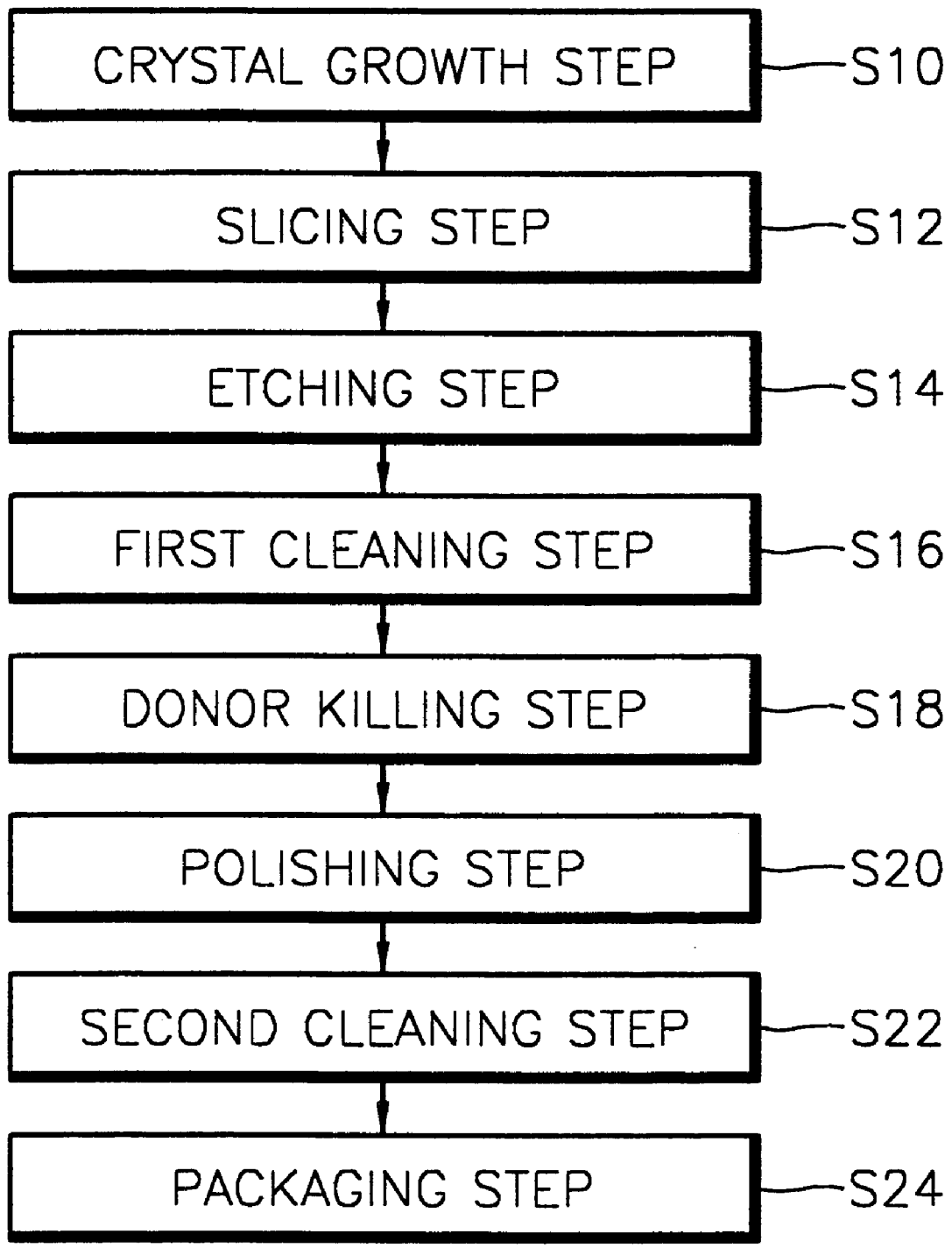
FIG. 25 is a flow diagram illustrating preparation of wafers according to embodiments of the present invention.

FIG. 25 is a flow diagram illustrating preparation of wafers according to a embodiments of the present invention, and particularly, illustrating a general wafering process after crystal growth (S10). An overview of the general wafering technique is provided in Chapter 1 of the textbook "Silicon Processing for the VLSI Era, Volume 1, Process Technology", by S. Wolf and R. N. Tauber, 1986, pp. 1–35, the disclosure of which is hereby incorporated herein by reference. Referring to FIG. 25, the general wafering process includes the crystal growth step (S10) of growing an ingot using a CZ puller, a slicing step (S12) of slicing the ingot into wafers, an etching step (S14) of rounding the edge of each slice or etching the surfaces of slices. Then, after a first cleaning step (S16) of cleaning the surfaces of slices, a donor killing step (S18) is carried out, and the top surfaces of the wafers, where semiconductor devices are formed, are polished (S20), and the polished wafers are cleaned in a second cleaning step (S22). Then, the resultant wafers are packaged (S24).

RTA of FIG. 5 according to embodiments of the present invention is performed in the donor killing step (S18). RTA according to other embodiments of the present invention can be carried out in a separate step. However, it may be preferable to perform the RTA in the donor killing step (S18) in view of costs. In general, donor killing refers to a process of converting oxygen component contained in the silicon ingot, which are present in the form of ions during subsequent semiconductor device fabrication and act as a donor of electrons to implanted impurity ions, into oxygen precipitates via heat treatment during the wafering process in order to reduce the possibility of functioning as donor. This heat treatment is carried out at about 700° C. for about 30 seconds or more in an RTA furnace.

Figure 27:
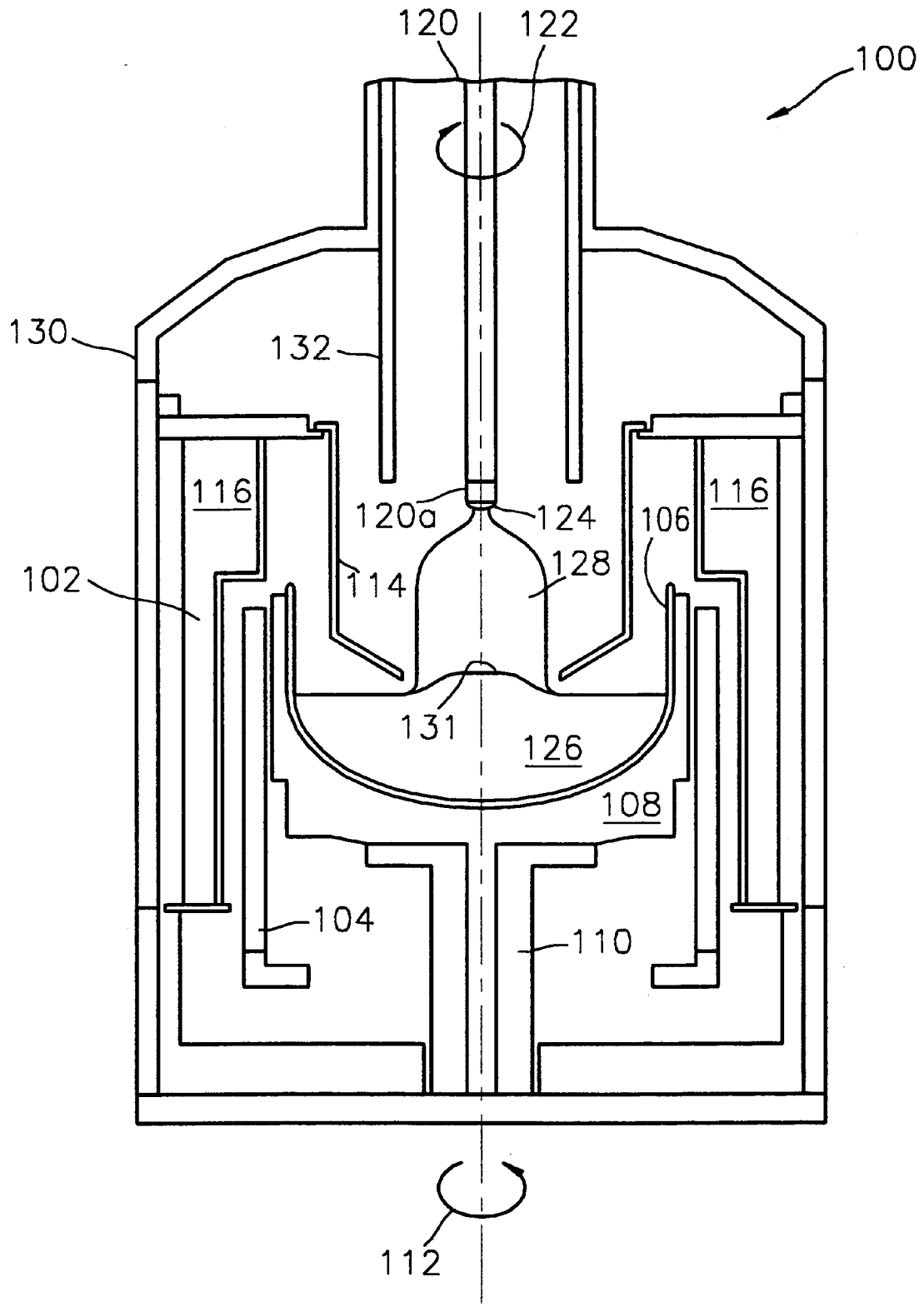
FIG. 27 is a schematic view illustrating a conventional Czochralski (CZ) puller.

FIG. 27 is a schematic view of a conventional CZ puller, in which the crystal growth (S10) is performed. As shown in FIG. 27, the CZ puller 100 includes a furnace, a crystal pulling mechanism, an environment controller and a computer-based control system. The CZ furnace is generally referred to as a hot zone furnace. The hot zone furnace includes a heater 104, a crucible 106 which may be made of quartz, a susceptor 108 which may be made of graphite and a rotation shaft 110 that rotates about an axis in a first direction 112 as shown.

A cooling jacket or port 132 is cooled by external cooling means such as water cooling. A heat shield 114 may provide additional thermal distribution. A heat pack 102 is filled with a heat absorbing material 116 to provide additional thermal distribution.

The crystal pulling mechanism includes a crystal pulling shaft 120 which may rotate about the axis in a second direction 122, opposite to the first direction 112, as shown. The crystal pulling shaft 120 includes a seed holder 120a at the end thereof. The seed holder 120a holds a seed crystal 124, which is pulled from a molten silicon 126 in the crucible 106 to form an ingot 128.

The environment control system may include a chamber enclosure 130, the cooling jacket 132, and other flow controllers and vacuum exhaust systems that are not shown. The computer-based control system may be used to control the heating elements, the puller and other electrical and mechanical elements.

In order to grow a monocrystalline silicon ingot, the seed crystal 124 is contacted to the molten silicon 126 and is gradually pulled in the axial direction (upwards). Cooling and solidification of the molten silicon 126 into monocrystalline silicon occurs at the interface 131 between the ingot 128 and the molten silicon 126. As shown in FIG. 27, the interface 131 is concave relative to the molten silicon 126.

A controlled oxygen precipitate concentration profile as shown in FIG. 4 can be obtained from at least three types of silicon wafers, through embodiments of RTA according to the present invention. Specifically, RTA according to embodiments of the present invention can be applied to a "perfect" wafer in which no defects such as interstitial agglomerates and vacancy agglomerates exist; a "semi-perfect" wafer in which vacancy agglomerates are present in only a vacancy-rich region within a predetermined radius from the center of the wafer, and no vacancy agglomerates and interstitial agglomerates are present outside the vacancy-rich region; and a wafer which contains only vacancy agglomerates through the wafer, without interstitial agglomerates. However, the present invention is not limited to the above wafers, and includes all types of wafers to which the principle of the present invention can be applied.

As described above, embodiments of the present invention are directed to the controlled oxygen precipitate concentration profile as shown in FIG. 4, which can be achieved by performing an RTA process of FIG. 5 and the subsequent heat treatment of a silicon wafer to which the present invention can be applied. Also, as for the COPs, embodiments of the present invention provide a wafer in which COPs are present in only the bulk region of the wafer and not present in the DZs.

In order to prevent the defects of silicon wafers, many practical investigations have focused on a crystal growth process for a high-purity ingot. For example, it is widely known that the pull rate of the seed crystal and the temperature gradients in the hot zone structure should be controlled. The control of the pull rate (V) of the ingot and the temperature gradients (G) of the ingot-molten silicon interface are described in detail in "The Mechanism of Swirl Defects Formation in Silicon" by Voronkov, Journal of Crystal Growth, Vol. 59, 1982, pp. 625–643. Also, an application of Voronkov's Theory may be found in a publication by the present inventor et al. entitled "Effect of Crystal Defects on Device Characteristics", Proceedings of the Second International Symposium on Advanced Science and Technology of Silicon Material, November 25–29, 1996, p. 519. This publication discloses that when the ratio of V to G (referred to as V/G ratio) is below a critical ratio $(V/G)^*$, an interstitial-rich region is formed, while when V/G ratios is above the critical ratio $(V/G)^*$, a vacancy-rich region is formed.

Figure 26:
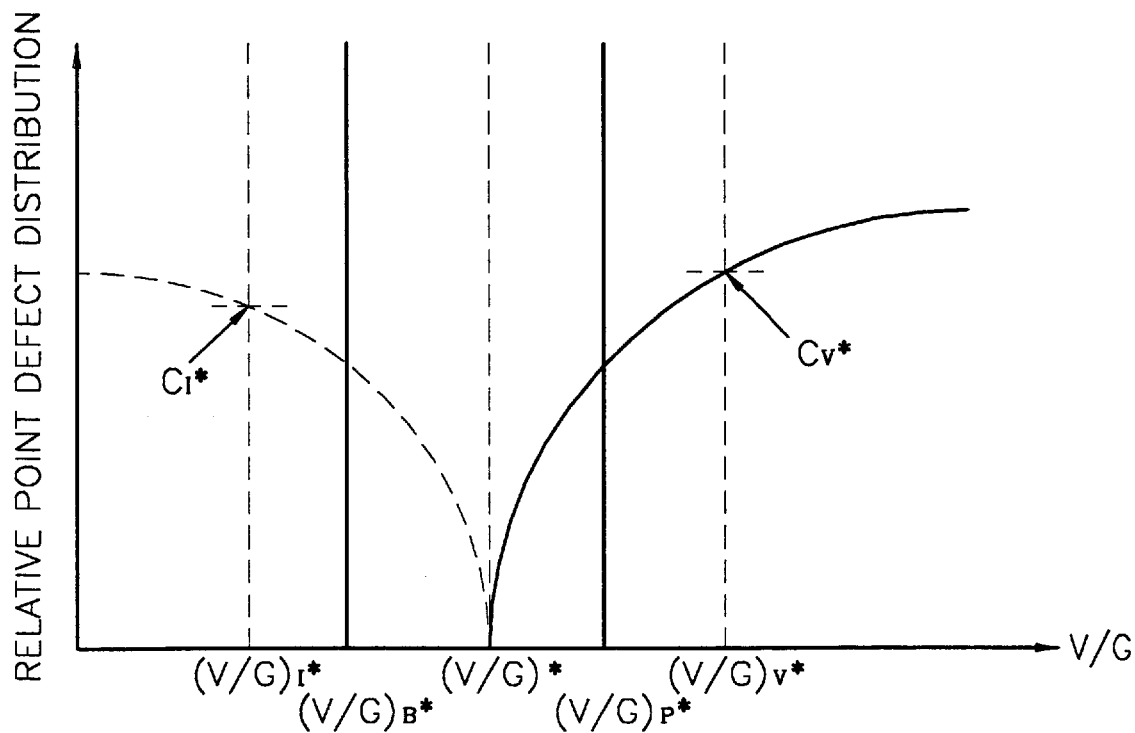
FIG. 26 is a conceptual diagram illustrating a relationship between a relative point defect distribution in a silicon ingot, and the V/G ratio (the pull rate of the ingot/the temperature gradient).

In particular, FIG. 26 is a conceptual view illustrating the relationship between a relative point defect distribution in a silicon ingot and the V/G ratio. As shown in FIG. 26, during ingot growth, for a V/G ratio above a critical V/G ratio $(V/G)^*$, a vacancy-rich region is formed. Also, for a V/G ratio where the vacancy concentration is above a critical vacancy concentration $C_v^*$, vacancy agglomerates are formed, while for a V/G ratio where the interstitial concentration is above a critical interstitial concentration $C_I^*$, interstitial agglomerates are formed. Also, in FIG. 26, the width from $(V/G)_I^*$ to $(V/G)_B^*$ represents a B-band, which is interstitial related defects (small sized dislocations), and the width from $(V/G)_v^*$ to $(V/G)_P^*$ represents a P-band which is an O.S.F. ring (large size oxygen precipitates).

Embodiments of the present invention can be applied to a perfect wafer without defects, which has a V/G ratio between the B-band and P-band during the ingot growth, a semi-perfect wafer which has a V/G ratio including the P-band, and a wafer where vacancy agglomerates are formed through the wafer due to the V/G ratio above the critical V/G ratio $(V/G)_v^*$ corresponding to the critical vacancy concentration $C_v^*$.

Perfect wafers and semi-perfect wafers, which are applicable to the present invention, are described in detail in U.S.

application Ser. No. 08/989,591 and continuation-in-parts thereof, U.S. application Ser. Nos. 09/320,210 and 09/320,102, that were incorporated herein by reference. Thus, a detailed description thereof will be omitted.

Figure 28:
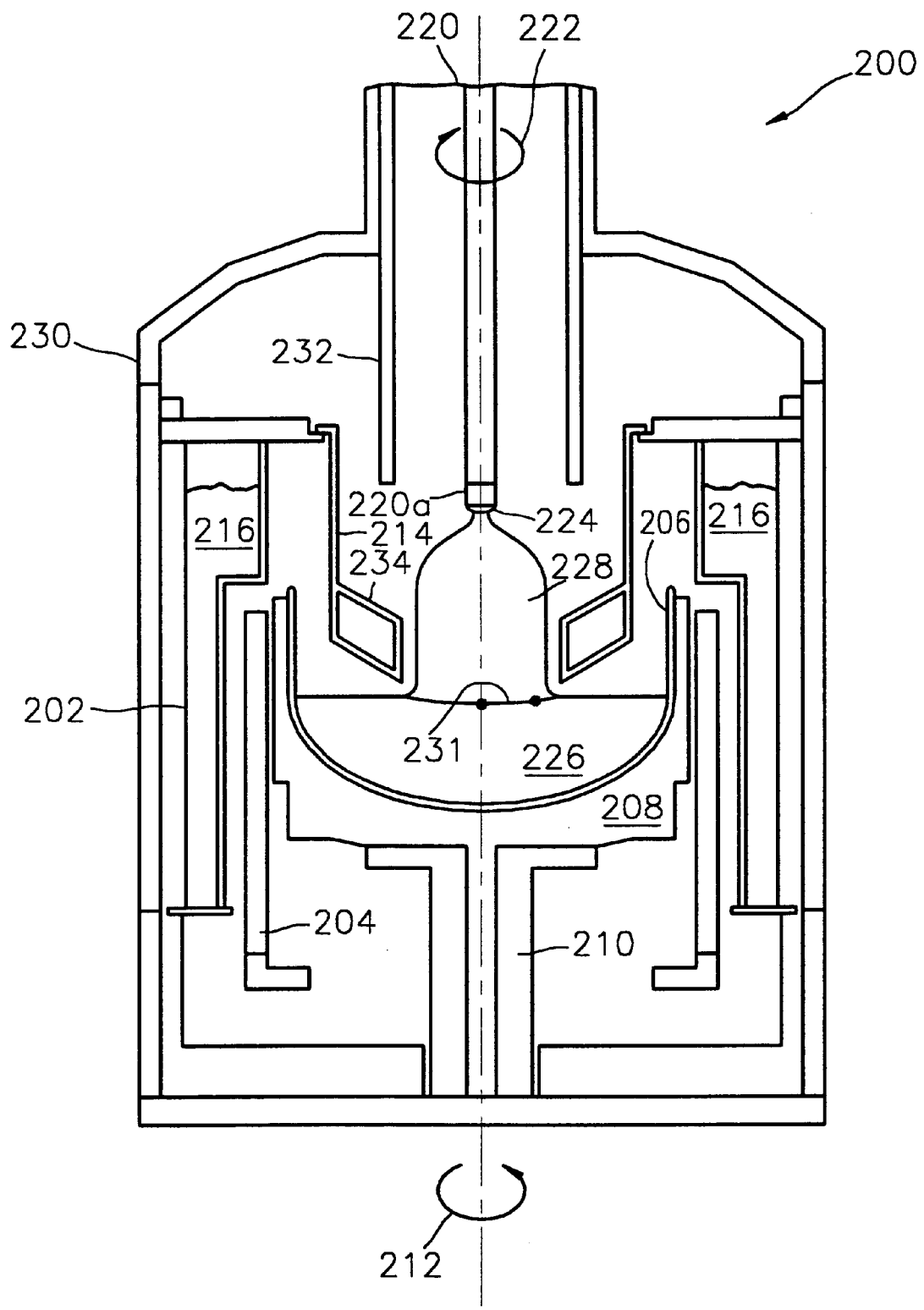
FIG. 28 is a schematic view of another conventional CZ puller according to application Ser. Nos. 09/989,591 and 09/320,210.

FIG. 28 is a schematic view of a modified CZ puller disclosed in the continuation-in-part applications, in which a heat shield 214 is modified compared to the CZ puller shown in FIG. 27. Briefly, as shown in FIG. 28, the modified CZ puller 200 includes a furnace, a crystal pulling mechanism, an environment controller and a computer-based control system. The hot zone furnace includes a heater 204, a crucible 206, a succeptor 208 and a rotation shaft 210 that rotates about an axis in a first direction 212 as shown. A cooling jacket 232 and a heat shield 214 may provide additional thermal distribution, and a heat pack 202 contains a heat absorbing material 216 to provide additional thermal distribution.

The crystal pulling mechanism includes a crystal pulling shaft 220 which may rotate about the axis in a second direction 222, opposite to the first direction 212, as shown. The crystal pulling shaft 220 includes a seed holder 220a at the end thereof. The seed holder 220a holds a seed crystal 224 which is pulled from molten silicon in the crucible 206 to form an ingot 228.

The environment control system may include a chamber enclosure 230, the cooling jacket 232 and other flow controllers and vacuum exhaust systems that are not shown. The computer-based control system may be used to control the heating elements, the puller and other electrical and mechanical elements.

In order to grow a monocrystalline silicon ingot, the seed crystal 224 is contacted to the molten silicon 226 and is gradually pulled in the axial direction (upwards). Cooling and solidification of the molten silicon 226 into monocrystalline silicon occurs at the interface 231 between the ingot 228 and the molten silicon 226. In contrast to the CZ puller of FIG. 27, the CZ puller 200 of FIG. 28 further includes a heat shield housing 234 in the heat shield 214, which permits more accurate control of the V/G ratio.

Figure 29:
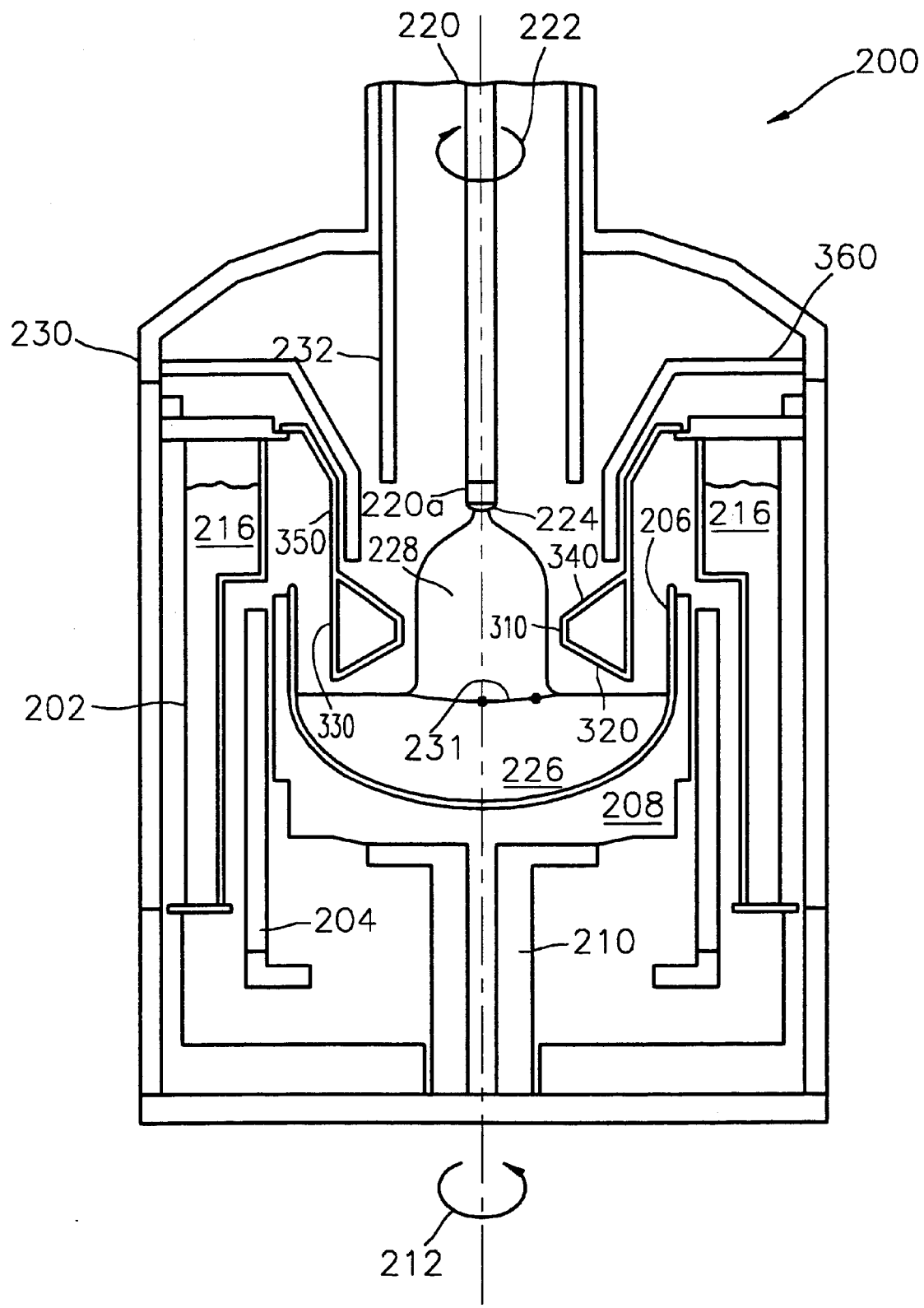
FIG. 29 is a schematic view illustrating CZ pullers according to embodiments of the present invention.
Figure 30:
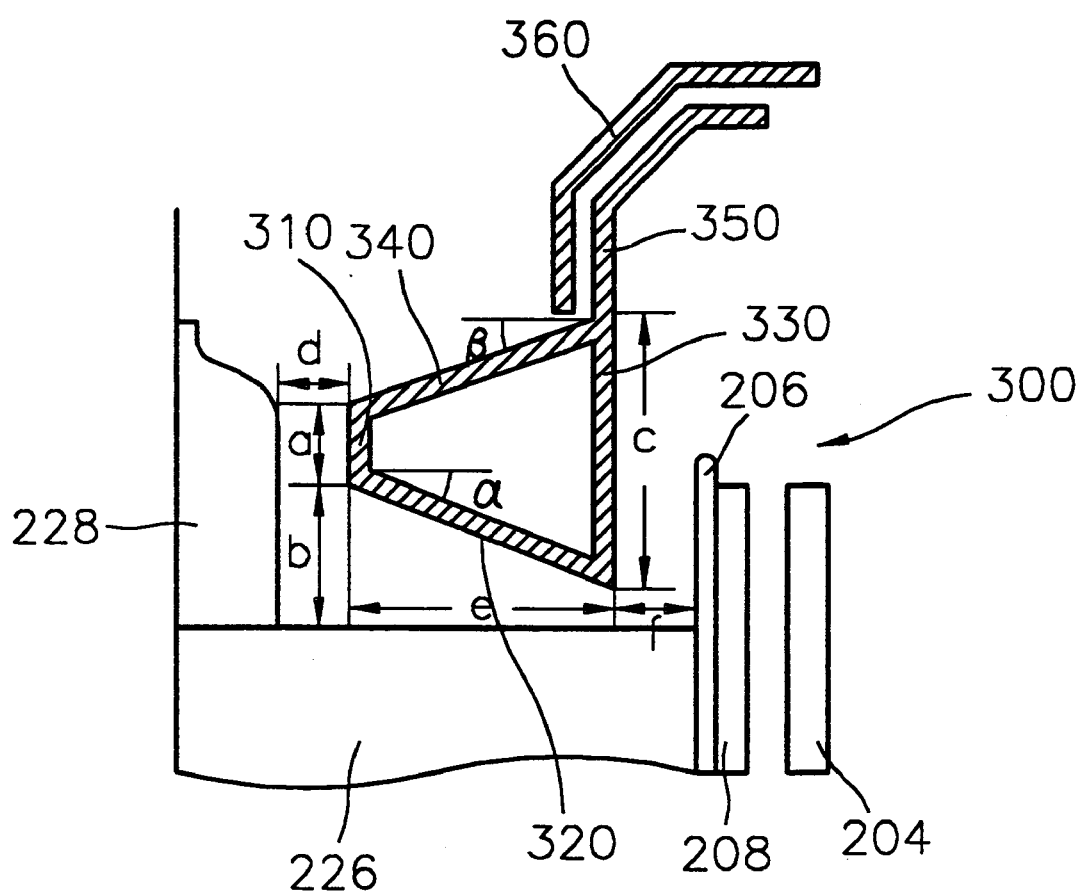
FIG. 30 is a diagram showing major parts of CZ pullers of FIG. 29.

FIG. 29 is a schematic view of a modified CZ puller according to embodiments of the present invention, and FIG. 30 illustrates details of modified parts of the CZ puller of FIG. 29. In FIGS. 29 and 30, like reference numerals used in FIG. 28 are used to refer to like elements, and only the differences from the CZ puller of FIG. 28 will be described. As shown in FIGS. 29 and 30, the changes from the CZ puller of FIG. 28 include the shape of a heat shield housing 300 and additional installation of a heat shield plate 360. The heat shielding housing 300, which has a 90° rotated trapezoid shape, like a ring, includes an inner heat shield housing wall 310 and an outer heat shield housing wall 330, which preferably are vertical, and a heat shield housing top 340 and a heat shield housing bottom 320 which connect the inner and outer heat shield housing walls 310 and 330. Here, the heat shield housing top 340 slopes upwards at an angle of β from the horizontal from the inner heat shield housing wall 310 to the outer heat shield housing wall 330, while the heat shield housing bottom 320 slopes downwards at an angle of α from the horizontal from the inner heat shield housing wall 310 to the outer heat shield housing wall 330, forming the trapezoid shape as shown.

The ring-shaped heat shield housing 300 may be filled with a heat absorbing material (not shown), and may be formed of carbon ferrite.

Also, the heat shield housing 300 is fixed to the top of the heat pack 202 by a support member 350. The heat shield plate 360 is disposed between the heat shield housing top 340 of the heat shield housing 300 and the cooling jacket 232, around the ingot being pulled.

The configuration of the CZ puller shown in FIGS. 29 and 30 can allow the cooling rate of the ingot to increase. The size of voids, which are present in the pulled ingot, is generally proportional to the square root of the initial vacancy concentration at the ingot-molten silicon interface, but inversely proportional to the square root of the cooling rate of the ingot. As described with reference to FIG. 11, as long as the size of voids present in the ingot, which are formed during the crystal growth, is smaller than a predetermined size, although the pulled ingot contains voids, the voids can be dissolved from the DZ through the RTA process according to embodiments of the present invention.

Thus, in order to reduce the size of voids in the ingot, which is desirable according to embodiments of the present invention, the cooling rate of the ingot may be increased. As the cooling rate of the ingot increases, a temperature gradient Gc at the center of the ingot may increase. Therefore, if the V/G ratio is constant for a predetermined defect distribution, the pulling rate of the ingot (V) should be increased.

According to embodiments of the present invention, in order to increase the cooling rate of the ingot to at least 1.4° K/min or more based on the temperature of the ingot at the center thereof, to cool the ingot from the temperature at the ingot-molten silicon interface to a predetermined temperature of the ingot, at least one of the length a of the inner heat shield housing wall 310, the length c of the outer heat shield housing wall 330, the angle β of the heat shield housing top 340, the angle α of the heat shield housing bottom 320, the distance d between the ingot 228 and the inner heat shield housing wall 310, the distance f between the crucible 206 and the outer heat shield housing wall 330, the distance e between the inner and outer heat shield housing walls 310 and 330, the distance b between the inner heat shield housing wall 310 and the molten silicon 226, and the position of the heat shield plate 360 can be varied.

In the CZ puller of FIG. 29, due to the high cooling rate of the pulled ingot, the pulling rate of the ingot can be increased, for example, in the range of 0.50 to 1.00 mm/min, so that the productivity of the ingot can increase. In addition, a processing margin for perfect wafers or semi-perfect wafers, which are manufactured by the CZ puller of FIG. 28, can be provided for the growth of the ingot.

Embodiments of the invention that were described above, can produce silicon wafers that are well suited for fabrication of high density and/or high performance integrated circuits therein. However, it has been found that in a mass production environment, silicon wafers that are produced according to embodiments that were described above, may have undesirably high levels of slip in the device regions thereof. The slip in the device regions may be caused by self-weight-induced stress of the wafer on its support pins and/or support ring during rapid thermal annealing or by STI-densification-induced stress. These slips may impact the reliability and/or yield of integrated circuit devices that are manufactured from the wafers.

Moreover, it also has been found that silicon wafers that are fabricated as was described above, may cause undesirable silicon dioxide sublimation on the RTA chamber. More particularly, native oxide or other silicon dioxide ($SiO_2$) from the wafer may evaporate during the RTA process, and deposit on the quartz RTA chamber. The $SiO_2$ sublimation on the RTA chamber can reduce the efficiency, reliability and/or repeatability of the RTA process, and may necessitate frequent cleaning and/or replacement of the RTA chamber.

Embodiments of the invention may arise from a realization that the RTA process that is used to produce the oxygen precipitate concentration profile including first and second peaks, a denuded zone and a concave region between the first and second peaks, can be performed in an atmosphere of a gas mixture comprising ammonia ($NH_3$) and argon (Ar), rather than a gas mixture of nitrogen ($N_2$) and argon (Ar), as was described above. By using ammonia as a vacancy injection gas rather than hydrogen, the RTA process may take place at a lower temperature, such as between about 1100° C. and about 1200° C., or between about 1100° C. and about 1150° C. or between about 1100° C. and about 1120° C., or at about 1120° C., in contrast with higher temperatures such as 1220° C., which were heretofore used with the nitrogen and argon atmosphere. By allowing lower temperature RTA processes to be used, the amount of slip and/or the amount of silicon dioxide sublimation can be reduced dramatically. Accordingly, the yield and reliability of integrated circuits that are produced from the wafers can be increased and/or the mass production cost of producing the wafers can be decreased.

More particularly, according to embodiments of the invention, silicon wafers having an oxygen precipitation concentration profile that includes first and second peaks, a denuded zone between the top surface of the wafer and the first peak, and between the bottom surface of the wafer and the second peak, and a concave region between the first and second peaks, may be produced as was described above. However, according to embodiments of the invention, the denuded zone between the bottom surface of the wafer and the second peak may include therein at least one region of slip, whereas the denuded zone between the top surface of the wafer and the first peak is free of slip dislocation therein. More particularly, a slip-free region having a thickness of between about 5 $\mu$m and about 40 $\mu$m from the top surface of the wafer can be produced, so that devices may be formed therein with increased yield, performance and/or reliability. Moreover, a plurality of Shallow Trench Isolation (STI) regions may be formed in the denuded zone between the top surface of the wafer and the first peak, and having STI slip that is reduced compared to the same STI regions in the silicon wafer in which oxygen precipitates are present far away from the STI region. Preferably, the STI regions are free of STI slip.

Moreover, embodiments of the invention allow the RTA to take place at between about 1100° C. and about 1200° C., or between about 1100° C. and about 1150° C. or between about 1100° C. and about 1120° C. or at about 1120° C., to generate the nucleation center concentration profile that was described above. However, because lower temperatures may be used, slip may be reduced as described above, and silicon dioxide sublimation may be reduced or eliminated.

In particular, embodiments of the invention perform an RTA process on the silicon wafer having a top surface and a bottom surface, in an atmosphere comprising argon and ammonia for at least about five seconds, and between about 1100° C. and about 1200° C. or between about 1100° C. and about 1150° C. or between about 1100° C. and 1120° C. or at about 1120° C. In some embodiments, prior to performing the RTA, oxygen is purged from the argon atmosphere, to reduce or prevent interaction between the oxygen and the ammonia. A sensor may be used to sense that less than a predetermined concentration of oxygen is present in the atmosphere. Alternatively, the temperature may be maintained at a predetermined temperature, for example at about 800° C. for a predetermined time, for example ten seconds, to allow the oxygen to be purged. After the RTA is performed, ammonia also may be purged from the atmosphere.

RTA processes according to embodiments of the present invention may be performed sequentially on a series of silicon wafers in an RTA chamber below a temperature that causes sublimation of silicon dioxide from the series of silicon wafers onto the RTA chamber. Temperatures below about 1200° C. or below about 1150° C. or at or below about 1120° C. may be used. Accordingly, the need to clean and/or replace the chamber can be reduced and may be eliminated. In one particular example, when performing RTA using hydrogen and ammonia at temperatures above about 1200° C., it has been found that the RTA chamber may need to be cleaned and/or replaced after every six months. In sharp contrast, embodiments of the present invention that perform RTA at lower temperatures such as temperatures less than 1150° C. using ammonia and argon, may need not clean or replace the RTA chamber for up to six months or more.

Figure 37:
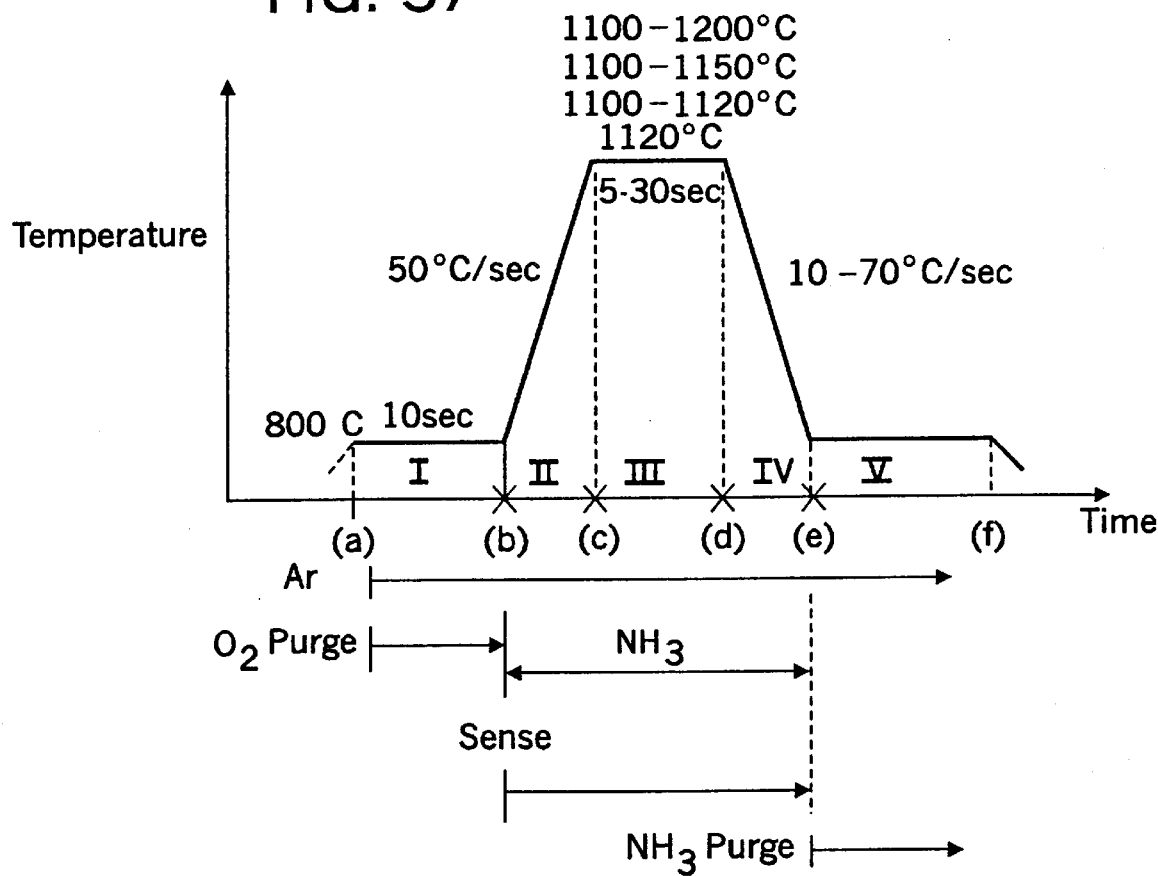
FIG. 37 graphically illustrates a time-temperature profile for rapid thermal annealing according to embodiments of the present invention.

FIG. 37 graphically illustrates a time/temperature profile for RTA according to embodiments of the present invention. It will be understood that RTA processes as illustrated in FIG. 37 can produce the same M-shaped profile for a wafer that is illustrated in FIG. 4, but can allow reduced slip stress and/or reduced silicon dioxide sublimation. Moreover, embodiments of the invention as described in FIG. 37 may be contrasted with embodiments of RTA processes that were described above in connection with FIG. 5.

Referring now to FIG. 37, prior to time (a), a wafer is loaded into an RTA chamber or furnace, such as a conventional quartz RTA furnace, the temperature of which is set at, for example, about 800° C., for a standby period I, such as about ten seconds. During this time, an argon flow is present within the RTA chamber. Moreover, during this time period I, between times (a) and (b), an oxygen purge may take place to purge oxygen that may out-diffuse from the wafer and/or is otherwise present in the RTA atmosphere. The oxygen purge may take place by maintaining the RTA temperature at the standby temperature for a predetermined time period I, such as ten seconds, and/or by providing a sensor in the RTA chamber than can sense that an oxygen concentration within the chamber has decreased below a predetermined amount, such as less than 1 ppma.

Continuing with the description of FIG. 37, at the end of the oxygen purge period I, the temperature in the RTA furnace is rapidly increased, for example at a rate of about 50° C. per second, during a time interval II. Simultaneous with the ramp-up, ammonia ($NH_3$) is flowed through the chamber. It will be understood that the start of ammonia flow may occur prior to the beginning of the ramp-up, prior to time (b), at any stage during the ramp-up between times (b) and (c), or once the RTA temperature has been attained after time (c). As shown in FIG. 37, $NH_3$ flow may coincide with the beginning of ramp-up at time (b).

Still continuing with the description of FIG. 37, the RTA is maintained during time interval III between time points (c) and (d), for between about five seconds and about thirty seconds. As shown in FIG. 37, the RTA during time interval III preferably is between about 1100° C. and about 1200° C., or between 1100° C. and 1150° C. In other embodiments, the RTA is maintained between about 1100° C. and about 1120° C. In yet other embodiments, RTA is performed at about 1120° C. These RTA processes may be contrasted with FIG. 5 above, which performs RTA processing at about 1250° C., and with other conventional RTA processes, such as are described in U.S. Pat. Nos. 6,204,152 and 5,994,761 described above.

Still referring to FIG. 37, at time interval IV, the temperature in the RTA furnace is sharply decreased (ramped down), for example at a rate of between about 10° C./sec and about 70° C./sec, and preferably at a rate about 33° C./sec, to the temperature of the standby period V. Preferably, the flow of ammonia is maintained until the end of the ramp-down period IV, at time (e). However, ammonia flow may be terminated during the ramp-down period IV or during the RTA period III. During the standby period V, an ammonia purge preferably takes place, for example beginning at time (e). However, the ammonia purge may take place earlier or not at all. Preferably, once the ammonia has been purged, the wafer can be unloaded from the RTA furnace at time (f).

It has been found, according to embodiments of the present invention, that RTA profiles of FIG. 37 may be used to produce the same desirable M-shaped oxygen precipitate concentration curve of FIG. 4, while allowing slip and/or oxygen sublimation to be reduced significantly and/or eliminated.

The processing temperature ranges of FIG. 37 are merely illustrative. Moreover, in RTA according to embodiments of the present invention, the flow rates of the ambient gases, the mixing ratio of the ambient gases, the ramp-up rate, the annealing temperature, annealing time and/or ramp-down rate may contribute to attaining a profile according to FIG. 4, as will be described below.

Figure 38:
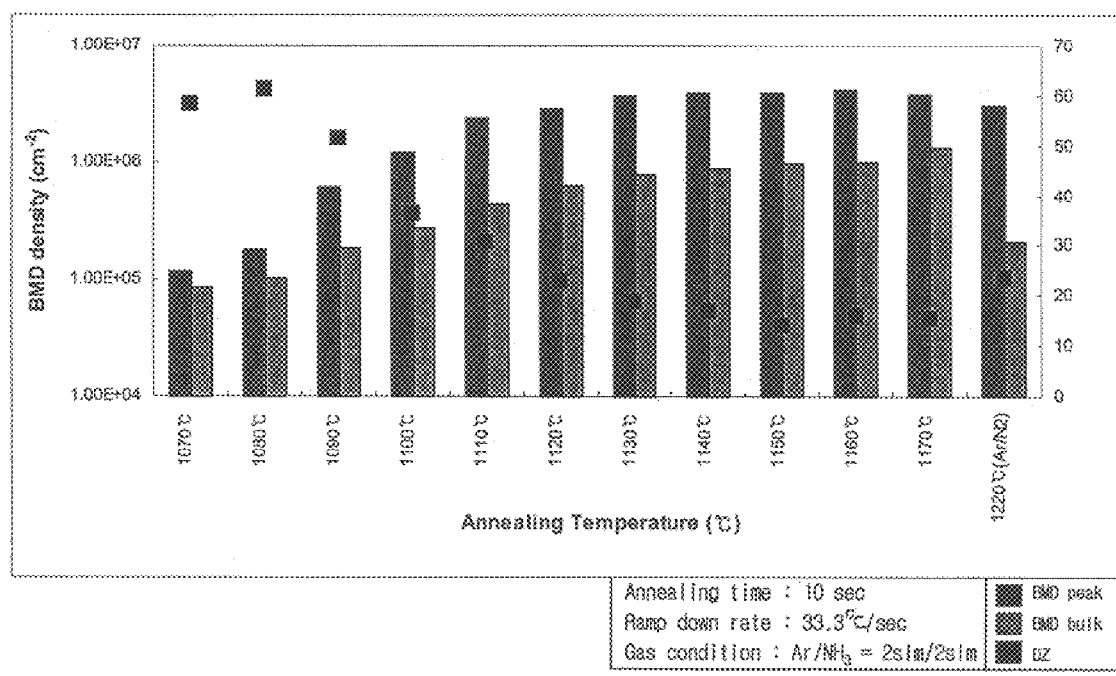
FIG. 38 graphically illustrates temperature dependence of oxygen precipitation for rapid thermal annealing of FIG. 37 according to embodiments of the present invention.

FIG. 38 graphically illustrates temperature dependence of oxygen precipitation for a rapid thermal annealing process of FIG. 37, according to embodiments of the present invention, for various rapid annealing temperatures (interval III of FIG. 37). In all instances, an annealing time for interval III of ten seconds was used, with a ramp-down rate in interval IV of 33.3° C. per second, and an equal flow of argon and ammonia. FIG. 38 graphically shows Bulk Micro-Defect (BMD) densities (i.e. vacancy defects and interstitial defects) for the first and second peaks that are illustrated in FIG. 4 (peak BMD), and for the lowest portion in the concave bulk region between the first and second peaks (bulk BMD). The squares that are associated with each BMD measurement indicates the depth of the denuded zone of FIG. 4. BMD defects are indicated in density ($cm^{-2}$), and may be translated in volume ($cm^{-3}$) by multiplying by $10^4$.

Referring to FIG. 38, it can be seen that the rightmost pair of bars shows a DZ having a depth of about 23 μm, a peak BMD of about $1.4 \times 10^6$ and a bulk BMD of about $1.2 \times 10^5$ in an atmosphere of argon and nitrogen at a temperature of 1220° C. As shown in FIG. 38, similar characteristics may be obtained in an atmosphere of argon and ammonia, at about 1120° C. Accordingly, a similar BMD profile may be obtained at 1120° C., which is 100° C. lower than the temperature that is used with the argon and nitrogen atmosphere. FIG. 38 also illustrates that the depth of the DZ, the bulk BMD and the peak BMD may be controlled as a function of temperature. The range between about 100° C. and about 1150° C. can control the depth of the DZ, while maintaining the bulk BMD and peak BMD relatively constant. For example, between about 1120° C. and about 1170° C., the depth of the DZ, the peak BMD and the bulk BMD appear to the relatively unaffected by temperature, whereas between about 1100° C. and about 1120° C., the depth of the DZ decreases with increasing temperature and the BMD peak concentration and BMD bulk concentration increase with increasing temperature.

Figure 39:
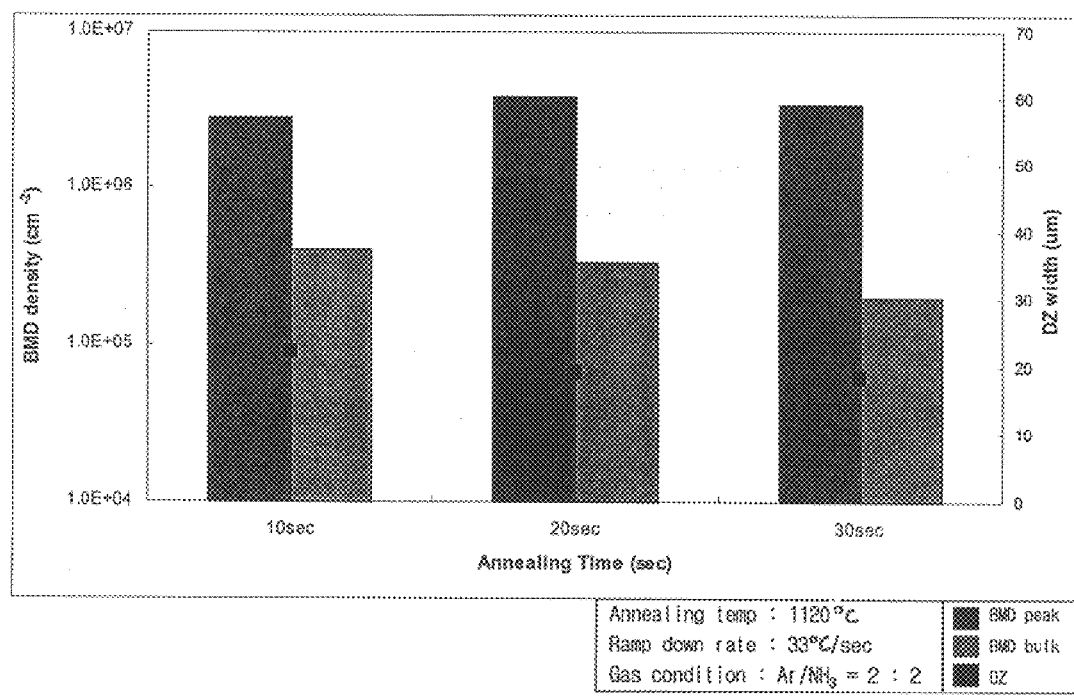
FIG. 39 graphically illustrates annealing time dependence of oxygen precipitation according to embodiments of the present invention.

FIG. 39 graphically illustrates annealing time dependence of oxygen precipitation according to embodiments of the present invention. As shown in FIG. 39, at an annealing temperature of 1120° C. using equal flows of argon and ammonia, neither the BMD peak, BMD bulk or DZ depth appear to be strongly dependent upon annealing time between ten seconds to thirty seconds. Accordingly, to increase throughput, annealing times of ten seconds may be preferred.

Figure 40:
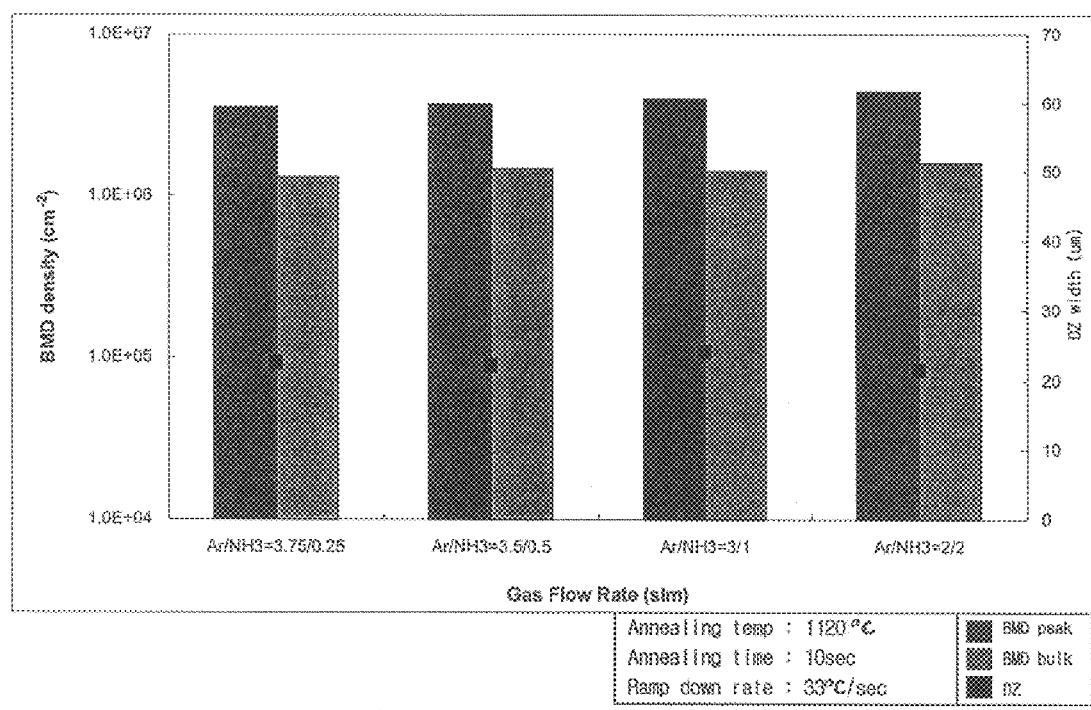
FIG. 40 graphically illustrates dependence of oxygen precipitation on a ratio of argon-to-ammonia flows during rapid thermal annealing according to embodiments of the present invention.

FIG. 40 graphically illustrates dependence of oxygen precipitation on the ratio of argon to ammonia flows, according to embodiments of the present invention. As shown, the DZ depth, peak BMD and bulk BMD do not appear to be highly dependent on the ratio of argon to ammonia over a wide range of ratios.

Figure 41:
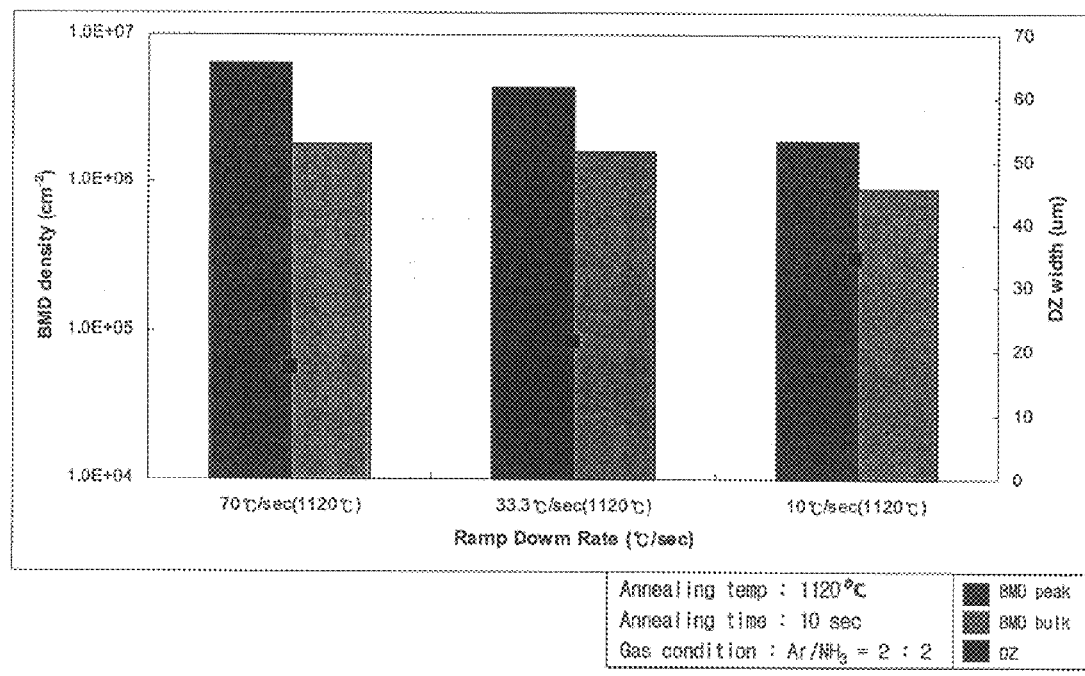
FIG. 41 graphically illustrates dependence of oxygen precipitation on ramp-down rate according to embodiments of the present invention.

FIG. 41 graphically illustrates dependence of oxygen precipitation on the ramp-down rate in interval IV of FIG. 37. As shown, there appears to be little dependency of DZ depth, peak BMD or bulk BMD on ramp-down rate over a wide range of rates from about 10° C. to about 70° C. per second. Accordingly, 33.3° C./sec may be used, for reasons that will be described in detail below.

Figure 42:
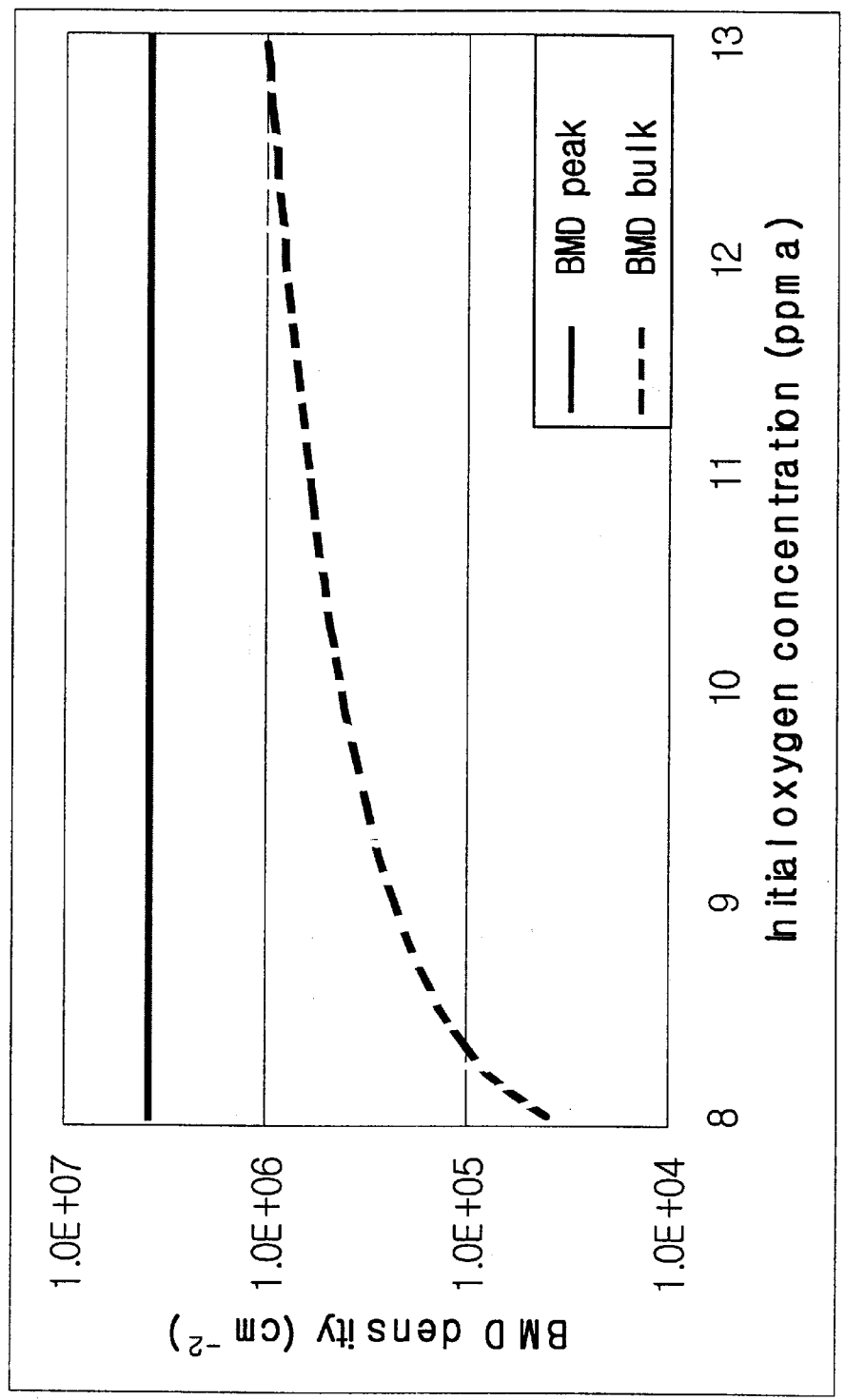
FIG. 42 graphically illustrates peak bulk micro-defect (BMD) density as a function of initial oxygen concentration according to embodiments of the present invention.

FIG. 42 graphically illustrates peak BMD and bulk BMD as a function of the initial oxygen concentration in the as-grown silicon ingot and wafers, according to embodiments of the present invention. The top (solid) line indicates peak BMD density, and the lower (dashed) line indicates bulk BMD density. As shown, although the peak BMD appears to be relatively independent of the initial oxygen concentration during crystal growth, the bulk BMD appears to be heavily dependent on initial oxygen concentration. Accordingly, the initial oxygen concentration can be used to control the ratio of the peak-to-bulk BMD, from as little as about 5 at an initial oxygen concentration of about 13 ppma to about 10 at about 9 ppma. In particular, the initial oxygen concentration may be selected, for example, to be about 9 ppma, so as to provide at least one order of magnitude (about ten times) difference between the peak BMD and the bulk BMD.

To summarize, FIGS. 38–42 indicate that, using an atmosphere comprising ammonia and argon, an M-shaped oxygen precipitate concentration profile of FIG. 4 can be obtained at temperatures of less than 1200° C., less than 1150° C., between 1100° C. and 1120° C., and/or at about 1120° C., that is comparable to the oxygen precipitate concentration profile that may be obtained in argon and nitrogen at temperatures that are greater than about 1200° C., such as at 1220° C. It now will be shown how slip generation and $SiO_2$ sublimation may be reduced and preferably may be eliminated by using embodiments of the present invention, including the temperature ranges that were described above.

Prior to describing reduction in slip generation, according to embodiments of the invention, a discussion of origins of slip will be provided. As is well known to those having skill in the art, during RTA, a wafer may be supported in an RTA furnace using three support pins, or an edge ring. By only partially supporting the wafer at the support pins or at the edge, the self-weight of the wafer can induce stress in the wafer, which itself can cause slip. The slip generally originates at the bottom surface of the wafer that is supported by the pins or the ring, and extends up to the top surface of the wafer, where devices are formed. In order to reduce and preferably eliminate the impact of slip on active devices, it may be desirable to provide a slip-free region in the DZ between the first peak and the first (top) surface. Stated differently, it may be desirable to provide a slip-free region to a depth of about 40 μm from the top surface of the wafer. Thus, slip from the bottom surface will not enter the device region. Unfortunately, it may be difficult to provide a 40 μm slip-free region using conventional RTA processes.

Figure 43:
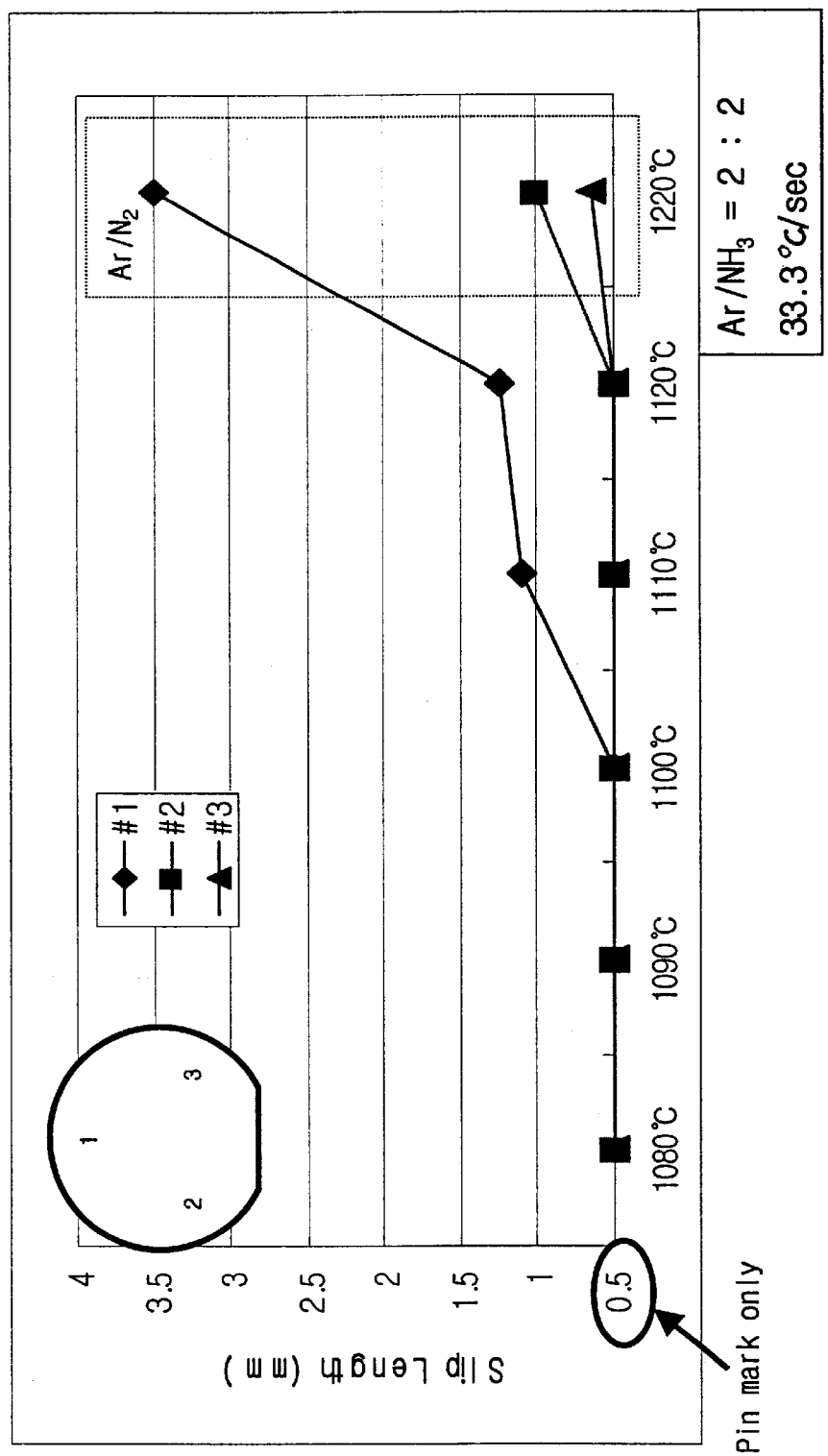
FIG. 43 graphically illustrates slip length at the bottom surface of a wafer versus temperature for rapid thermal annealing according to embodiments of the present invention.

FIG. 43 graphically illustrates slip length at the bottom surface of a wafer versus temperature for RTA embodiments of the present invention that use argon and ammonia atmospheres. In FIG. 43, slip length is measured at three positions in a wafer indicated in the upper left corner. These positions correspond to the positions of the wafer support pins in an RTA furnace. The first support pin 1 is adjacent the gas inlet of the RTA furnace, whereas the other positions 2 and 3 are remote from the gas inlet. Also shown at the right of FIG. 43 is the slip length measurement for an atmosphere of argon and nitrogen.

Referring to FIG. 43, at 1220° C. in an atmosphere of argon and nitrogen, a slip length of 3.5 mm may be produced at position 1 on the wafer, which may be unacceptable. In sharp contrast, at reduced temperatures of 1120° C., a slip length less than 1.5 mm may be produced using argon and ammonia atmospheres according to embodiments of the present invention. A slip length of less than 1.5 mm at the bottom of the wafer can produce a slip-free region at the top of the wafer, to a depth of 40 μm. Accordingly, a slip-free active region of a wafer may be produced.

Figure 44:
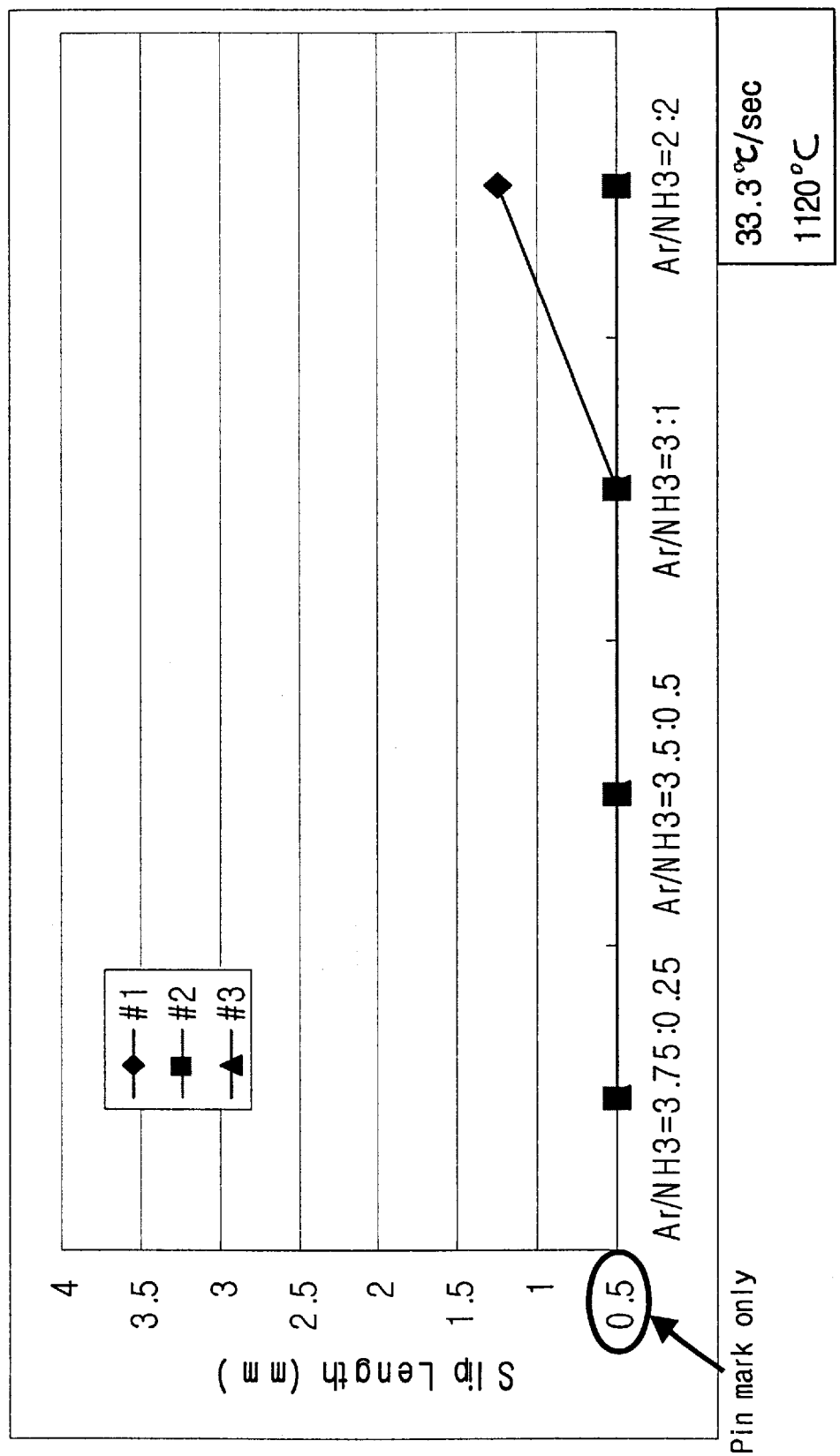
FIG. 44 graphically illustrates slip length versus argon-to-ammonia gas ratio according to embodiments of the present invention.

FIG. 44 graphically illustrates slip length versus argon-to-ammonia gas ratio, according to embodiments of the present invention. As shown, an acceptable slip of less than 1.5 mm may be produced over a wide range of gas ratios.

Figure 45:
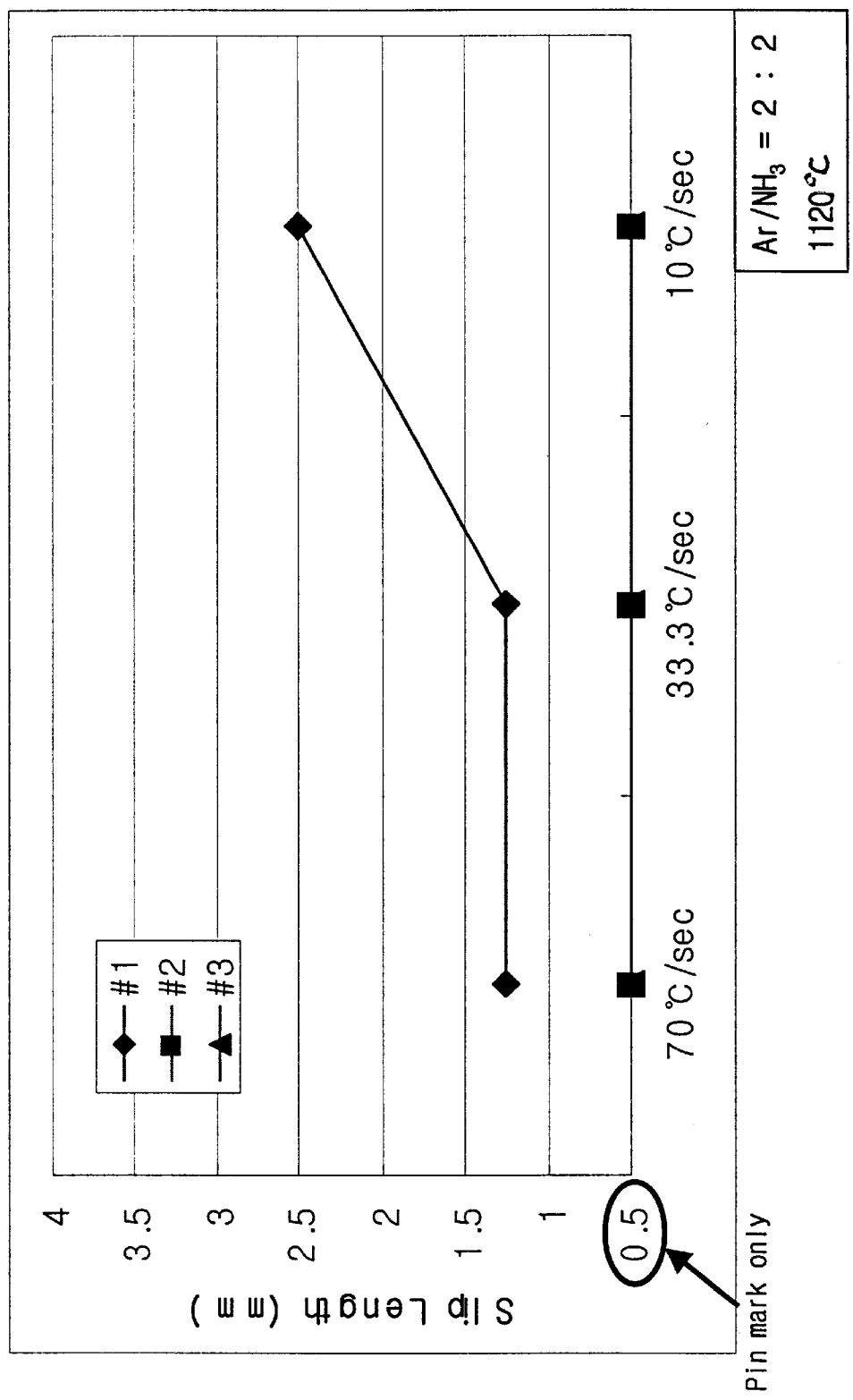
FIG. 45 graphically illustrates slip length as a function of ramp-down rate according to embodiments of the present invention.

FIG. 45 graphically illustrates slip length as a function of ramp-down rate, according to embodiments of the present invention. As can be seen, the ramp-down rate can impact slip length. In order to provide a slip length of less than about 1.5 mm, a ramp-down rate of at least about 30° C. per second should be maintained.

Figure 46A:
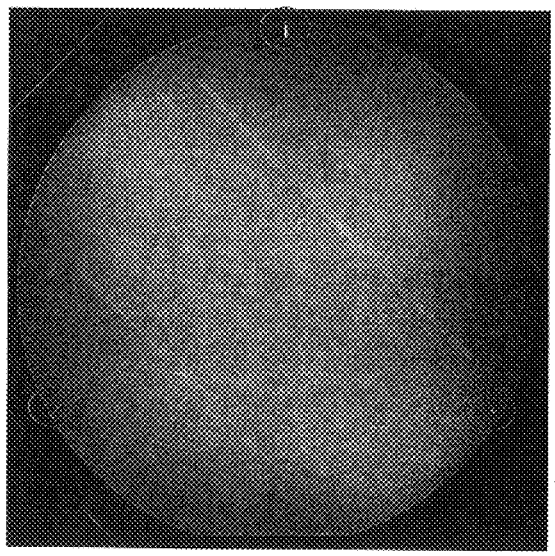
FIGS. 46A and 46B are X-ray topography photographs of wafer bottoms according to embodiments of the present invention.
Figure 46B:
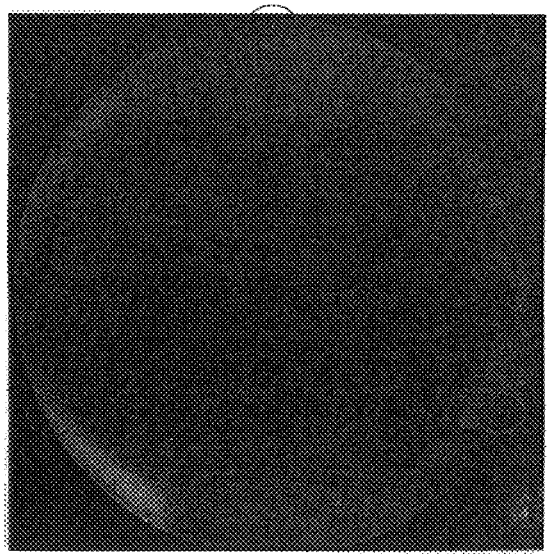

FIGS. 46A and 46B are X-ray topography (XRT) photographs of wafer bottoms which illustrate slip, and which correspond to RTA in an argon and nitrogen atmosphere at 1250° C. for ten seconds and RTA in an argon and ammonia gas atmosphere at 1120° C. for ten seconds, respectively. As shown in FIG. 46A, significant slip can be seen at the first position of the wafer, corresponding to position #1 of FIGS. 43–45 and shown at the top of FIG. 46A. In contrast, in FIG. 46B, the only defect is the pin mark itself at the three-pin positions on the wafer. Accordingly, wafers having slip-free active regions may be produced.

Another aspect of slip reduction according to embodiments of the present invention now will be described. In particular, by providing an M-shaped oxygen precipitate concentration profile with sufficiently high density of oxygen precipitates beneath the DZ, slip in Shallow Trench Isolation (STI) devices also may be reduced and preferably may be eliminated. As is well known to those having skill in the art, STI may be used to isolate devices, such as transistors, from one another in an active region of an integrated circuit substrate. As is well known to those having skill in the art, in STI, a trench is formed in the face of a semiconductor substrate and then is filled with an insulating material, such as undoped silicate glass (USG) and/or High Density Plasma (HDP). The trench also may be lined with a different insulator, such as silicon nitride. Due to thermal expansion differences between the silicon wafer and the insulating material(s) in the trench, compressive and/or tensile stress may be introduced at the interface between the trench and the substrate.

The amount of stress in the trench isolation region may be a function of the aspect ratio of the trench and/or other process conditions. For example, Table 6 illustrates stress distribution in a trench for three wafers D21, D19 and D17, where the aspect ratio increases from wafer D21 to wafer D19 to D17. As shown in Table 6, the stress is highest in wafer D21 and is lowest in wafer D17.

TABLE 6

| Item | | Device | | |
|---|---|---|---|---|
| | | D21 | D19 | D17 |
| Densification | Temp. (° C.) | 1150 | 1150 | 1000 |
| | Time (min) | 55 | 55 | 55 |
| Max Stress | $\sigma_{xx}$ | $-4.57 \times 10^9$ | $-6.5 \times 10^9$ | $-8.27 \times 10^9$ |
| | $\sigma_{xy}$ | $-2.96 \times 10^9$ | $-1.78 \times 10^9$ | $-4.22 \times 10^9$ |
| | $\sigma_{yy}$ | $-4.92 \times 10^9$ | $-7.17 \times 10^9$ | $-6.25 \times 10^9$ |
| | $\sigma_{total}$ | $7.34 \times 10^9$ | $9.84 \times 10^9$ | $1.12 \times 10^9$ |

Figure 47:
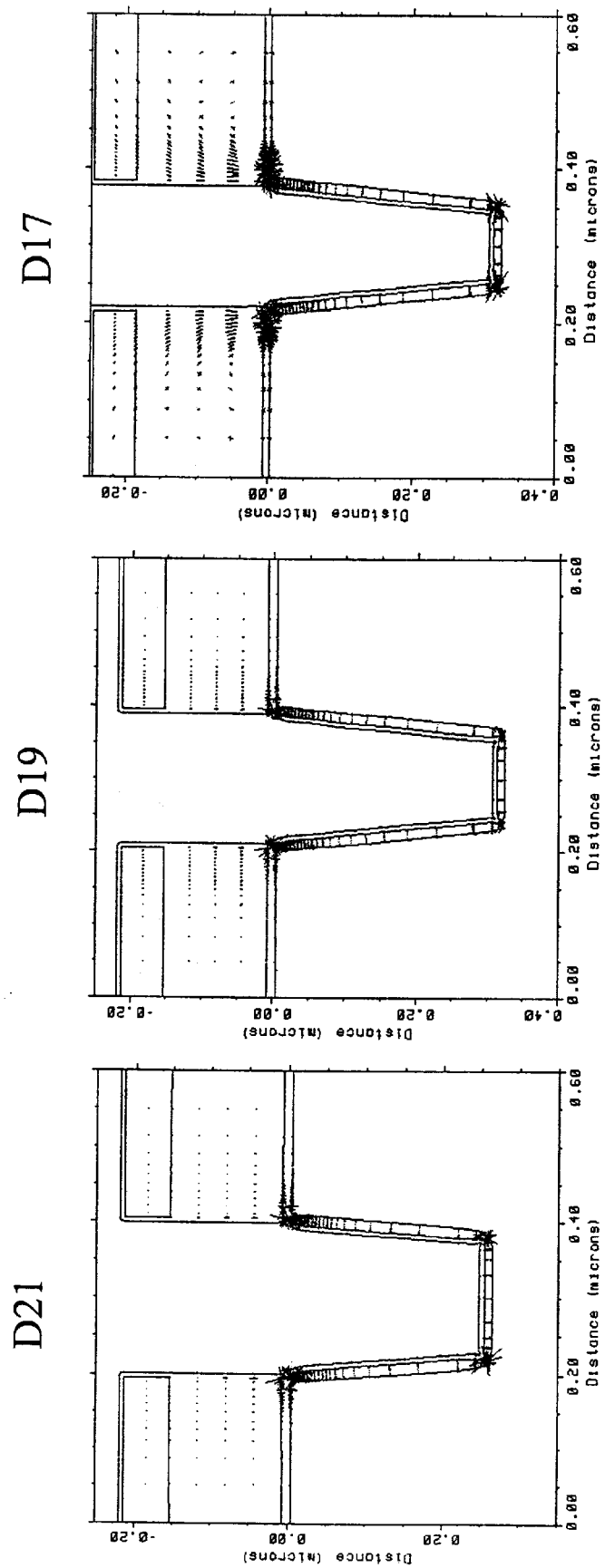
FIG. 47 graphically illustrates stress in a trench after gap-filling film densification.

FIG. 47 graphically illustrates stress in the trench after gap filling film densification, for the wafers of Table 6. In FIG. 47, the length of the line is proportional to the amount of stress.

Without wishing to be bound by any theory of operation, it is theorized that slip in the STI device can be reduced using an oxygen precipitate concentration profile according to embodiments of the invention, because an oxygen pinning phenomena may take place. In particular, an oxygen precipitate concentration profile according to embodiments of the present invention, can provide a device active region that is free of oxygen precipitates, but can provide a very high density of oxygen precipitates in the wafer bulk adjacent the active region. Moreover, the spacing between the oxygen precipitates can be very small. It is theorized that these characteristics can cause a high line tension in the bulk region, which in turn can cause movement of dislocations at the trench, so that the dislocations are moved away from the device active regions and are pinned on the oxygen precipitates.

Figure 48A:
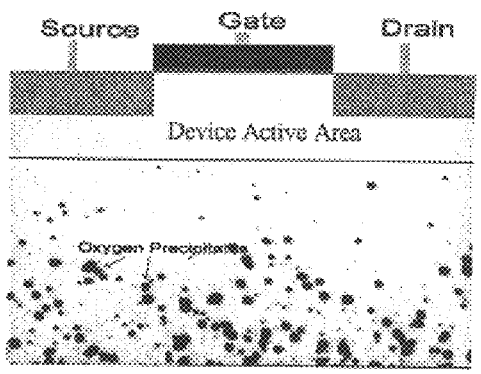
FIG. 48A is a cross-sectional view of field effect transistor devices that can be fabricated in silicon wafers according to embodiments of the invention.
Figure 48B:
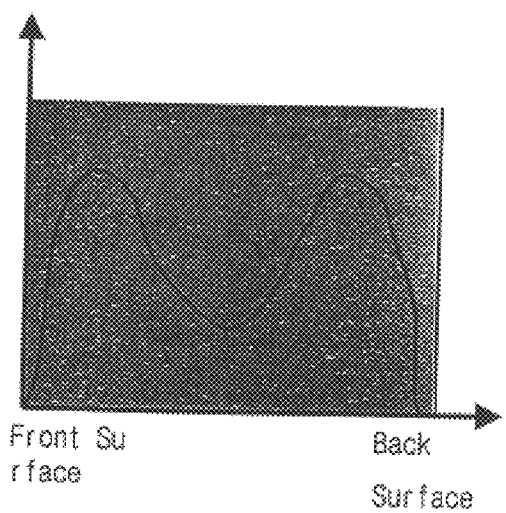
FIG. 48B graphically illustrates a profile of oxygen precipitates in a wafer of FIG. 48A according to embodiments of the present invention.

FIG. 48A is a cross-sectional view of field effect transistor devices that can be fabricated in silicon wafers according to embodiments of the invention, and which have been annealed at 800° C. for four hours, and a 1000° C. at 16 hours, to cause oxygen precipitates to form. As shown, the device active area, corresponding to the top DZ, generally is free of oxygen precipitates, but a high density of oxygen precipitates is found in the bulk region adjacent the device, corresponding to the first peak in the M-shaped profile. FIG. 48B graphically illustrates an M-shaped profile of oxygen precipitates in a wafer of FIG. 48A, according to embodiments of the present invention.

Figure 49:
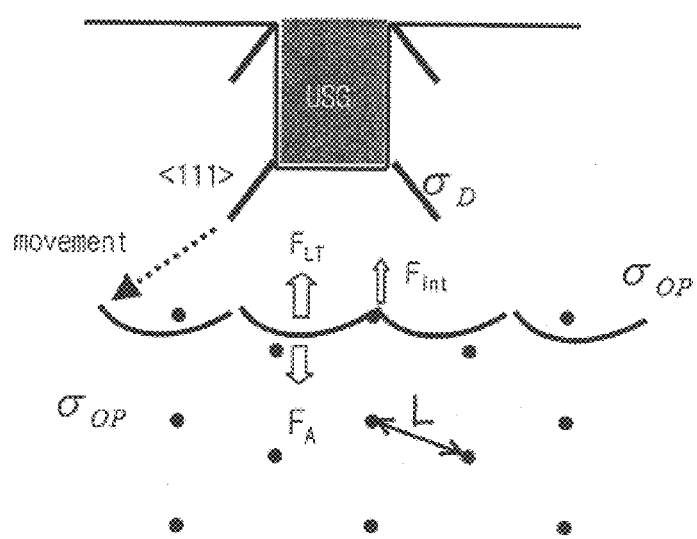
FIG. 49 conceptually illustrates movement of slip in shallow trench isolation devices as a result of trench dislocation pinning according to embodiments of the present invention.

FIG. 49 conceptually illustrates potential movement of slip in STI devices as a result of trench dislocation pinning, according to embodiments of the present invention. Without wishing to be bound by any theory of operation, in FIG. 49, $F_A$ is a process-induced stress that may produced, for example, after the densification of the gap filling material in the trench. $F_A$ may be a maximum at the corner of the trench, as was shown by the simulation results of FIGS. 47A–47C. Also, in FIG. 49, $F_{int}$ is the interaction force between the trench dislocation and oxygen precipitates, and may be given by:

$$E_{int} = \frac{1}{2}\int \sigma_D \cdot \varepsilon_{O/P} dv + \frac{1}{2}\int \sigma_{O/P} \cdot \varepsilon_D dv, \quad \frac{\partial E_{int}}{\partial x} = F_{int},$$

where the quantities are indicated in FIG. 49, where $\varepsilon_O$ and $\varepsilon_D$ indicate strains, and where v indicates volume. Disloca tion movement, as illustrated in FIG. 49, may be produced as shown by:

$$F_{LT} = \frac{Gb^2}{2R}, F_{LT\max} = \frac{Gb}{L},$$

where $F_{LT}$ is the line tension vector, and is a function of a material constant G, the Burgess vector b and the length L between dislocation centers. Thus, when the distance between oxygen precipitates decreases, the magnitude of the line tension $F_{LT}$ increases. This can cause dislocation movement in the dislocation pinning condition where $F_A \leq F_{LT} + F_{int}$, so that at an equilibrium condition, $$F_{LT\max} = \frac{Gb}{L}.$$

Thus, when L decreases, $F_{LT_{max}}$, increases. In conclusion, without wishing to be bound by any theory of operation, it appears that a high density of small oxygen precipitates causes L to decrease and $F_{LT}$ to increase, so that $F_A \leq F_{LT} + F_{int}$, to thereby cause dislocation pinning.

Figure 50:
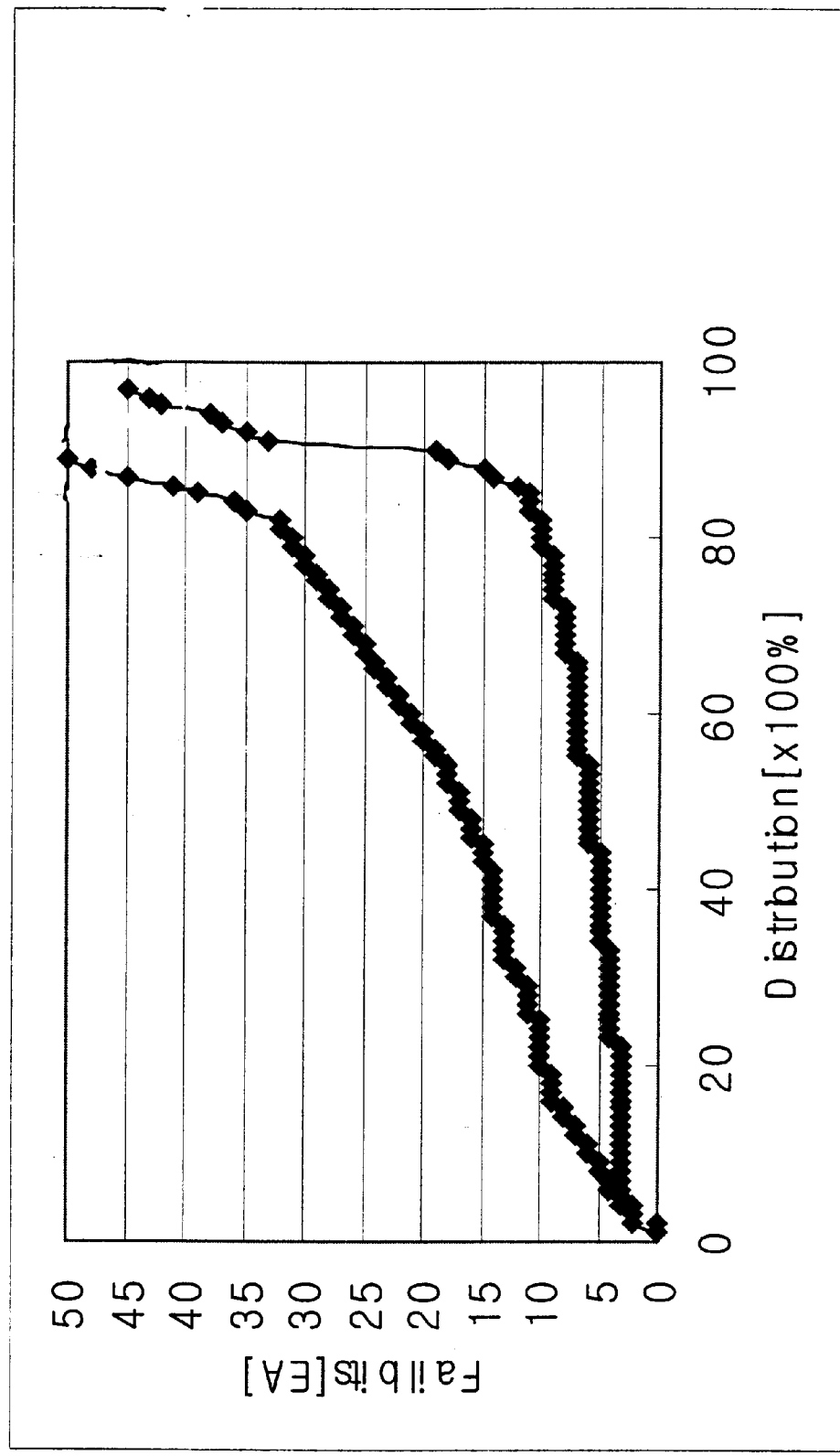
FIG. 50 graphically illustrates a cumulative failure rate versus refresh time for a wafer which does not have an M-shaped oxygen precipitate concentration profile and for wafers which have an M-shaped oxygen precipitate concentration profile according to embodiments of the present invention.

It may be difficult to observe dislocation pinning directly. However, dislocation pinning may be identified by comparing devices, such as 128 MB Dynamic Random Access Memory (DRAM) devices having an STI structure, that are fabricated to include the profile of FIG. 4. FIG. 50 graphically illustrates a number of failed bits versus refresh time for wafers which have an M-shaped oxygen precipitate concentration profile according to embodiments of the invention (lower curve of FIG. 50), and wafers that have a constant oxygen precipitate concentration profile (upper curve of FIG. 50). As shown in FIG. 50, for a given refresh time, the number of failed bits is lower using wafers which have an M-shaped oxygen precipitation profile according to embodiments of the invention (lower curve of FIG. 50) compared to wafers which have a constant oxygen precipitate concentration profile (upper curve of FIG. 50). Without wishing to be bound by any theory of operation, it is theorized that the M-shaped profile according to embodiments of the invention provides dislocation pinning in the active device area. As is well known to those having skill in the art, dislocations in the active device area can trap electrons therein, which can reduce the refresh time of the device and/or create a greater number of bit failures at a given refresh time. Thus, FIG. 50 appears to provide evidence that dislocation pinning is produced using M-shaped profiles of oxygen precipitation concentration according to embodiments of the invention.

Figure 51:
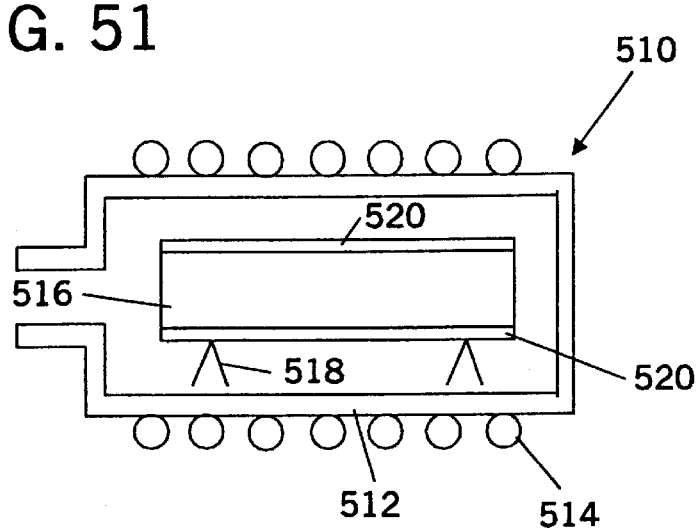
FIG. 51 is a cross-sectional view of a conventional rapid thermal annealing system.

As was also described above, silicon wafers that are fabricated according to embodiments of the invention can reduce and preferably eliminate $SiO_2$ sublimation on the RTA chamber. FIG. 51 is a cross-sectional view of a conventional RTA system 510 including a quartz chamber 512 and an array of RTA heat sources 514. A wafer 516 is shown in the chamber 512, and is supported by supporting feet 518. The wafer generally includes thereon a native oxide layer 520.

It has been found that, when performing RTA at temperatures above about 1200° C., the native oxide and/or other silicon dioxide that is present may evaporate from the wafer and deposit on the quartz chamber 512. This phenomena is referred to as "$SiO_2$ sublimation". When the $SiO_2$ is deposited on the chamber walls, it may decrease the efficiency of the chamber and/or the reliability of the process, which can decrease the yields and/or performance of the wafers.

In sharp contrast, according to embodiments of the invention, when RTA annealing is performed at less than about 1200° C., at less than about 1150° C., at between about 1100° C. and about 1120° C. or at about 1120° C., little or no $SiO_2$ sublimation may take place. In fact, it has been found that wafers may be processed for up to six months or more in an RTA system 512 without the need to clean or replace the chamber 512.

Figure 52:
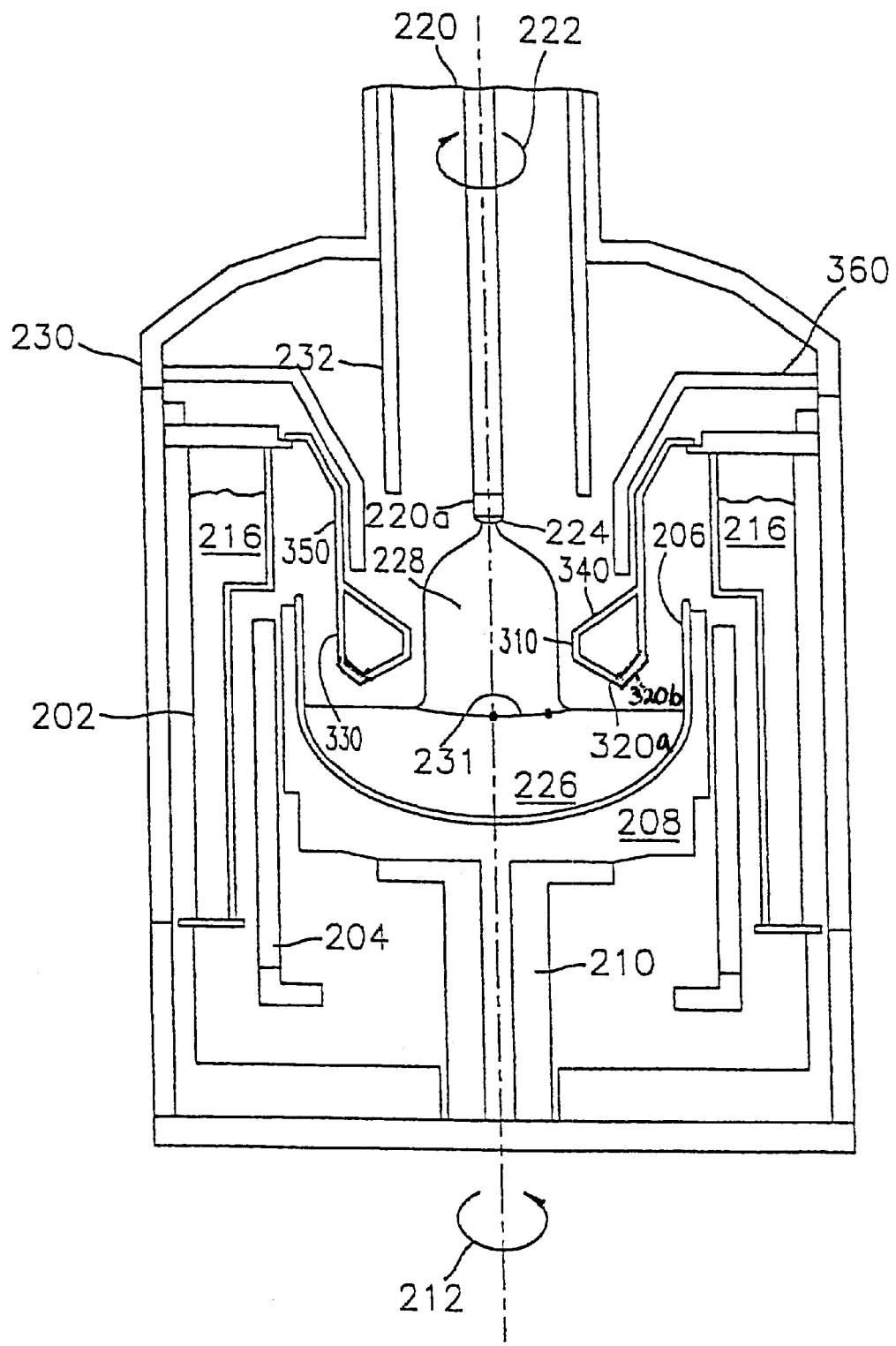
FIG. 52 is a schematic view of a modified CZ puller according to embodiments of the present invention.
Figure 53:
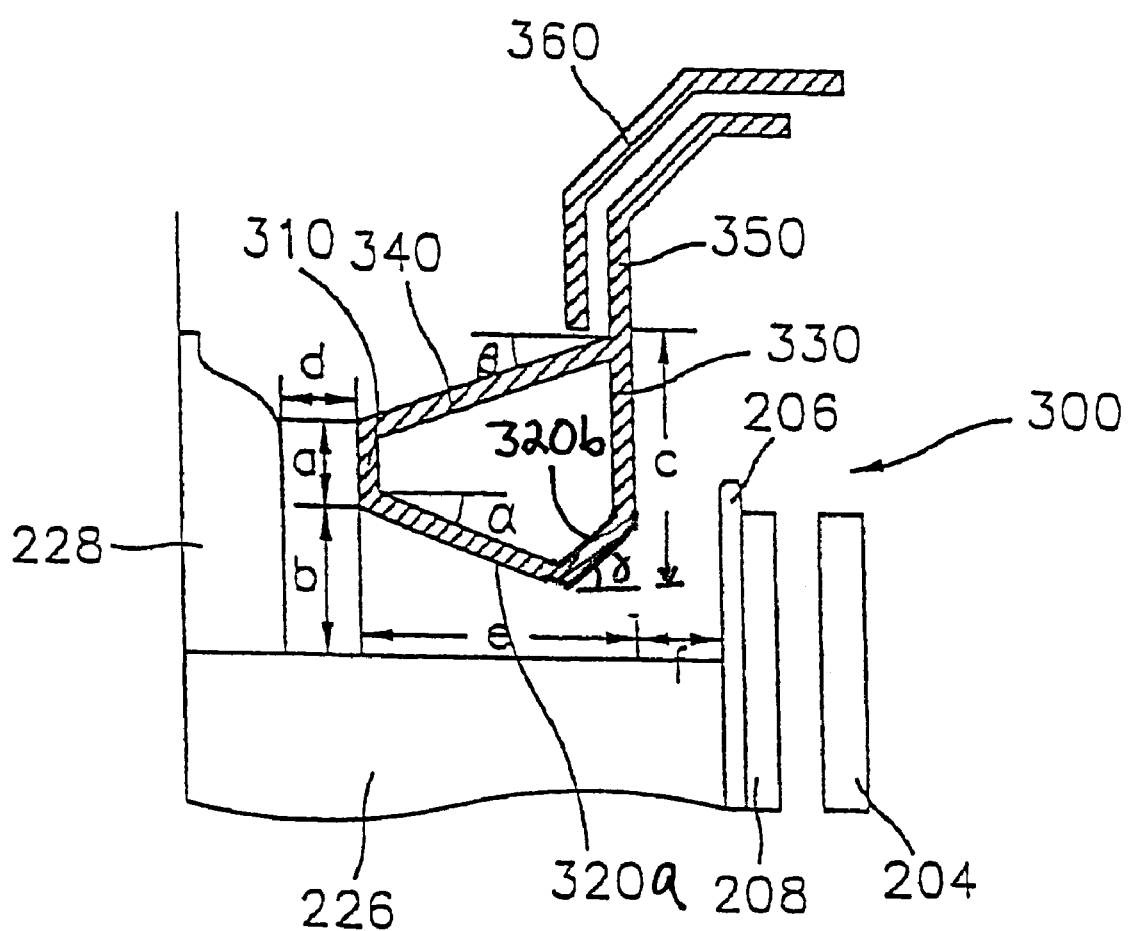
FIG. 53 illustrates details of modified parts of the CZ puller of FIG. 52.

FIG. 52 is a schematic view of a modified CZ puller according to embodiments of the present invention, and FIG. 53 illustrates details of modified parts of the CZ puller of FIG. 52. In FIGS. 52 and 53, like reference numerals used in FIGS. 28–30 refer to like elements, and only the differences from the CZ puller of FIGS. 28–30 will be described below.

As shown in FIGS. 52 and 53, the heat shield housing bottom includes a first portion 320a adjacent the inner heat shield housing wall 310 that slopes downward from the inner heat shield housing wall 310 towards the outer heat shield housing wall 330. A second portion 320b also is included adjacent the outer heat shield housing wall 330 that slopes downward from the outer heat shield housing wall 330 towards the inner heat shield housing wall 320, for example at an angle γ that is illustrated in FIG. 53. Viewed differently, the second portion 320b of the heat shield housing bottom may be considered a notch in the heat shield housing at an intersection of the outer heat shield housing wall 330 and the heat shield housing bottom 320.

CZ pullers of FIGS. 52 and 53 may provide one or more of the following benefits, according to embodiments of the invention. First, the distance d between the ingot surface 228 and the inner heat shield housing wall 310 can be reduced to allow more uniform heat distribution in the ingot. Moreover, the velocity of the argon gas at the area of the notch 320b can be reduced, which can increase temperature uniformity of the surface of the ingot 228. Finally, the notch can reduce turbulence in the argon gas. As a result of one or more of these and/or other factors, improved quality of silicon ingots may be provided.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A silicon wafer having a top surface, a bottom surface and an oxygen precipitate concentration profile therein between the top surface and the bottom surface, the oxygen precipitate concentration profile comprising:

first and second peaks at first and second predetermined depths from the top and bottom surfaces of the wafer, respectively;

a Denuded Zone (DZ) between the top surface of the wafer and the first peak and between the bottom surface of the wafer and the second peak;

a concave region between the first and second peaks;

the denuded zone between the bottom surface of the wafer and the second peak including therein at least one region of slip dislocation; and the denuded zone between the top surface of the wafer and the first peak being free of slip dislocation therein.

2. The silicon wafer of claim 1, wherein the oxygen precipitate concentration profile is symmetrical with respect to a central surface of the silicon wafer that is centrally located between the top and bottom surfaces.

3. The silicon wafer of claim 1, wherein the depth of the denuded zones is in the range of about 5 µm to about 40 µm from the top and bottom surfaces of the silicon wafer.

4. The silicon wafer of claim 3, wherein the depth of the denuded zones is about 30 µm from the top of both surfaces of the silicon wafer.

5. The silicon wafer of claim 1, wherein the oxygen precipitate concentrations at the first and second peaks are at least about $1 \times 10^9$ cm$^{-3}$.

6. The silicon wafer of claim 1, wherein the oxygen precipitate concentration in the concave region between the first and second peaks is at least about $1 \times 10^8$ cm$^{-3}$.

7. The silicon wafer of claim 1, wherein crystal originated precipitates (COPs) only are present in the wafer in the concave region between the first and second peaks.

8. The silicon wafer of claim 1 further comprising a plurality of shallow trench isolation (STI) regions in the denuded zone between the top surface of the wafer and the first peak and having STI slip that is reduced compared to same STI regions in a silicon wafer that does not include the oxygen precipitate concentration profile.

9. The silicon wafer of claim 1 further comprising a plurality of shallow trench isolation (STI) regions in the denuded zone between the top surface of the wafer and the first peak and that are free of STI slip.

10. The silicon wafer of claim 1 wherein a lowest oxygen precipitate concentration in the concave region is at least an order of magnitude lower than a highest oxygen precipitate concentration at the first and second peaks.

11. A silicon wafer having a top surface, a bottom surface and an oxygen precipitate concentration profile therein between the top surface and the bottom surface, the oxygen precipitate concentration profile comprising:
    first and second peaks at first and second predetermined depths from the top and bottom surfaces of the wafer, respectively;
    a Denuded Zone (DZ) between the top surface of the wafer and the first peak and between the bottom surface of the wafer and the second peak;
    a concave region between the first and second peaks; and
    a plurality of shallow trench isolation (STI) regions in the denuded zone between the top surface of the wafer and the first peak and having STI slip that is reduced compared to same STI regions in a silicon wafer that does not include the oxygen precipitate concentration profile.

12. The silicon wafer of claim 11, wherein the oxygen precipitate concentration profile is symmetrical with respect to a central surface of the silicon wafer that is centrally located between the top and bottom surfaces.

13. The silicon wafer of claim 11, wherein the depth of the denuded zones is in the range of about 5 µm to about 40 µm from the top and bottom surfaces of the silicon wafer.

14. The silicon wafer of claim 13, wherein the depth of the denuded zones is about 30 µm from the top of both surfaces of the silicon wafer.

15. The silicon wafer of claim 11, wherein the oxygen precipitate concentrations at the first and second peaks are at least about $1 \times 10^9$ cm$^{-3}$.

16. The silicon wafer of claim 11, wherein the oxygen precipitate concentration in the concave region between the first and second peaks is at least about $1 \times 10^8$ cm$^{-3}$.

17. The silicon wafer of claim 11, wherein crystal originated precipitates (COPs) only are present in the wafer in the concave region between the first and second peaks.

18. The silicon wafer of claim 11 wherein the denuded zone between the top surface of the wafer and the first peak is free of slip dislocation therein.

19. The silicon wafer of claim 11 wherein a lowest oxygen precipitate concentration in the concave region is at least an order of magnitude lower than a highest oxygen precipitate concentration at the first and second peaks.

20. A silicon wafer having a top surface, a bottom surface and an oxygen precipitate concentration profile therein between the top surface and the bottom surface, the oxygen precipitate concentration profile comprising:
    first and second peaks at first and second predetermined depths from the top and bottom surfaces of the wafer, respectively;
    a Denuded Zone (DZ) between the top surface of the wafer and the first peak and between the bottom surface of the wafer and the second peak;
    a concave region between the first and second peaks; and
    a plurality of shallow trench isolation (STI) regions in the denuded zone between the top surface of the wafer and the first peak and that are free of STI slip.

21. The silicon wafer of claim 20, wherein the oxygen precipitate concentration profile is symmetrical with respect to a central surface of the silicon wafer that is centrally located between the top and bottom surfaces.

22. The silicon wafer of claim 20, wherein the depth of the denuded zones is in the range of about 5 µm to about 40 µm from the top and bottom surfaces of the silicon wafer.

23. The silicon wafer of claim 22, wherein the depth of the denuded zones is about 30 µm from the top of both surfaces of the silicon wafer.

24. The silicon wafer of claim 20, wherein the oxygen precipitate concentrations at the first and second peaks are at least about $1 \times 10^9$ cm$^{-3}$.

25. The silicon wafer of claim 20, wherein the oxygen precipitate concentration in the concave region between the first and second peaks is at least about $1 \times 10^8$ cm$^{-3}$.

26. The silicon wafer of claim 20, wherein crystal originated precipitates (COPs) only are present in the wafer in the concave region between the first and second peaks.

27. The silicon wafer of claim 20 wherein the denuded zone between the top surface of the wafer and the first peak is free of slip dislocation therein.

28. The silicon wafer of claim 20 wherein a lowest oxygen precipitate concentration in the concave region is at least an order of magnitude lower than a highest oxygen precipitate concentration at the first and second peaks.

* * * * *